US012581930B2

(12) United States Patent　　(10) Patent No.: US 12,581,930 B2
Gu et al.　　(45) Date of Patent: Mar. 17, 2026

(54) SEMICONDUCTOR DEVICE INCLUDING ELECTRODES EACH HAVING A PAD PART AND ELECTRONIC SYSTEM INCLUDING THE SAME

(71) Applicant: Samsung Electronics Co., Ltd., Suwon-si (KR)

(72) Inventors: Jimo Gu, Seoul (KR); Jiyoung Kim, Hwaseong-si (KR); Woosung Yang, Hwaseong-si (KR); Sukkang Sung, Seongnam-si (KR); Chang-Sup Lee, Daejon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 663 days.

(21) Appl. No.: 17/934,743

(22) Filed: Sep. 23, 2022

(65) Prior Publication Data

US 2023/0170302 A1　　Jun. 1, 2023

(30) Foreign Application Priority Data

Nov. 29, 2021　(KR) ........................ 10-2021-0167278

(51) Int. Cl.
H01L 23/535 (2006.01)
H10B 41/27 (2023.01)
(Continued)

(52) U.S. Cl.
CPC .......... H01L 23/535 (2013.01); H10B 41/27 (2023.02); H10B 41/41 (2023.02); H10B 43/27 (2023.02); H10B 43/40 (2023.02)

(58) Field of Classification Search
CPC ....... H01L 23/535; H01L 24/08; H01L 25/18; H01L 25/0657; H01L 23/488;
(Continued)

(56) References Cited

U.S. PATENT DOCUMENTS 9,806,093 B2　10/2017　Toyama et al.
10,297,543 B2　5/2019　Park et al.
(Continued)

FOREIGN PATENT DOCUMENTS

CN　112420716 A　2/2021
KR　20180068587 A　6/2018
(Continued)

*Primary Examiner* — Duy T Nguyen
(74) *Attorney, Agent, or Firm* — Wolf, Greenfield & Sacks, P.C.

(57) ABSTRACT

Disclosed are semiconductor devices and electronic systems including the same. A semiconductor device includes a substrate including a cell array region and a connection region, an electrode structure including electrodes and dielectric layers that are stacked in alternating fashion, each of the plurality of electrodes including an electrode part on the cell array region and a pad part on the connection region, dummy vertical structures on the connection region and penetrating the pad parts of each of the electrodes, and a cell contact plug on the connection region and coupled to the pad part of each of the electrodes. A thickness of the pad part is greater than that of the electrode part. The pad part has a lower portion connected to the electrode part and an upper portion on the lower portion. Between adjacent ones of the dummy vertical structures, a width of the upper portion is not less than that of the lower portion.

19 Claims, 39 Drawing Sheets

(51) Int. Cl.
  H10B 41/41          (2023.01)
  H10B 43/27          (2023.01)
  H10B 43/40          (2023.01)
(58) Field of Classification Search
  CPC ........ H10B 41/27; H10B 41/41; H10B 43/27;
                H10B 43/40; H10B 43/50; H10B 43/30;
                                                  H10D 88/00
  USPC ........................................................ 257/314
  See application file for complete search history.

(56)                  References Cited

U.S. PATENT DOCUMENTS

| | | | |
|---|---|---|---|
| 10,381,364 | B2 | 8/2019 | Zhou et al. |
| 10,804,289 | B2 | 10/2020 | Yang et al. |
| 10,818,687 | B2 | 10/2020 | Kim et al. |
| 10,964,714 | B2 | 3/2021 | Lim et al. |
| 11,410,708 | B2 | 8/2022 | Lee |
| 2015/0255385 | A1* | 9/2015 | Lee ........................ H10B 43/50 |
| | | | 257/775 |

| | | | | |
|---|---|---|---|---|
| 2017/0110402 | A1* | 4/2017 | Smith .................. H01L 23/5226 |
| 2017/0179152 | A1* | 6/2017 | Toyama ................ H01L 23/528 |
| 2018/0294225 | A1* | 10/2018 | Lee .......................... H10B 43/40 |
| 2018/0301460 | A1* | 10/2018 | Yoo ...................... H01L 21/0234 |
| 2018/0366482 | A1* | 12/2018 | Zhou ..................... H10B 41/20 |
| 2019/0157291 | A1* | 5/2019 | Kam ...................... G11C 16/08 |
| 2019/0363006 | A1* | 11/2019 | Min .................. H01L 21/31111 |
| 2020/0119047 | A1* | 4/2020 | Yoo ...................... H10D 64/033 |
| 2020/0350249 | A1 | 11/2020 | Kim et al. |
| 2021/0050372 | A1* | 2/2021 | Sharangpani ........ H10D 30/701 |
| 2021/0125928 | A1* | 4/2021 | Kim ...................... H01L 23/535 |
| 2021/0134830 | A1 | 5/2021 | Liu et al. |
| 2021/0202522 | A1 | 7/2021 | Baek |

FOREIGN PATENT DOCUMENTS

| | | |
|---|---|---|
| KR | 20190011632 A | 2/2019 |
| KR | 20190143691 A | 12/2019 |
| KR | 20200008828 A | 1/2020 |
| KR | 20210025031 A | 3/2021 |
| KR | 20210071544 A | 6/2021 |

* cited by examiner

SEMICONDUCTOR DEVICE INCLUDING ELECTRODES EACH HAVING A PAD PART AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2021-0167278 filed on Nov. 29, 2021 in the Korean Intellectual Property Office, the disclosure of which is hereby incorporated by reference in its entirety.

BACKGROUND

Embodiments of the present inventive concepts relate to a semiconductor device and an electronic system including the same.

A semiconductor device capable of storing a large amount of data may be useful in an electronic system, which requires data storage. Therefore, studies have been conducted to increase the data storage capacity of semiconductor devices. For example, as an approach to increase data storage capacity, a semiconductor device may include three-dimensionally arranged memory cells instead of two-dimensionally arranged memory cells.

SUMMARY

Some embodiments of the present inventive concepts may provide a semiconductor device with improved reliability and increased integration.

Some embodiments of the present inventive concepts may provide an electronic system including a semiconductor device.

According to some embodiments of the present inventive concepts, a semiconductor device may include a substrate including a cell array region and a connection region; an electrode structure including a plurality of electrodes and a plurality of dielectric layers that are vertically stacked on the substrate in alternating fashion, each of the plurality of electrodes including an electrode part on the cell array region and a pad part on the connection region; a plurality of dummy vertical structures on the connection region, the plurality of dummy vertical structures penetrating the pad parts of the plurality of electrodes, respectively; and a cell contact plug on the connection region and coupled to the pad part of each of the plurality of electrodes. A thickness of the pad part may be greater than a thickness of the electrode part. The pad part may have a lower portion connected to the electrode part and an upper portion on the lower portion. Between adjacent ones of the plurality of dummy vertical structures, a width of the upper portion may be not less than a width of the lower portion.

According to some embodiments of the present inventive concepts, a semiconductor device may include a peripheral circuit structure that includes a plurality of peripheral circuits integrated on a semiconductor substrate; a semiconductor layer on the peripheral circuit structure, the semiconductor layer including a cell array region and a connection region; an electrode structure including a plurality of electrodes that are vertically stacked on the semiconductor layer and a plurality of mold patterns on the connection region, the plurality of mold patterns and the plurality of electrodes being at a same level in a cross-sectional view of the semiconductor device, each of the plurality of electrodes including an electrode part on the cell array region and a pad part on the connection region; a source structure on the cell array region and between the semiconductor layer and the electrode structure; a plurality of vertical structures on the cell array region, the plurality of vertical structures penetrating the electrode structure and the source structure; a plurality of dummy vertical structures on the connection region, the plurality of dummy vertical structures penetrating the pad parts of the plurality of electrodes, respectively, each of the plurality of dummy vertical structures including a dummy contact plug and a dummy spacer that at least partially surrounds the dummy contact plug; a cell contact plug on the connection region and coupled to the pad part of each of the plurality of electrodes; a plurality of through contact plugs that penetrate the plurality of mold patterns of the electrode structure and are connected to the plurality of peripheral circuits, respectively; a plurality of first sidewall dielectric patterns between the plurality of dummy vertical structures and the plurality of electrodes, the first sidewall dielectric patterns at least partially surrounding the plurality of dummy vertical structures; and a plurality of second sidewall dielectric patterns between the plurality of through contact plugs and the plurality of mold patterns, the plurality of second sidewall dielectric patterns at least partially surrounding the plurality of through contact plugs. A thickness of the pad part may be greater than a thickness of the electrode part. The pad part may have a lower portion connected to the electrode part and an upper portion on the lower portion. Between adjacent ones of the plurality of dummy vertical structures, a width of the upper portion may be not less than a width of the lower portion.

According to some embodiments of the present inventive concepts, an electronic system may include a semiconductor device including a substrate having a cell array region and a connection region, an electrode structure including electrodes and dielectric layers that are vertically stacked on the substrate in alternating fashion, wherein each of the electrodes includes an electrode part on the cell array region and a pad part on the connection region, a plurality of dummy vertical structures on the connection region and penetrating the pad part of each of the electrodes, and a cell contact plug on the connection region and coupled to the pad part of each electrode; and a controller electrically connected through an input/output pad to the semiconductor device, the controller being configured to control the semiconductor device. A thickness of the pad part of each of the electrodes may be greater than a width of the electrode part of each of the electrodes. The pad part may have a lower portion connected to the electrode part and an upper portion on the lower portion. Between adjacent ones of the plurality of dummy vertical structures, a width of the upper portion may be not less than a width of the lower portion.

Details of other embodiments are included in the description and drawings.

BRIEF DESCRIPTION OF THE DRAWINGS

FIG. 2 illustrates a simplified perspective view showing an electronic system that includes a semiconductor device according to some embodiments of the present inventive concepts.

FIGS. 3 and 4 illustrate simplified cross-sectional views showing a semiconductor package according to some embodiments of the present inventive concepts.

FIG. 5A illustrates a plan view showing a semiconductor device according to some embodiments of the present inventive concepts.

FIG. 7B illustrates an enlarged view showing section P2 of FIG. 6B.

FIGS. 12A to 22A illustrate cross-sectional views taken along line A-A' of FIG. 5A, showing a method of fabricating a semiconductor device according to some embodiments of the present inventive concepts.

FIGS. 12B to 22B illustrate cross-sectional views taken along lines B-B' and C-C' of FIG. 5A, showing a method of fabricating a semiconductor device according to some embodiments of the present inventive concepts.

DETAILED DESCRIPTION OF EMBODIMENTS

Figure 1:
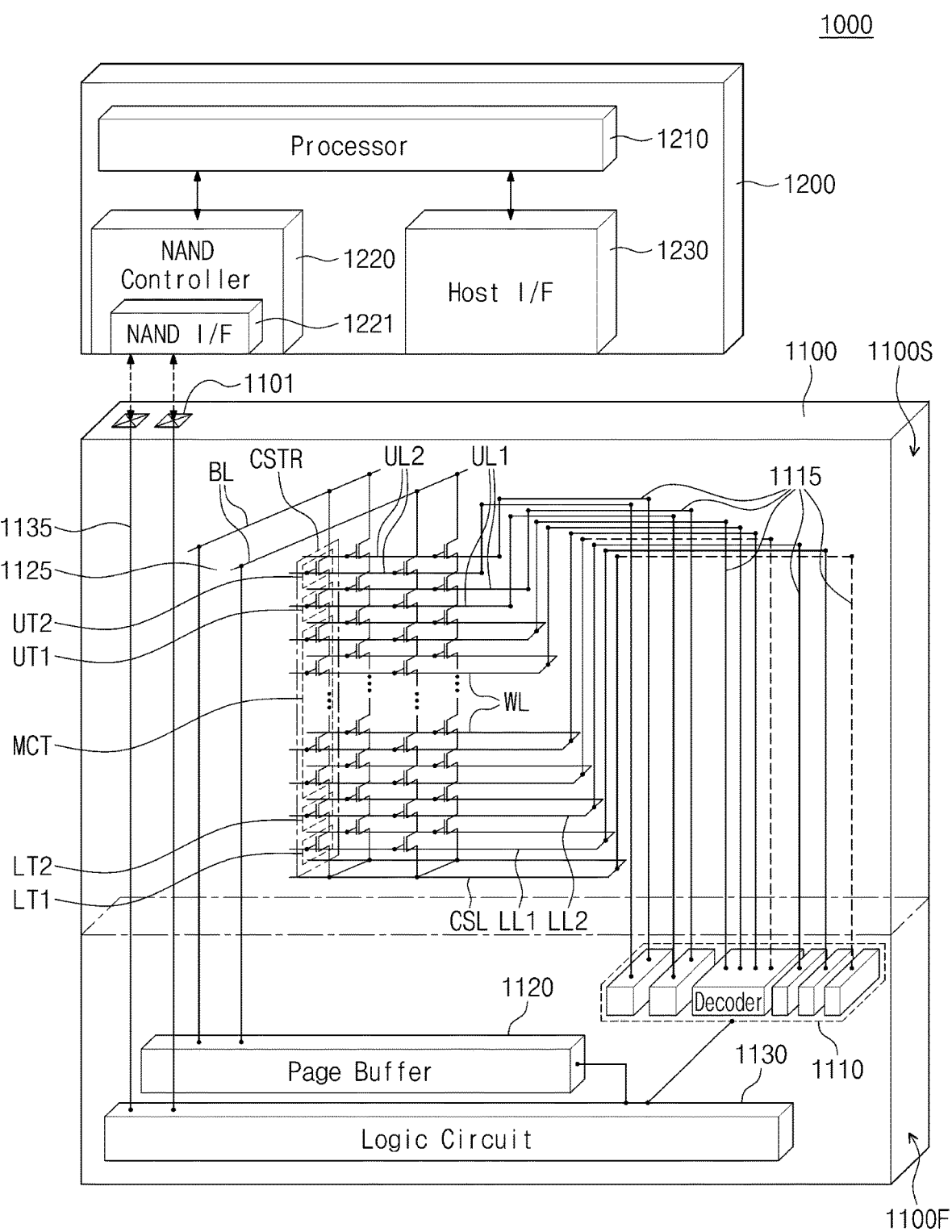
FIG. 1 illustrates a simplified schematic diagram showing an electronic system that includes a semiconductor device according to some embodiments of the present inventive concepts.

The following will now describe some embodiments of the present inventive concepts in conjunction with the accompanying drawings. The present disclosure may, however, be embodied in many different forms and should not be construed as limited to the embodiments set forth herein. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 illustrates a simplified schematic diagram showing an electronic system that includes a semiconductor device according to some embodiments of the present inventive concepts.

Referring to FIG. 1, an electronic system 1000 according to some embodiments of the present inventive concepts may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. In some embodiments, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with different embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be used to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

For the first structure 1100F, the decoder circuit 1110 and the page buffer 1120 may be configured to perform a control operation for at least one selection memory cell transistor among the plurality of memory cell transistors MCT. The logic circuit 1130 may be configured to control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may be configured to control the plurality of semiconductor devices 1100.

The processor 1210 may be configured to control an overall operation of the electronic system 1000 that includes the controller 1200. The processor 1210 may operate based on instructions included in firmware, and may be configured to control the NAND controller 1220 to access the semiconductor device 1100. The NAND controller 1220 may include a NAND interface 1221 that is configured to process communication with the semiconductor device 1100. The NAND interface 1221 may be used to transfer therethrough a control command to control the semiconductor device 1100, data, which is intended to be written on the memory cell transistors MCT of the semiconductor device 1100, and/or data, which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
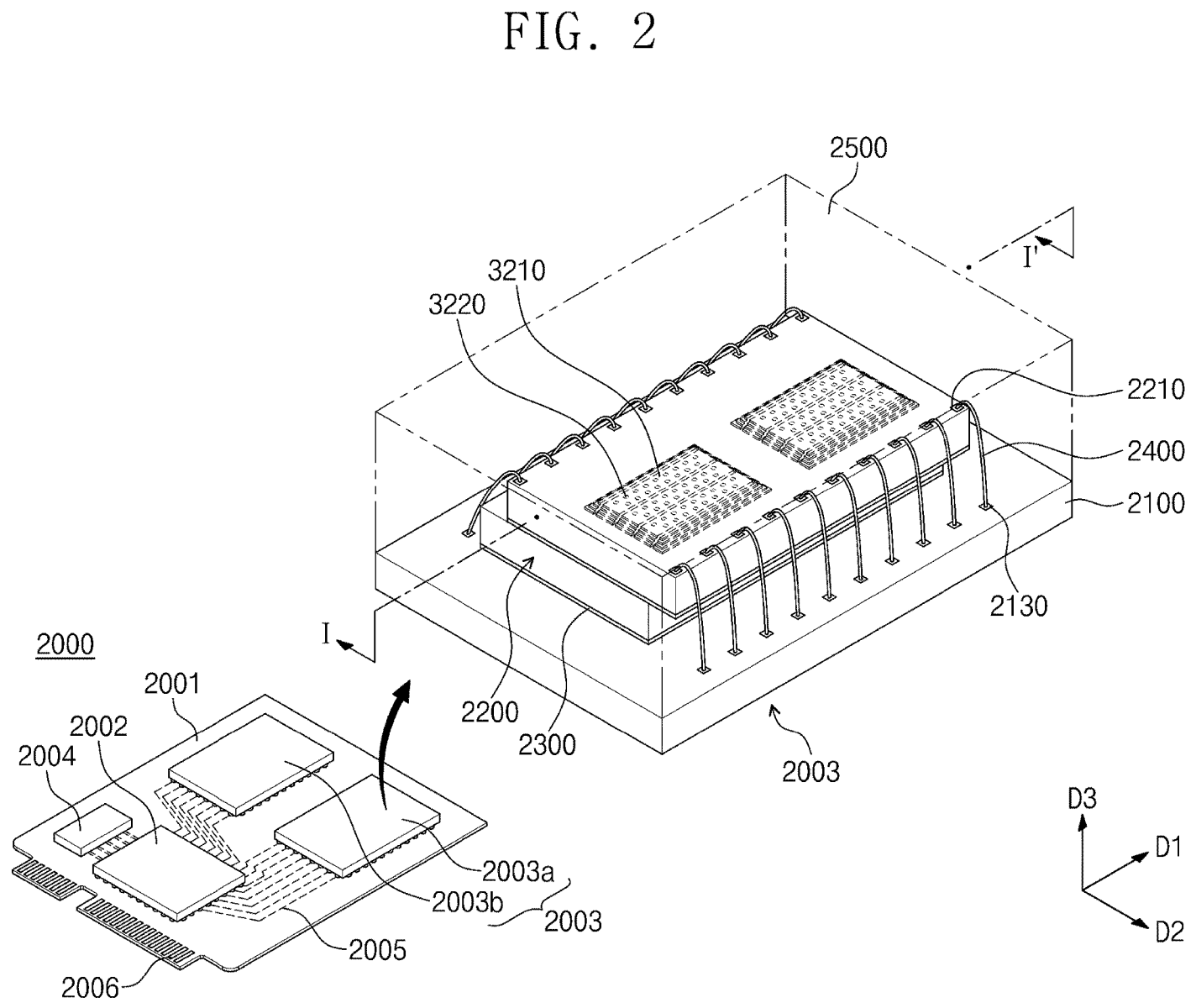

FIG. 2 illustrates a simplified perspective view showing an electronic system that includes a semiconductor device according to some embodiments of the present inventive concepts.

Referring to FIG. 2, an electronic system 2000 according to some embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may be configured to write data to the semiconductor package 2003, may be configured to read data from the semiconductor package 2003, and/or may be configured to increase an operating speed of the electronic system 2000.

The DRAM 2004 may be a buffer memory that is configured to reduce a difference in speed between the external host and the semiconductor package 2003 and that serves as a data storage space. The DRAM 2004 included in the electronic system 2000 may be configured to operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesion layers 2300 correspondingly disposed on bottom surfaces of the semiconductor chips 2200, connection structures 2400 that electrically connect the semiconductor chips 2200 to the package substrate 2100, and a molding layer 2500 on the package substrate 2100 and covering the semiconductor chips 2200 and the connection structures 2400.

The package substrate 2100 may be an integrated circuit board including package upper pads 2130. Each of the semiconductor chips 2200 may include one or more input/output pads 2210. Each of the input/output pads 2210 may correspond to the input/output pad 1101 of FIG. 1. Each of the semiconductor chips 2200 may include electrode structures 3210 and vertical structures 3220. Each of the semiconductor chips 2200 may include a semiconductor device according to some embodiments of the present inventive concepts, which will be discussed below.

In some embodiments, the connection structures 2400 may be bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other using through-silicon vias (TSVs) instead of the connection structures 2400 or the bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
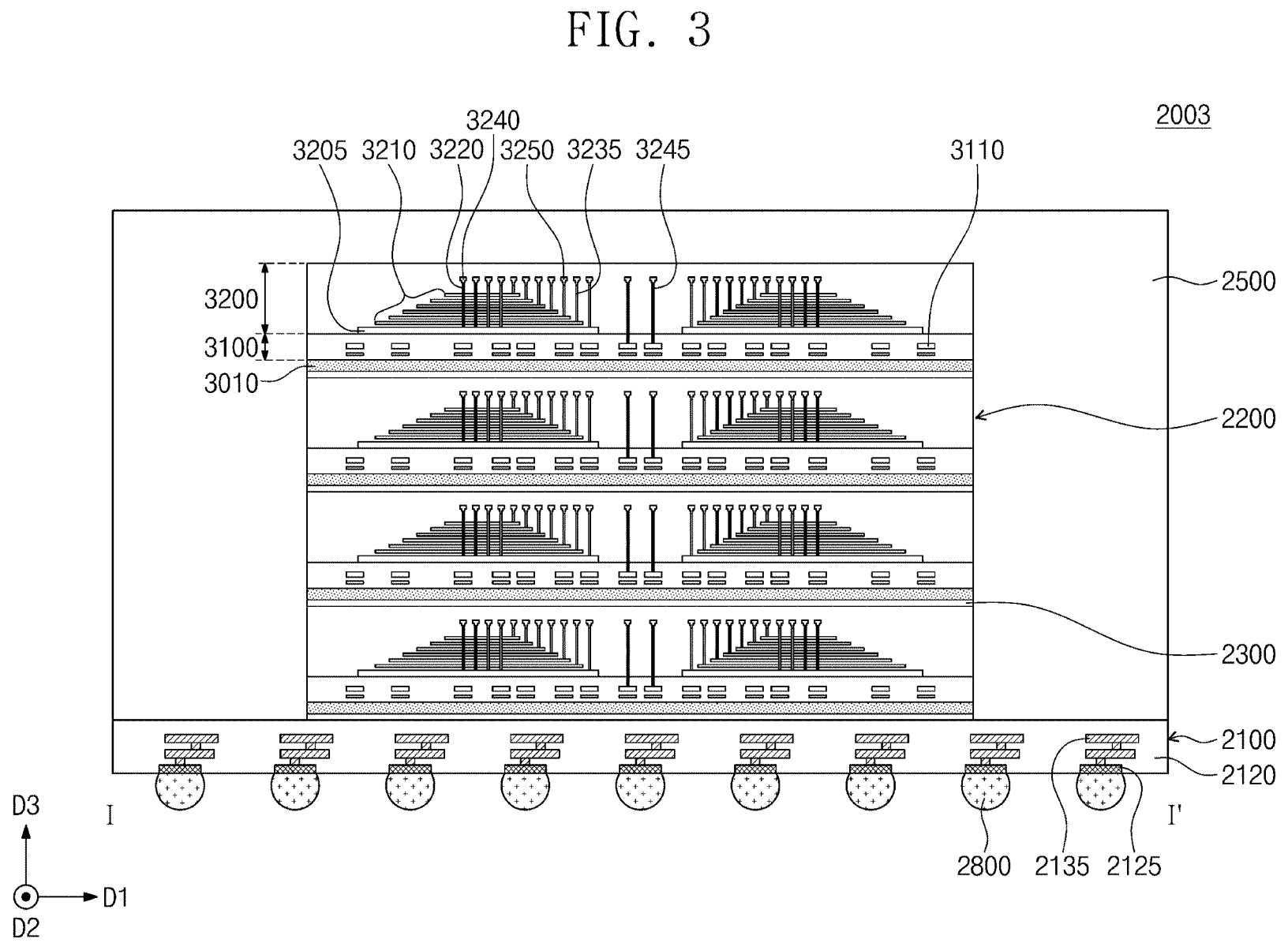
Figure 4:
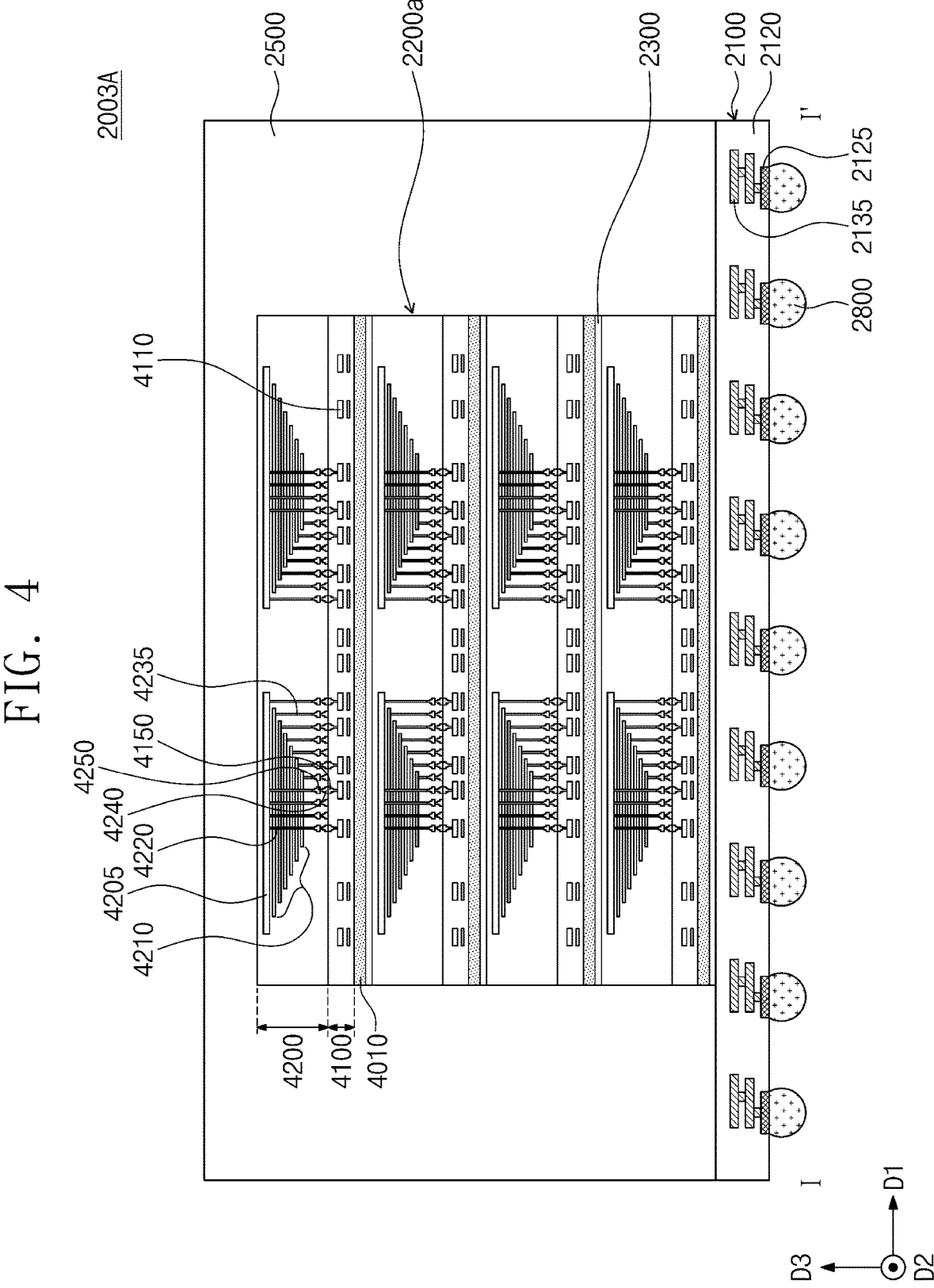

FIGS. 3 and 4 illustrate simplified cross-sectional views showing a semiconductor package according to some embodiments of the present inventive concepts. FIGS. 3 and 4 each depicts an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, package upper pads (see 2130 of FIG. 2) disposed on a top surface of the package substrate body 2120, package lower pads 2125 disposed or exposed on a bottom surface of the package substrate body 2120, and internal lines 2135 in the package substrate body 2120 and electrically connecting the package upper pads 2130 to the package lower pads 2125. The package upper pads 2130 may be electrically connected to the connection structures 2400. The package lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, an electrode structure 3210 on the source structure 3205, vertical structures 3220 and separation structures that penetrate the electrode structure 3210, bit lines 3240 electrically connected to the vertical structures 3220, and cell contact plugs 3235 electrically connected to the word lines (see WL of FIG. 1) of the electrode structure 3210. Each of the first structure 3100, the second structure 3200, and the semiconductor chips 2200 may further include a metal structure, which will be discussed below.

Each of the semiconductor chips 2200 may include one or more through lines 3245 that electrically connect with the peripheral wiring lines 3110 of the first structure 3100 and extend into the second structure 3200. The through line 3245 may be disposed outside the electrode structure 3210 and may further be disposed to penetrate the electrode structure 3210. Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured, such that each of semiconductor chips 2200a may include a semiconductor substrate 4010, a first structure 4100 on the semiconductor substrate 4010, and a second structure 4200 on the first structure 4100 and coupled to the first structure 4100 in a wafer bonding manner.

The first structure 4100 may include a peripheral circuit region including peripheral wiring lines 4110 and first bonding structures 4150. The second structure 4200 may include a source structure 4205, an electrode structure 4210 between the source structure 4205 and the first structure 4100, vertical structures 4220 and separation structures that penetrate the electrode structure 4210, and second bonding structures 4250 electrically connected to the vertical structures 4220 and the word lines (see WL of FIG. 1) of the electrode structure 4210. For example, the second bonding structures 4250 may be electrically connected to the vertical structures 4220 and the word lines (see WL of FIG. 1) through bit lines 4240 electrically connected to the vertical structures 4220 and through cell contact plugs 4235 electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, for example, copper (Cu).

Each of the first structure 4100, the second structure 4200, and the semiconductor chips 2200a may further include a metal structure, which will be described below. Each of the semiconductor chips 2200a may further include one or more input/output pads (see 2210 of FIG. 2) electrically connected to the peripheral wiring lines 4110 of the first structure 4100.

The semiconductor chips 2200 of FIG. 3 may be electrically connected to each other through the connection structures 2400 shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as TSV (through silicon via).

The first structure 3100 of FIG. 3 and the first structure 4100 of FIG. 4 may each correspond to a peripheral circuit structure in the following described embodiments, and the second structure 3200 of FIG. 3 and the second structure 4200 of FIG. 4 may each correspond to a cell array structure in the following described embodiments.

Figure 5A:
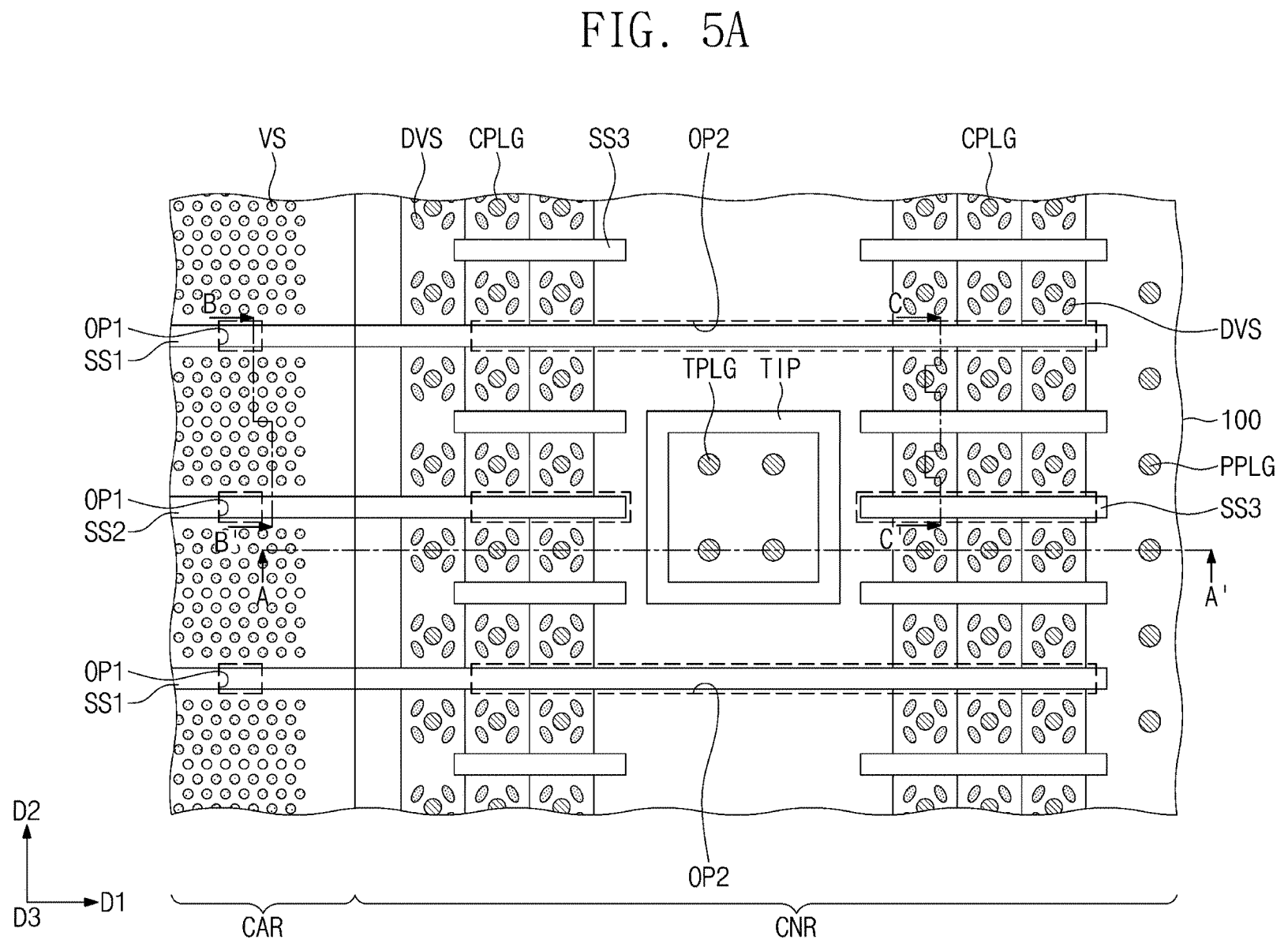
Figure 5B:
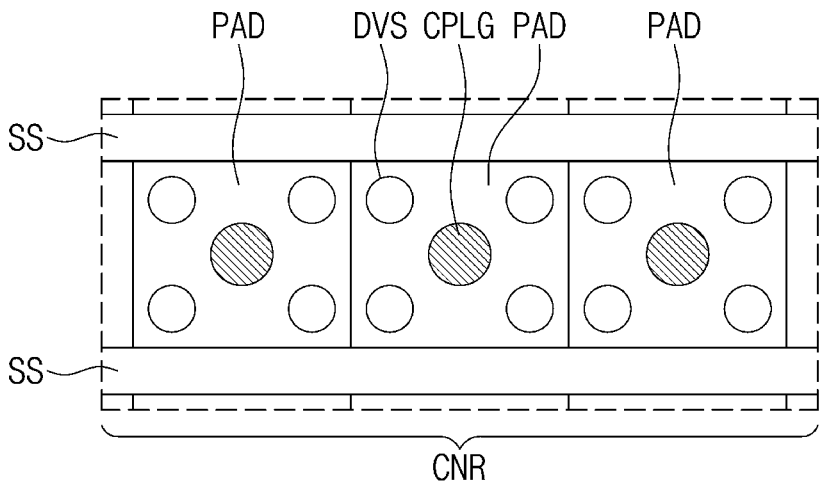
FIGS. 5B, 5C, and 5D illustrate partial plan views showing a semiconductor device according to some embodiments of the present inventive concepts.
Figure 5C:
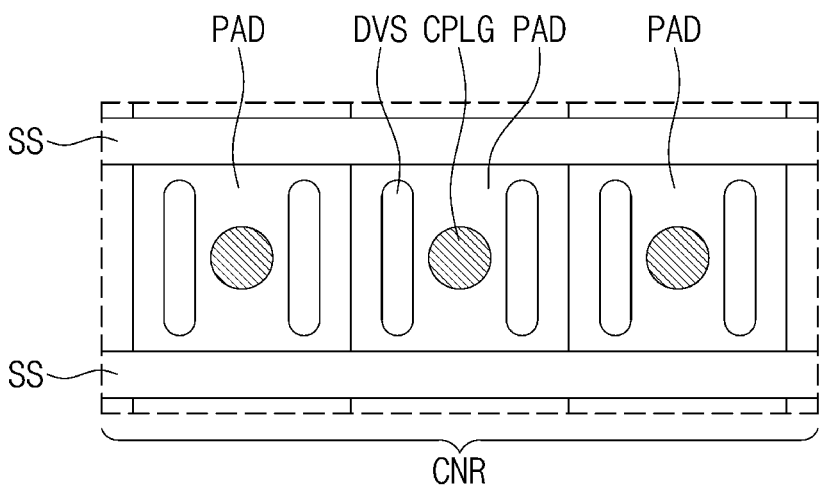
Figure 5D:
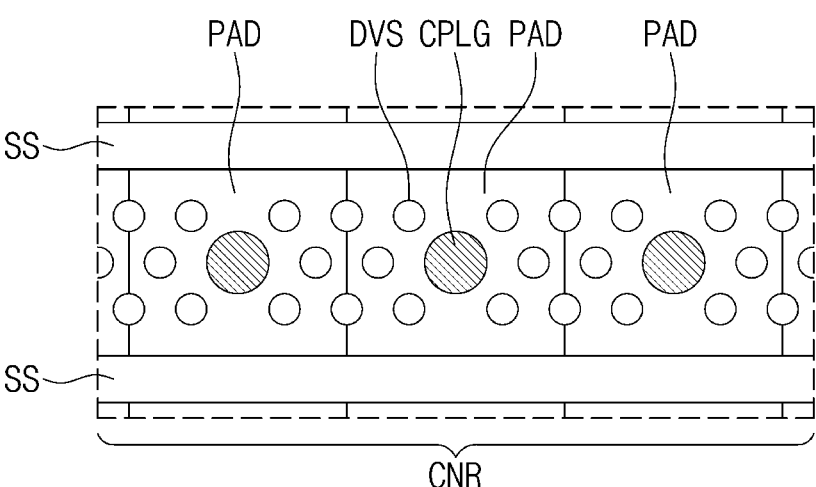

FIG. 5A illustrates a plan view showing a semiconductor device according to some embodiments of the present inventive concepts. FIGS. 5B, 5C, and 5D illustrate partial plan views showing a semiconductor device according to some embodiments of the present inventive concepts.

Figure 6A:
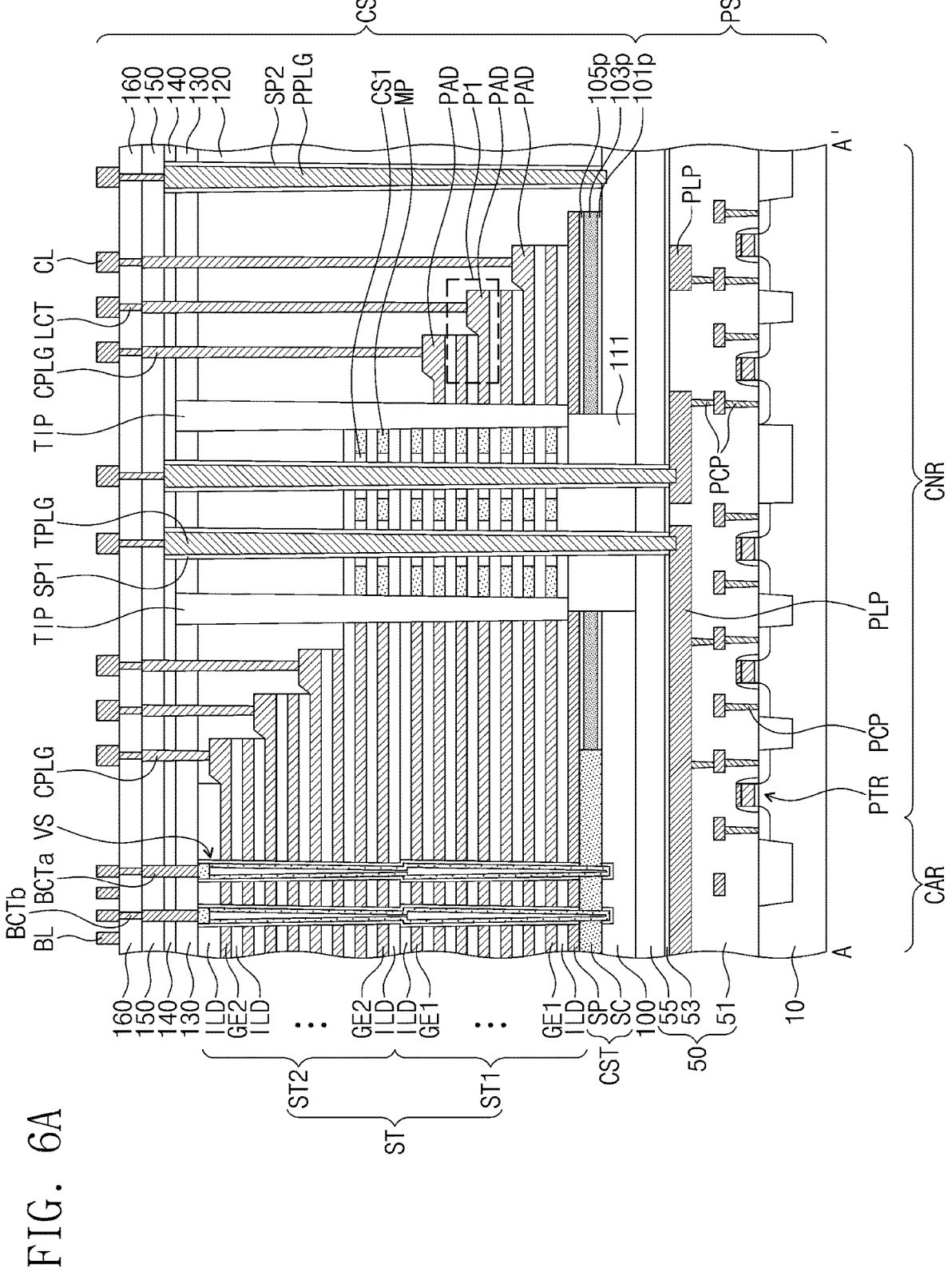
FIG. 6A illustrates a cross-sectional view taken along line A-A' of FIG. 5A, showing a semiconductor device according to some embodiments of the present inventive concepts.
Figure 6B:
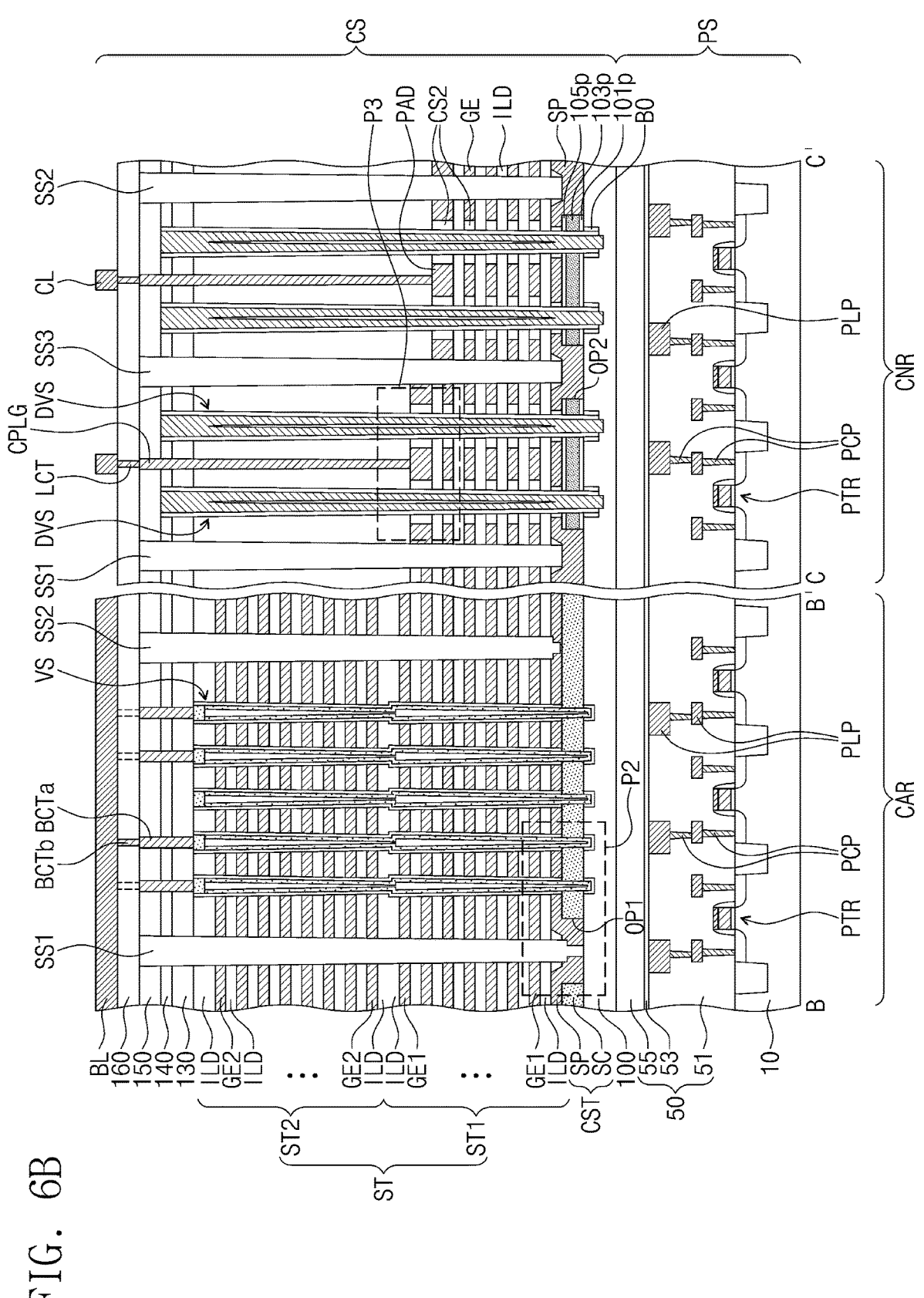
FIG. 6B illustrates a cross-sectional view taken along lines B-B' and C-C' of FIG. 5, showing a semiconductor device according to some embodiments of the present inventive concepts.
Figure 7A:
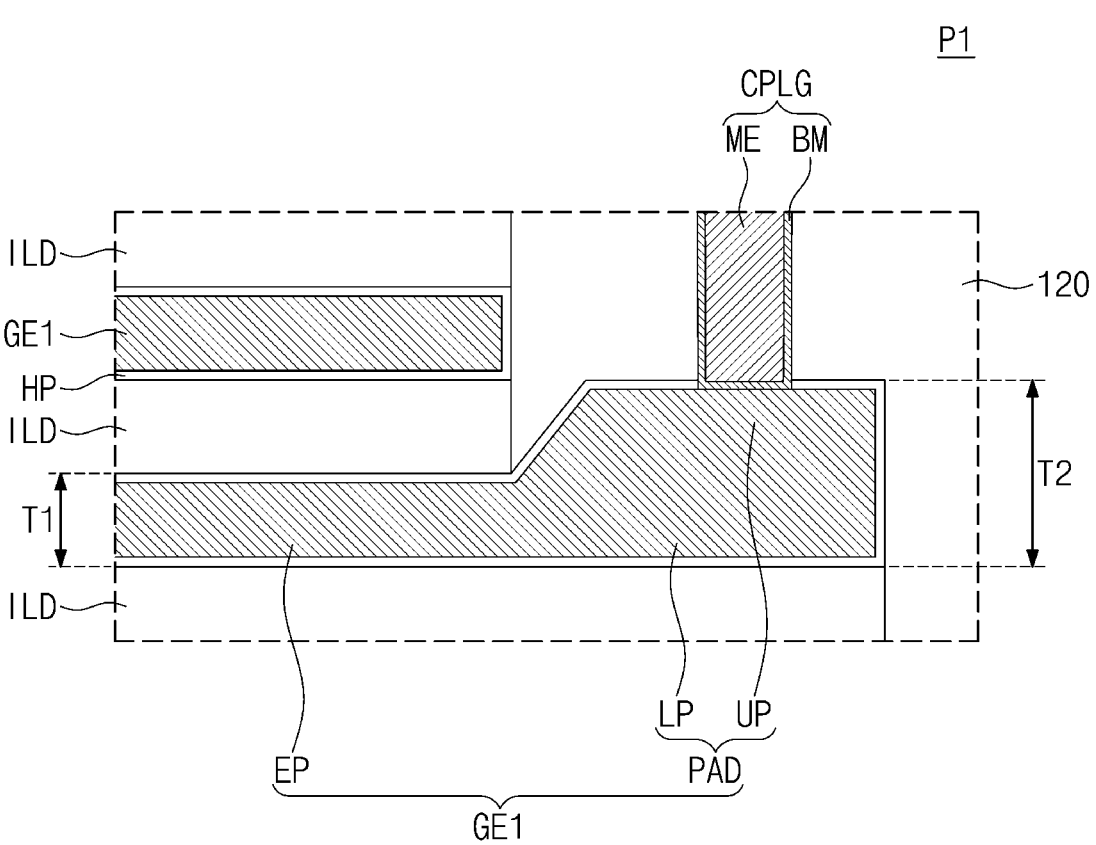
FIG. 7A illustrates an enlarged view showing section P1 of FIG. 6A.
Figure 7B:
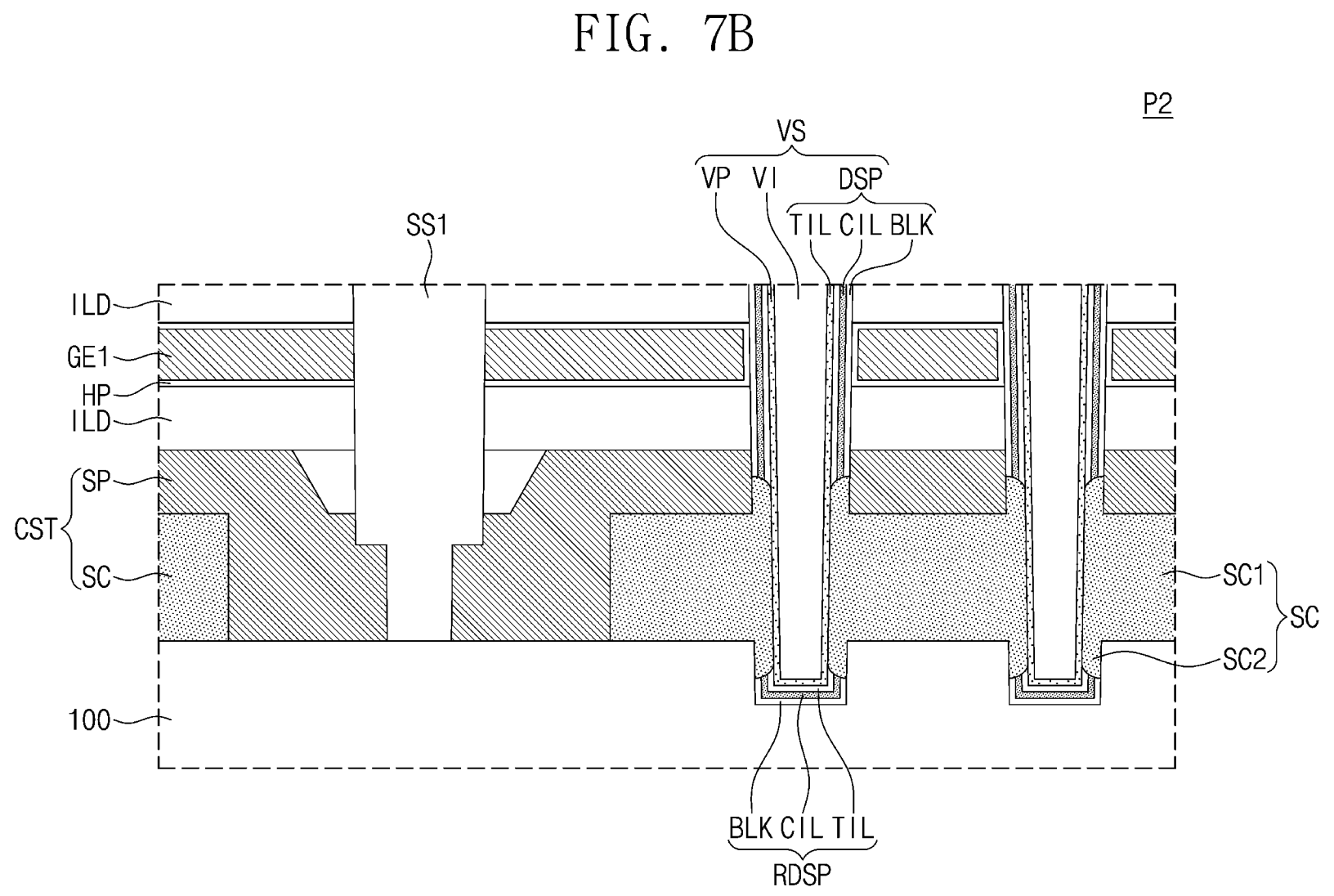
Figure 8A:
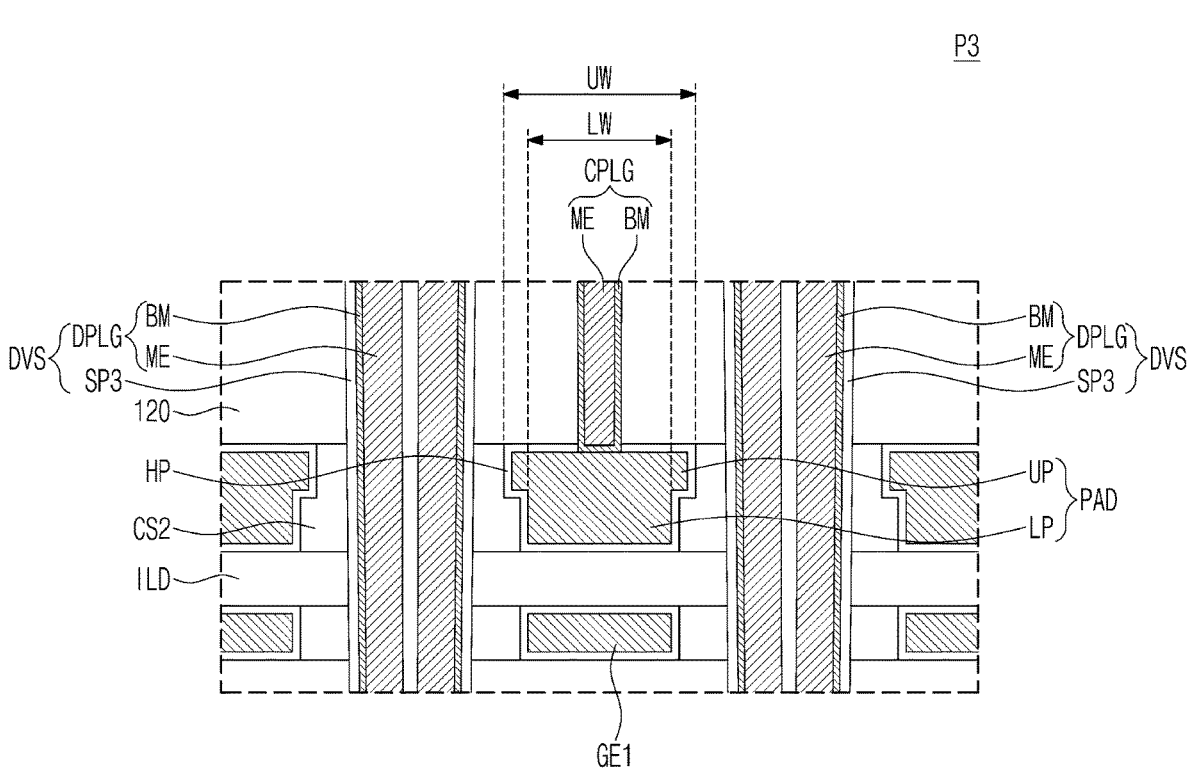
FIGS. 8A, 8B, and 8C illustrate enlarged views showing section P3 of FIG. 6B.
Figure 8B:
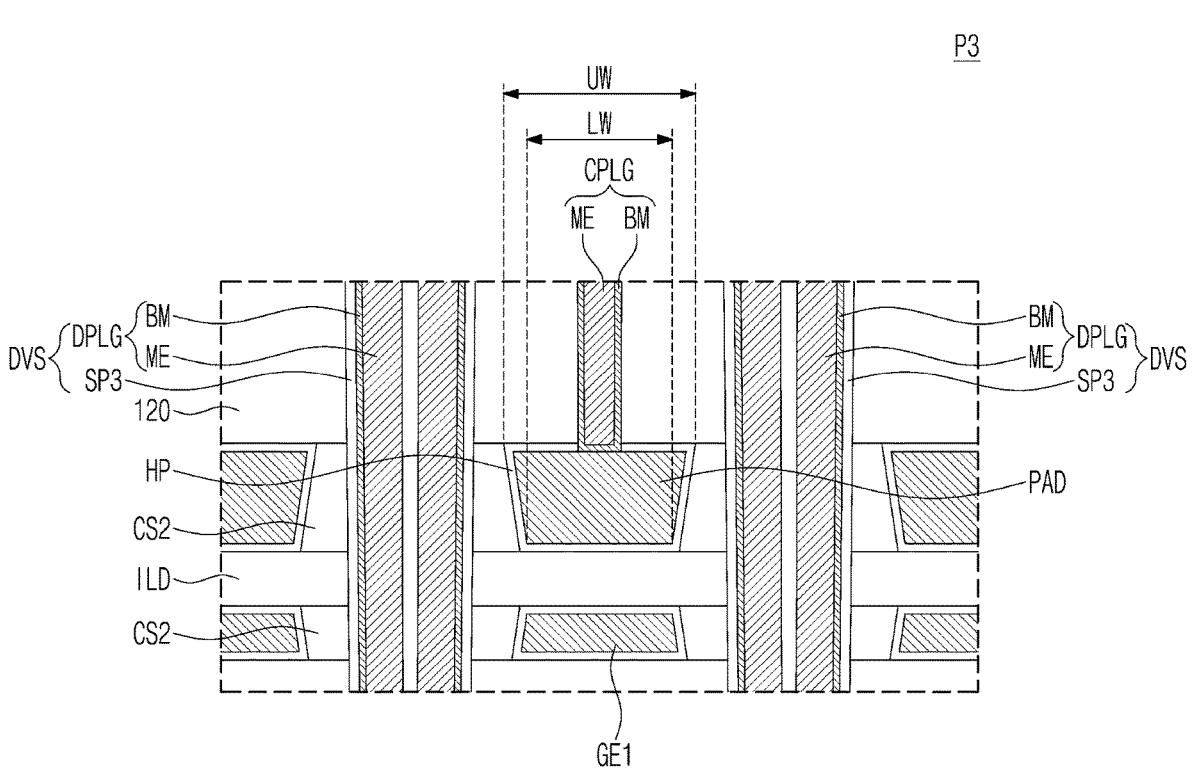
Figure 8C:
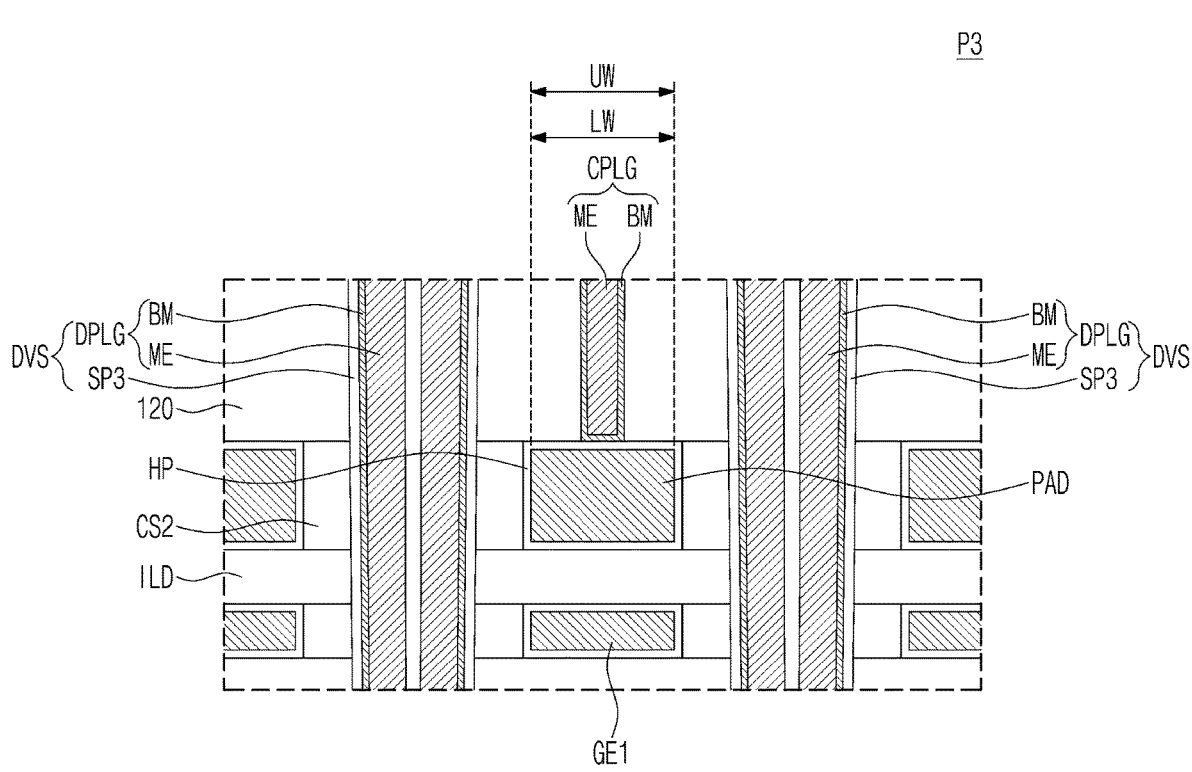

FIG. 6A illustrates a cross-sectional view taken along line A-A' of FIG. 5A, showing a semiconductor device according to some embodiments of the present inventive concepts. FIG. 6B illustrates a cross-sectional view taken along lines B-B' and C-C' of FIG. 5, showing a semiconductor device according to some embodiments of the present inventive concepts. FIG. 7A illustrates an enlarged view showing section P1 of FIG. 6A. FIG. 7B illustrates an enlarged view showing section P2 of FIG. 6B. FIGS. 8A, 8B, and 8C illustrate enlarged views showing section P3 of FIG. 6B.

Referring to FIGS. 5A, 6A, and 6B, a semiconductor device according to some embodiments of the present inventive concepts may include a peripheral circuit structure PS and a cell array structure CS on the peripheral circuit structure PS.

The peripheral circuit structure PS may include peripheral circuits PTR integrated on an entire surface of a semiconductor substrate 10 and a lower dielectric layer 50 that is on and at least partially covers the peripheral circuits PTR. The semiconductor substrate 10 may be a silicon substrate. The semiconductor substrate 10 may include a cell array region CAR and a connection region CNR.

The peripheral circuits PTR may be row and column decoders, a page buffer, and a control circuit. For example, the peripheral circuits PTR may include NMOS and PMOS transistors. Peripheral circuit lines PLP may be electrically connected to the peripheral circuits PTR through peripheral contact plugs PCP.

The lower dielectric layer 50 may be provided on up to the entire surface of the semiconductor substrate 10. On the semiconductor substrate 10, the lower dielectric layer 50 may be on and at least partially cover the peripheral circuits PTR, the peripheral contact plugs PCP, and the peripheral circuit lines PLP. The peripheral contact plugs PCP and the peripheral circuit lines PLP may be electrically connected to the peripheral circuits PTR.

The lower dielectric layer 50 may include a plurality of stacked dielectric layers. For example, the lower dielectric layer 50 may include one or more of a silicon oxide layer, a silicon nitride layer, a silicon oxynitride layer, and a low-k dielectric layer. The lower dielectric layer 50 may include a first lower dielectric layer 51, a second lower dielectric layer 55, and an etch stop layer 53 between the first and second lower dielectric layers 51 and 55. The etch stop layer 53 may include a dielectric material different from that of the first and second lower dielectric layers 51 and 55, and may be on and at least partially cover top surfaces of uppermost peripheral circuit lines PLP.

The cell array structure CS may be disposed on the lower dielectric layer 50. The cell array structure CS may include a semiconductor layer 100, a source structure CST, an electrode structure ST, vertical structures VS, dummy vertical structures DVS, cell contact plugs CPLG, through contact plugs TPLG, bit lines BL, and conductive lines CL.

According to some embodiments, the memory cell strings CSTR depicted in FIG. 1 may be integrated on or in the semiconductor layer 100. The electrode structure ST and the vertical structures VS may constitute the memory cell strings CSTR depicted in FIG. 1.

For example, the semiconductor layer 100 may be disposed on a top surface of the lower dielectric layer 50. The semiconductor layer 100 may be formed of a semiconductor material, a dielectric material, and/or a conductive material. The semiconductor layer 100 may include one or more of a semiconductor doped with impurities having a first conductivity type (e.g., n-type) and an intrinsic semiconductor doped with no impurities. The semiconductor layer 100 may have one or more structures including, but not limited to, a single-crystalline structure, an amorphous structure, and/or a polycrystalline structure.

The source structure CST may be disposed between the semiconductor layer 100 and the electrode structure ST. The source structure CST may be parallel to a top surface of the semiconductor layer 100, and on the cell array region CAR, may extend in a first direction D1 along the electrode structure ST.

The source structure CST may include a source conductive pattern SC and a support conductive pattern SP on the source conductive pattern SC. On the cell array region CAR, the source conductive pattern SC may be disposed between the semiconductor layer 100 and the electrode structure ST. The source conductive pattern SC may have first openings OP1 on the cell array region CAR. The first openings OP1 may be spaced apart from each other and may have a circular or bar shape. The source conductive pattern SC may be formed of a semiconductor material doped with impurities having the first conductivity type, for example, phosphorus (P) or arsenic (As). For example, the source conductive pattern SC may be formed of a polysilicon layer doped with n-type impurities.

According to some embodiments, on the connection region CNR, a dummy dielectric pattern 101*p*, 103*p*, and 105*p* may be disposed between the semiconductor layer 100 and the electrode structure ST. The dummy dielectric pattern 101*p*, 103*p*, and 105*p* may be located at substantially the same level as that of the source conductive pattern SC in a cross-sectional view of the semiconductor package or device.

The dummy dielectric pattern 101*p*, 103*p*, and 105*p* may have second openings OP2 on the connection region CNR. The second openings OP2 may be spaced apart from each other and may have a bar or linear shape. For example, the second openings OP2 may have a linear shape that extends in the first direction D1, and may have lengths in the first direction D1 that are different from each other based on position.

The dummy dielectric pattern 101*p*, 103*p*, and 105*p* may include first, second, and third dielectric patterns 101*p*, 103*p*, and 105*p* that are sequentially stacked. The second dielectric pattern 103*p* may include a dielectric material different from those of the first and third dielectric patterns 101*p* and 105*p*. The second dielectric pattern 103*p* may be thicker than the first and third dielectric patterns 101*p* and 105*p*. The first, second, and third dielectric patterns 101*p*, 103*p*, and 105*p* may include one or more materials, such as a silicon oxide layer, a silicon nitride layer, a silicon oxynitride layer, a silicon carbide layer, and/or a silicon germanium layer.

The support conductive pattern SP may be on and at least partially cover a top surface of the source conductive pattern SC on the cell array region CAR and a top surface of the dummy dielectric pattern 101*p*, 103*p*, and 105*p* on the connection region CNR. The support conductive pattern SP may include an intrinsic semiconductor doped with no impurities and/or a semiconductor doped with impurities having the first conductivity type (e.g., n-type).

On the cell array region CAR, portions of the support conductive pattern SP may penetrate the source conductive pattern SC to come into contact with the semiconductor layer 100. On the connection region CNR, portions of the support conductive pattern SP may penetrate the dummy dielectric pattern 101*p*, 103*p*, and 105*p* to come into contact with the semiconductor layer 100. For example, the support conductive pattern SP may include a first part that at least partially fills the first openings OP1 of the source conductive pattern SC and a second part that at least partially fills the second openings OP2 of the dummy dielectric pattern 101*p*, 103*p*, and 105*p*. The support conductive pattern SP may be on and at least partially cover a sidewall of the source conductive pattern SC in the first openings OP1 and a sidewall of the dummy dielectric pattern 101*p*, 103*p*, and 105*p* in the second openings OP2. The support conductive pattern SP may have a recessed top surface in the first and second openings OP1 and OP2.

On the connection region CNR, a through dielectric pattern 111 may be provided to penetrate the source structure CST and the semiconductor layer 100. The through dielectric pattern 111 may contact the lower dielectric layer 50 and may have a top surface substantially coplanar with that of the source structure CST in a cross-sectional view of the semiconductor package or device.

The electrode structure ST may be disposed on the source structure CST. The electrode structure ST may extend along the first direction D1 from the cell array region CAR toward the connection region CNR, and may have a stepwise structure on the connection region CNR.

The electrode structure ST may include electrodes GE1 and GE2 and dielectric layers ILD that are alternately stacked along a third direction D3 (or a vertical direction) perpendicular to the first and second directions D1 and D2 that intersect each other. The electrodes GE1 and GE2 may include, for example, one or more materials including, but not limited to, doped semiconductors (e.g., doped silicon), metals (e.g., tungsten, copper, and aluminum), conductive metal nitrides (e.g., titanium nitride and tantalum nitride), and/or transition metals (e.g., titanium and tantalum). The dielectric layers ILD may include a silicon oxide layer and/or a low-k dielectric layer. According to some embodiments, the semiconductor device may be a vertical NAND Flash memory device, and in this case, the electrodes GE1 and GE2 of the electrode structure ST may be used as the gate lower lines LL1 and LL2, the word lines WL, and the gate upper lines UL1 and UL2 that are discussed with reference to FIG. 1.

According to some embodiments, the electrode structure ST may include a first electrode structure ST1 and a second electrode structure ST2 on the first electrode structure ST1. The first electrode structure ST1 may include first electrodes GE1 and dielectric layers ILD that are alternately stacked in the third direction D3 on the semiconductor layer 100. The second electrode structure ST2 may include second electrodes GE2 and dielectric layers ILD that are alternately stacked in the third direction D3 on the first electrode structure ST1. A lowermost dielectric layer ILD of the second electrode structure ST2 may be disposed on an uppermost dielectric layer ILD of the first electrode structure ST1.

Even-numbered electrodes GE1 and GE2 of the electrode structure ST may have their pad parts PAD that are disposed along the first direction D1, and the cell contact plugs CPLG may be correspondingly coupled to the even-numbered electrodes GE1 and GE2. In other embodiments, 4nth electrodes GE1 and GE2 of the electrode structure ST may have their pad parts PAD that are disposed along the first direction D1 (where, n is a positive integer). In this case, $(4n-1)^{th}$, $(4n-2)^{th}$, and $(4n-3)^{th}$ electrodes GE1 or GE2 may have their sidewalls aligned with that of the 4nth electrode GE1 or GE2. The cell contact plugs CPLG may be coupled to the pad parts PAD of the 4nth electrodes GE1 and GE2. Alternatively, the pad parts PAD of the electrodes GE1 and GE2 may be positioned at their positions that are horizontally and vertically different from each other.

Referring to FIGS. 6A and 7A, each of the electrodes GE1 and GE2 may include an electrode part EP on the cell array region CAR and a pad part PAD on the connection region CNR.

The electrode part EP may have a first thickness T1, and the pad part PAD may have a second thickness T2 greater than the first thickness T1. The electrode part EP and the pad part PAD may have their bottom surfaces that are coplanar with each other in the cross-sectional view of the semiconductor package or device and are in contact with the dielectric layer ILD. The pad part PAD may have a top surface located at a higher level than that of a top surface of the electrode part EP in the cross-sectional view of the semiconductor package or device. The top surface of the pad part PAD may be in contact with the cell contact plug CPLG that penetrates a planarized dielectric layer 120 which will be described below.

Referring to FIGS. 7A and 7B, a horizontal dielectric pattern HP may conformally at least partially cover sidewalls, top surfaces, and bottom surfaces of the electrodes GE1 and GE2 adjacent to the vertical structures VS. The horizontal dielectric pattern HP may include a high-k dielectric layer, such as an aluminum oxide layer and/or a hafnium oxide layer.

According to some embodiments, on the connection region CNR, the electrode structure ST may include mold patterns MP that are located at the same levels as those of the electrodes GE1 and GE2 in the cross-sectional view of the semiconductor package or device and are disposed between the dielectric layers ILD. The mold patterns MP may include a dielectric material different from that of the dielectric layers ILD. The mold patterns MP may include, for example, one or more materials including, but not limited to, a silicon nitride layer, a silicon oxynitride layer, and/or a silicon germanium layer. The mold patterns MP may be closer than pad parts PAD of the electrodes GE1 and GE2 to the cell array region CAR. In addition, when viewed in plan, the mold patterns MP may overlap the through dielectric pattern 111.

A planarized dielectric layer 120 may at least partially cover the pad parts PAD of the electrode structure ST, which pad parts PAD have a stepwise structure. The planarized dielectric layer 120 may have a substantially flat top surface. The planarized dielectric layer 120 may include a single dielectric layer or a plurality of stacked dielectric layers. The planarized dielectric layer 120 may be provided thereon with first, second, third, and fourth interlayer dielectric layers 130, 140, 150, and 160 that are sequentially stacked.

The semiconductor layer 100 may be provided thereon with first, second, third, and fourth separation structures SS1, SS2, and SS3 that penetrate the electrode structure ST. Each of the first, second, and third separation structures SS1, SS2, and SS3 may include a dielectric that at least partially covers a sidewall of the electrode structure ST. Each of the first, second, and third separation structures SS1, SS2, and SS3 may have a single-layered or multi-layered structure. The first, second, and third separation structures SS1, SS2, and SS3 may have their top surfaces located at substantially the same level in the cross-sectional view of the semiconductor package or device.

The first separation structures SS1 may extend along the first direction D1 from the cell array region CAR toward the connection region CNR, and may be spaced apart from each other in the second direction D2 that intersects the first direction D1. On the cell array region CAR, the first separation structure SS1 may penetrate the first part of the support conductive pattern SP, which first part at least partially fills the first opening OP1. On the cell array region CAR, the first separation structures SS1 may be in contact with the semiconductor layer 100. The first separation structures SS1 may each include a lower part that penetrates the first part of the support conductive pattern SP and an upper part that penetrates the electrode structure ST, and the lower part may have a width less than that of the upper part.

On the cell array region CAR, the second separation structure SS2 may penetrate the electrode structure ST. The second separation structure SS2 may be disposed between the first separation structures SS1. When viewed in the first direction D1, the second separation structure SS2 may have a length less than that of the first separation structure SS1. In other embodiments, a plurality of second separation structures SS2 may be provided between the first separation structures SS1.

On the connection region CNR, the third separation structures SS3 may be spaced apart from the first and second separation structures SS1 and SS2 to penetrate the planarized dielectric layer 120 and the electrode structure ST. The third separation structures SS3 may extend along the first direction D1. The third separation structures SS3 may be spaced apart from each other in the first direction D1 and the second direction D2.

On the cell array region CAR, a plurality of vertical structures VS may penetrate the electrode structure ST and the source structure CST. When viewed in plan, the vertical structures VS may be arranged in a straight or zigzag fashion.

Each of the vertical structures VS may include a first vertical extension that penetrates the first electrode structure ST1, a second vertical extension that penetrates the second electrode structure ST2, and an expansion between the first and second vertical extensions. The expansion may be provided in the uppermost dielectric layer ILD of the first electrode structure ST1. The vertical structure VS may have a diameter that abruptly increases at the expansion.

The planarized dielectric layer 120 may be provided thereon with a first interlayer dielectric layer 130 that at least partially covers top surfaces of the vertical structures VS.

Referring to FIGS. 6A, 6B, and 7B, each of the vertical structures VS may include a vertical semiconductor pattern VP and a data storage pattern DSP that at least partially surrounds a sidewall of the vertical semiconductor pattern VP.

For example, the vertical semiconductor pattern VP may have a macaroni shape or a pipe shape whose bottom end is closed. The vertical semiconductor pattern VP may be shaped like U, and may have an inside filled with a gap-fill dielectric pattern VI. The vertical semiconductor pattern VP may include a semiconductor material, such as silicon (Si), germanium (Ge), or a mixture thereof. The vertical channel pattern VP including the semiconductor material may be used as channels of the upper transistors UT1 and UT2, of the memory cell transistors MCT, and of the lower transistors LT1 and LT2, all of which transistors are discussed with reference to FIG. 1. The vertical semiconductor pattern VP may have a bottom surface located at a lower level than that of a bottom surface of the source conductive pattern SC in the cross-sectional view of the semiconductor package or device.

A portion of the sidewall of the vertical semiconductor pattern VP may be in contact with the source conductive pattern SC. For example, the source conductive pattern SC may include a horizontal part SC1 that is parallel to the electrode structure ST between the support conductive pattern SP and the semiconductor layer 100, and may also include a sidewall part SC2 that contacts and at least partially surrounds a portion of the sidewall of the vertical semiconductor pattern VP. For the source conductive pattern SC, the horizontal part SC1 may have a top surface in contact with a bottom surface of the support conductive pattern SP and a bottom surface in contact with a top surface of the semiconductor layer 100. The sidewall part SC2 may vertically protrude from the horizontal part SC1 of the source conductive pattern SC to come into partial contact with a sidewall of the support conductive pattern SP. The sidewall part SC2 may have a thickness in the third direction D3 greater than a thickness in the third direction D3 of the horizontal part SC1 of the source conductive pattern SC.

The data storage pattern DSP may extend in the third direction D3 and may at least partially surround the sidewall of the vertical semiconductor pattern VP. The data storage pattern DSP may have a macaroni shape or a pipe shape whose top and bottom ends are opened. The data storage pattern DSP may have a bottom surface located at a level between those of top and bottom surfaces of the support conductive pattern SP. The data storage pattern DSP may be formed of a single thin layer or a plurality of thin layers. In some embodiments of the present inventive concepts, the data storage pattern DSP may include a tunnel dielectric layer TIL, a charge storage layer CIL, and a blocking dielectric layer BLK that are sequentially stacked on the sidewall of the vertical semiconductor pattern VP, which layers TIL, CIL, and BLK constitute a data storage layer of a NAND Flash memory device. For example, the charge storage layer CIL may be a trap dielectric layer, a floating gate electrode, or a dielectric layer including conductive nano-dots.

In addition, the semiconductor layer 100 may be provided therein with a dummy data storage pattern RDSP vertically spaced apart from the data storage pattern DSP. The dummy data storage pattern RDSP may have a thin-film structure the same as that of the data storage pattern DSP.

On the connection region CNR, a vertical dielectric pattern TIP may penetrate a portion of the electrode structure ST. The vertical dielectric pattern TIP may be provided between the electrodes GE1 and GE2 and the mold patterns MP. When viewed in plan, the vertical dielectric pattern TIP may at least partially surround the mold patterns MP. The vertical dielectric pattern TIP may include a dielectric layer that at least partially covers a sidewall of the electrode structure ST and sidewalls of the mold patterns MP. The vertical dielectric pattern TIP may be in contact with the top surface of the support conductive pattern SP and/or the top surface of the through dielectric pattern 111. The vertical dielectric pattern TIP may have a top surface at a level different from that of top surfaces of the first, second, and third separation structures SS1, SS2, and SS3 in the cross-sectional view of the semiconductor package or device.

The first interlayer dielectric layer 130 may be provided thereon with a second interlayer dielectric layer 140 that at least partially covers the top surface of the vertical dielectric pattern TIP.

On the connection region CNR, the through contact plugs TPLG may vertically penetrate the through dielectric pattern 111 and the mold patterns MP of the electrode structure ST to thereby connect to the peripheral circuit lines PLP. The through contact plugs TPLG may be electrically connected through the conductive lines CL to the cell contact plugs CPLG.

A first spacer SP1 formed of a dielectric material may at least partially surround a sidewall of the through contact plug TPLG.

First sidewall dielectric patterns CS1 may be disposed between the mold patterns MP and the first spacer SP1, and may at least partially surround the sidewall of the through contact plug TPLG. The first sidewall dielectric patterns CS1 may include a dielectric material (e.g., silicon oxide) different from that of the mold patterns MP.

On the connection region CNR, peripheral connection plugs PPLG may penetrate the planarized dielectric layer 120 to be coupled to the semiconductor layer 100. Alternatively, the peripheral connection plugs PPLG may penetrate the planarized dielectric layer 120 to be coupled to the support conductive pattern SP. The peripheral connection plugs PPLG may be horizontally spaced apart from the electrode structure ST. The peripheral connection plugs PPLG may have their top surfaces located at substantially the same level as that of top surfaces of the through contact plugs TPLG in the cross-sectional view of the semiconductor package or device. For example, the peripheral connection plugs PPLG may have their top surfaces coplanar with those of the through contact plugs TPLG in the cross-sectional view of the semiconductor package or device.

A second spacer SP2 formed of a dielectric material may at least partially surround a sidewall of the peripheral connection plug PPLG.

The second interlayer dielectric layer 140 may be provided thereon with a third interlayer dielectric layer 150 that at least partially covers the top surfaces of the through contact plugs TPLG and the top surfaces of the peripheral connection plugs PPLG.

On the connection region CNR, the dummy vertical structures DVS may penetrate the planarized dielectric layer 120, the electrode structure ST, the support conductive pattern SP, and the dummy dielectric pattern 101p, 103p, and 105p. The dummy vertical structures DVS may penetrate corresponding pad parts PAD of the electrodes GE1 and GE2. The dummy vertical structures DVS may have their top surfaces substantially coplanar with those of the through contact plugs TPLG and those of the peripheral connection plugs PPLG in the cross-sectional view of the semiconductor package or device.

Referring to FIGS. 5A, 5B, 5C, and 5D, the top surfaces of the dummy vertical structures DVS may each have a circular shape, an oval shape, a bar shape, or any other suitable shape.

The dummy vertical structures DVS may be disposed around each cell contact plug CPLG. When the top surfaces of the dummy vertical structures DVS have oval shapes, the dummy vertical structures DVS may have their major axes positioned in different directions on each pad part PAD. A plurality of dummy vertical structures DVS may be provided between the cell contact plugs CPLG that are adjacent to each other.

Referring to FIGS. 8A, 8B, and 8C, each of the dummy vertical structures DVS may include a dummy contact plug DPLG and a third spacer SP3.

The dummy contact plug DPLG may include a metallic material and may contact the semiconductor layer 100. The dummy contact plug DPLG may have therein one or more seams or voids.

The dummy contact plug DPLG may include a metallic material the same as that of the through contact plugs TPLG and that of the peripheral connection plugs PPLG. In some embodiments, the dummy contact plug DPLG may include a metallic material, but embodiments of the present inventive concepts are not limited thereto and the dummy contact plug DPLG may be formed of a dielectric material.

The dummy contact plug DPLG may include a metal pattern ME and a barrier metal pattern BM that at least partially surrounds a sidewall and a bottom surface of the metal pattern ME. For example, the metal barrier pattern BM may include a double layer or a mixture layer other than the double layer, including one or more materials including, but not limited to, titanium, titanium nitride, tantalum, tantalum nitride, ruthenium, cobalt, manganese, tungsten nitride, nickel, nickel boride, and/or titanium/titanium nitride. The metal pattern ME may include titanium, tantalum, ruthenium, cobalt, manganese, tungsten, nickel, and/or copper.

The third spacer SP3 may be disposed between the electrode structure ST and the dummy contact plug DPLG. The third spacer SP3 may at least partially surround a sidewall of the dummy contact plug DPLG. The third spacer SP3 may be formed of a dielectric material.

A blocking oxide layer BO may be interposed between the support conductive pattern SP and the sidewall of the dummy contact plug DPLG and between the semiconductor layer 100 and the sidewall of the dummy contact plug DPLG.

Second sidewall dielectric patterns CS2 may be disposed between the third spacer SP3 and the electrodes GE1 and GE2, and may at least partially surround the sidewall of the dummy contact plug DPLG. The second sidewall dielectric patterns CS2 may include the same material (e.g., silicon oxide) as that of the first sidewall dielectric patterns CS1.

Referring to FIGS. 7A and 8A, the pad part PAD of each of the electrodes GE1 and GE2 may include a lower portion LP connected to the electrode part EP and an upper portion UP on the lower portion LP. Between adjacent ones of the dummy vertical structures DVS, each pad part PAD may have an upper portion UP with an upper width UW greater than a lower width LW of the lower portion LP thereof. The upper portion UP of the pad part PAD may have a shape that horizontally protrudes toward the dummy vertical structures DVS. For example, the pad part PAD may have a stepwise profile at a sidewall thereof, and the stepwise sidewall may be adjacent to the second sidewall dielectric pattern CS2. For example, a stepwise sidewall profile may be given to the second sidewall dielectric patterns CS2 adjacent to the pad parts PAD of the electrodes GE1 and GE2. In addition, a portion of the horizontal dielectric pattern HP may be interposed between the second sidewall dielectric pattern CS2 and the pad part PAD of each of the electrodes GE1 and GE2.

Referring to FIG. 8B, each pad part PAD may have an inclined sidewall between adjacent ones of the dummy vertical structures DVS. For example, between adjacent ones of the dummy vertical structures DVS, each pad part PAD may have a maximum width UW at a top surface thereof and a minimum width LW at a bottom surface thereof. Between adjacent ones of the dummy vertical structures DVS, the pad part PAD may have a width that progressively decreases in a direction from the top to bottom surfaces of the pad part PAD. In addition, a stepwise sidewall profile may be given to the second sidewall dielectric patterns CS2 adjacent to the pad parts PAD of the electrodes GE1 and GE2.

Referring to FIG. 8C, between adjacent ones of the dummy vertical structures DVS, each pad part PAD may have a substantially uniform width at top and bottom surfaces thereof. For example, between adjacent ones of the dummy vertical structures DVS, each pad part PAD may have at the upper portion UP with an upper width UW substantially the same as a lower width LW of the lower portion LP thereof.

The cell contact plugs CPLG may penetrate the first and second interlayer dielectric layers 130 and 140 and the planarized dielectric layer 120 to be coupled to the pad parts PAD of the electrodes GE1 and GE2. The cell contact plugs CPLG may have vertical lengths that decrease with decreasing distance from the cell array region CAR. The cell contact plugs CPLG may have their top surfaces substantially coplanar with each other in the cross-sectional view of the semiconductor package or device. The conductive lines CL may be disposed on a fourth interlayer dielectric layer 160 of the connection region CNR, and may be coupled to the cell contact plugs CPLG through contact plugs LCT.

Although bit lines are omitted in plan views, referring to FIGS. 6A and 6B, bit lines BL may be disposed on the fourth interlayer dielectric layer 160 on the cell array region CAR and may extend in the second direction D2 while running across the electrode structure ST. The bit lines BL may be electrically connected to the vertical structures VS through lower and upper bit-line contact plugs BCTa and BCTb.

Figure 9:
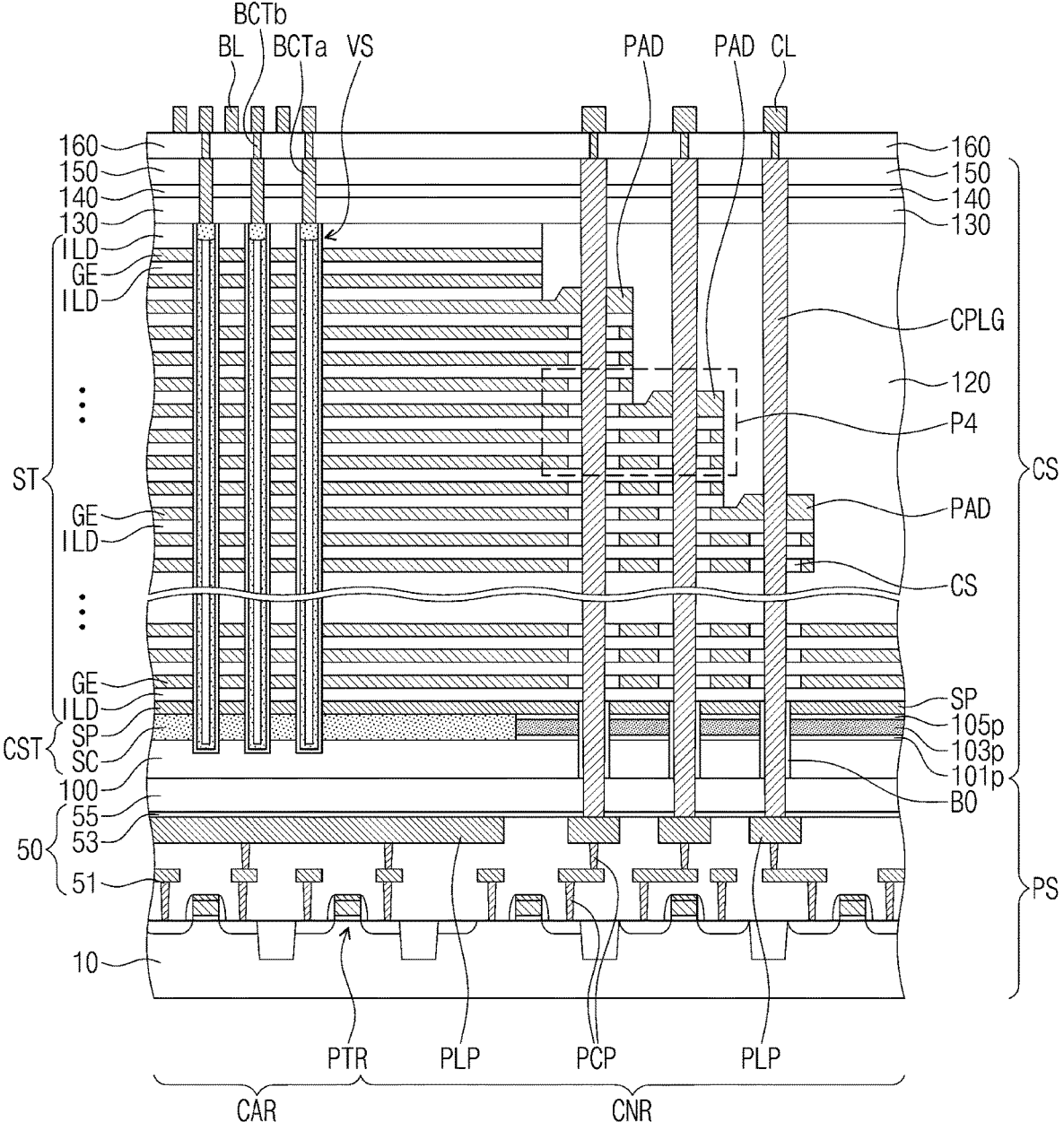
FIG. 9 illustrates a cross-sectional view showing a semiconductor device according to some embodiments of the present inventive concepts.
Figure 10:
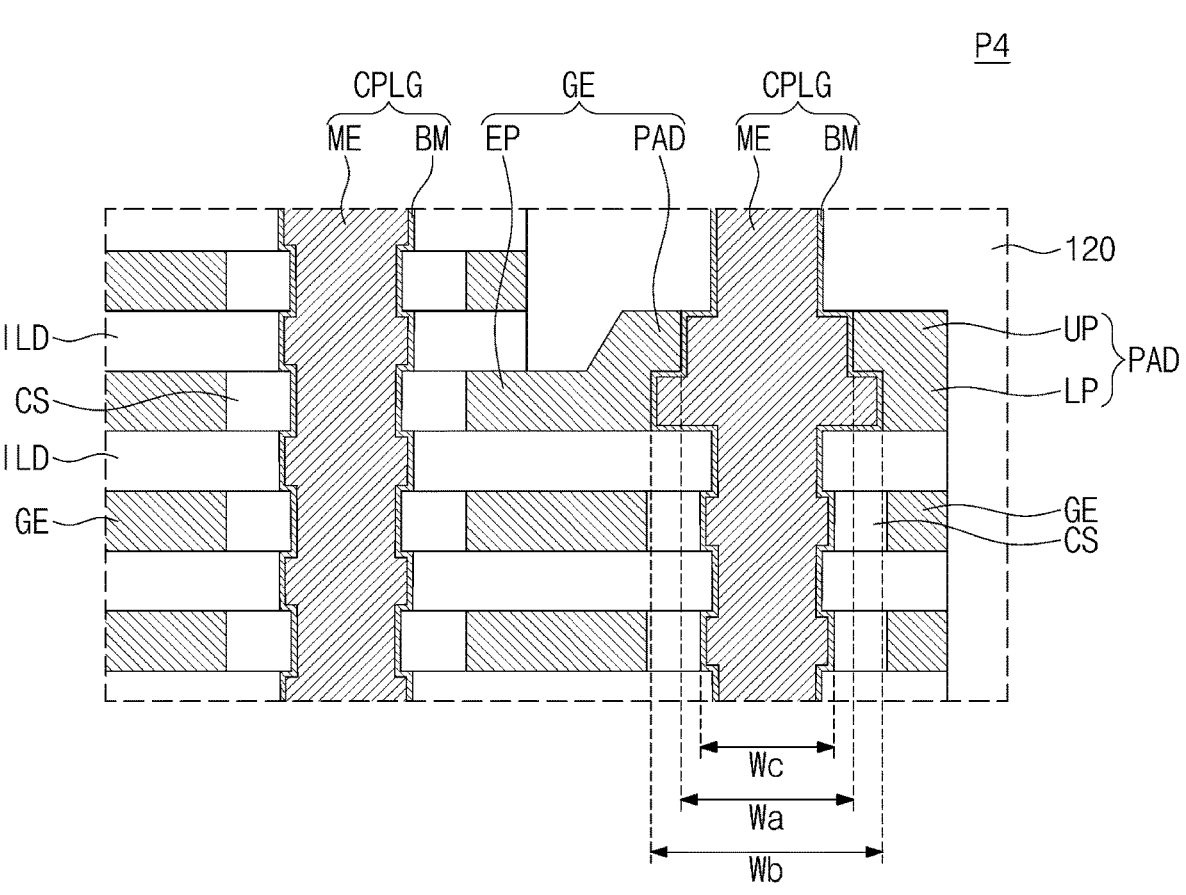
FIG. 10 illustrates an enlarged view showing section P4 of FIG. 9.

FIG. 9 illustrates a cross-sectional view showing a semiconductor device according to some embodiments of the present inventive concepts. FIG. 10 illustrates an enlarged view showing section P4 of FIG. 9. In the embodiment that follows, a detailed description of technical features repetitive to those discussed above with reference to FIGS. 5, 6A, and 6B will be omitted, and a difference thereof will be discussed in detail.

Referring to FIG. 9, as discussed above, the electrode structure ST may include electrodes GE and dielectric layers ILD that are alternately stacked along the third direction D3.

As discussed with reference to FIG. 7A, each of the electrodes GE may include an electrode part EP on the cell array region CAR and a pad part PAD on the connection region CNR. As discussed above, the pad part PAD of each electrode GE may include a lower portion LP connected to the electrode part EP and an upper portion UP on the lower portion LP.

According to the present embodiment, the cell contact plugs CPLG may penetrate the electrode structure ST to connect to the peripheral circuit lines PLP of the peripheral circuit structure PS. The cell contact plugs CPLG may correspondingly penetrate the pad parts PAD of the electrodes GE. The cell contact plugs CPLG may have their sidewalls that are in partial contact with the pad parts PAD of the electrodes GE.

Referring to FIG. 10, each of the cell contact plugs CPLG may include a connection part in contact with the pad part PAD and a pillar part that penetrates the electrode part EP. The connection part may have a width (or diameter) greater than a width (or diameter) of the pillar part. The connection part of each cell contact plug CPLG may have a stepwise sidewall. The connection part of each cell contact plug CPLG may include a first portion in contact with the upper portion UP of the pad part PAD, and may also include a second portion in contact with the lower portion LP of the pad part PAD, and the first portion may have a first width Wa less than a width Wb of the second portion. The first width Wa and the second width Wb may be greater than a third width We of the pillar part of each cell contact plug CPLG.

Sidewall dielectric patterns CS may be correspondingly interposed between the cell contact plugs CPLG and the electrode parts EP of the electrodes GE.

The connection of each cell contact plug CPLG may have a sidewall profile obtained in an etching process that etches portions of sacrificial layers and portions of pad sacrificial patterns in a subsequent process which will be discussed with reference to FIGS. 20A and 20B.

As the first width Wa is less than the second width Wb of the connection on each cell contact plug CPLG, a dielectric material may not remain between the connection of the cell contact plug CPLG and the pad part PAD of the electrode GE when the sidewall dielectric patterns CS are formed.

Figure 11:
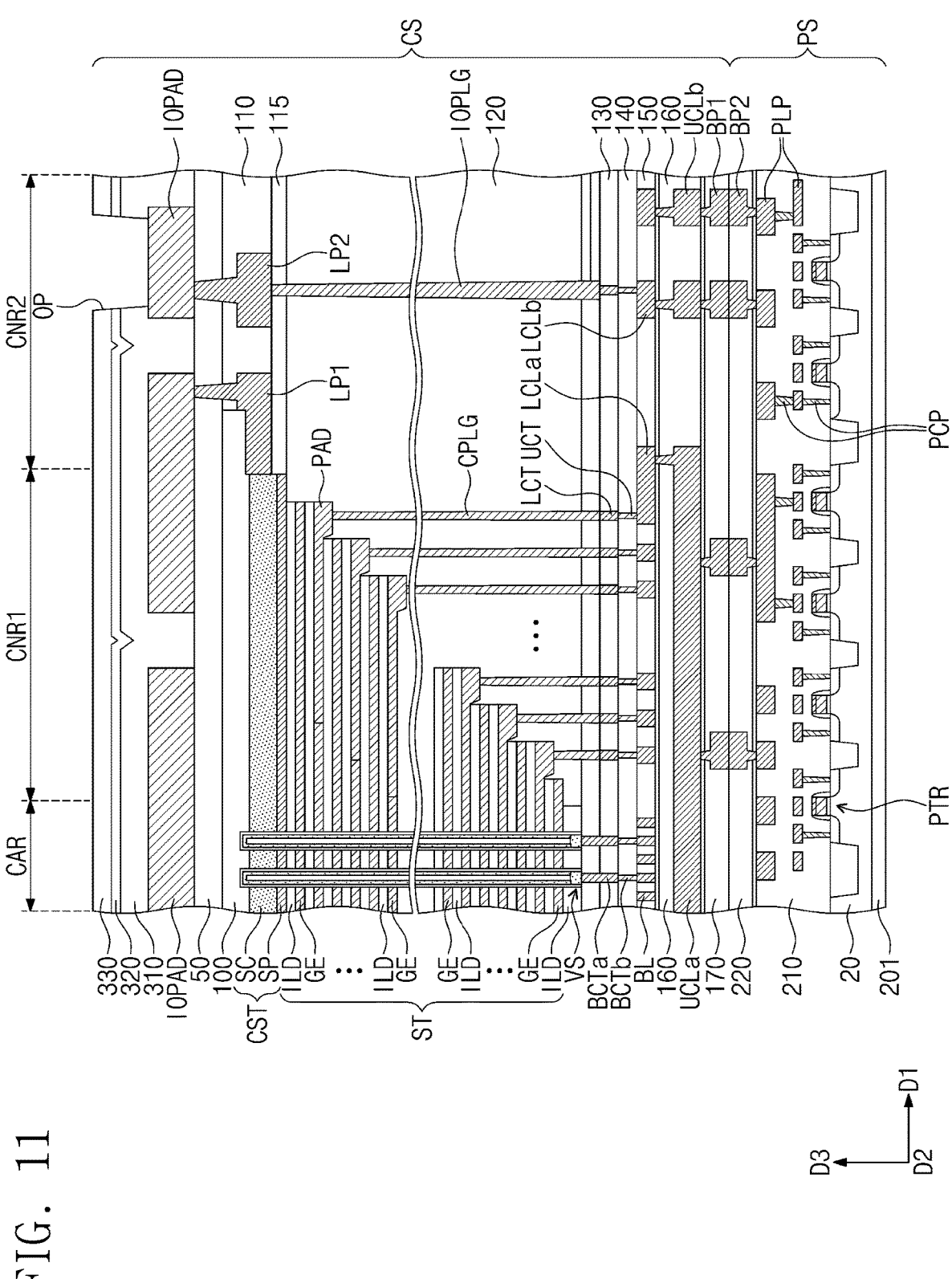
FIG. 11 illustrates a cross-sectional view showing a semiconductor device according to some embodiments of the present inventive concepts.

FIG. 11 illustrates a cross-sectional view showing a semiconductor device according to some embodiments of the present inventive concepts. In the embodiment that follows, a detailed description of technical features repetitive to those discussed above with reference to FIGS. 5, 6A, and 6B will be omitted, and a difference thereof will be discussed in detail.

Referring to FIG. 11, a chip-to-chip (C2C) structure may be given to a semiconductor device according to some embodiments of the present inventive concepts. The C2C structure may be fabricated by forming on a first wafer an upper chip including a cell array structure CS; forming, on a second wafer different from the first wafer, a lower chip including a peripheral circuit structure PS; and then using a bonding method to connect the upper and lower chips to each other. For example, the bonding method may include electrically connecting a bonding metal formed on an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may also be formed of aluminum (Al) and/or tungsten (W).

The cell array structure CS may include a memory cell array including memory cells that are three-dimensionally arranged on the semiconductor layer 100. The memory cell array may be electrically connected to first bonding pads BP1 which will be described below.

For example, the cell array structure CS may include a semiconductor layer 100, a source structure CST, an electrode structure ST, vertical structures VS, bit lines BL, cell contact plugs CPLG, and an input/output contact plug IOPLG.

The cell array structure CS may include a cell array region CAR, a first connection region CNR1, and a second connection region CNR2, and the first connection region CNR1 may be positioned in the first direction D1 between the cell array region CAR and the second connection region CNR2.

On the cell array region CAR and the first connection region CNR1, the semiconductor layer 100 of the cell array structure CS may be disposed on a top surface of the lower dielectric layer 50. The semiconductor layer 100 may be formed of a semiconductor material, a dielectric material, and/or a conductive material.

The source structure CST may be disposed on the semiconductor layer 100. The source structure CST may include a source conductive pattern SC and a support conductive pattern SP on the source conductive pattern SC. The source structure CST may be parallel to a top surface of the semiconductor layer 100, and on the cell array region CAR and the first connection region CNR1, may extend in the first direction D1 along the electrode structure ST.

On the second connection region CNR2, a buried dielectric layer 110 may be disposed to at least partially cover a sidewall of the semiconductor layer 100 and a sidewall of the source structure CST. The buried dielectric layer 110 may have a top surface substantially coplanar with that of the source structure CST in the cross-sectional view of the semiconductor package or device. The top surface of the buried dielectric layer 110 may be located at substantially the same level as that of a top surface of the source conductive pattern SC and that of a top surface of the support conductive pattern SP in the cross-sectional view of the semiconductor package or device. The buried dielectric layer 110 may include a dielectric material, such as silicon oxide and silicon nitride.

The buried dielectric layer 110 may be provided therein with a first pad conductive pattern LP1 and a second pad conductive pattern LP2.

The first pad conductive pattern LP1 may be provided between the semiconductor layer 100 and the source structure CST and may be in contact with a portion of the semiconductor layer 100. The first pad conductive pattern LP1 may include a via part in contact with an input/output pad IOPAD provided on a bottom surface of the lower dielectric layer 50, and may also include a pad part in the buried dielectric layer 110 and in contact with the semiconductor layer 100. The first pad conductive pattern LP1 may have a substantially flat top surface. For example, the top surface of the first pad conductive pattern LP1 may be located at substantially the same level as that of the top surface of the source conductive pattern SC and that of the top surface of the support conductive pattern SP in the cross-sectional view of the semiconductor package or device. The top surface of the first pad conductive pattern LP1 may be substantially coplanar with that of the second pad conductive pattern LP2 in the cross-sectional view of the semiconductor package or device. The first pad conductive pattern LP1 may have a sidewall in contact with at least a portion of the source structure CST, or with a sidewall of the source conductive pattern SC. The first pad conductive pattern LP1 may have portions in direct contact with the buried dielectric layer 110 and a first dielectric pattern 115. The first pad conductive pattern LP1 may have a first thickness on the semiconductor layer 100, and may also have in the buried dielectric layer 110 a second thickness greater than the first thickness.

A metal silicide layer may be interposed between the semiconductor layer 100 and a portion of the first pad conductive pattern LP1 and between the source structure CST and the first pad conductive pattern LP1.

The second pad conductive pattern LP2 may be disposed in the buried dielectric layer 110 while being spaced apart from the sidewall of the semiconductor layer 100. The second pad conductive pattern LP2 may be coupled to the input/output pad IOPAD provided on the lower dielectric layer 50. The second pad conductive pattern LP2 may include a via part in contact with the input/output pad IOPAD provided on the bottom surface of the lower dielectric layer 50, and may also include a pad part connected to the via part and in the buried dielectric layer 110.

The electrode structure ST may be disposed on the source structure CST. The electrode structure ST may include electrodes GE and dielectric layers ILD that are alternately stacked along the third direction D3 (or a vertical direction) perpendicular to the first and second directions D1 and D2 that intersect each other.

As described with reference to FIG. 7A, each of the electrodes GE may include an electrode part on the cell array region CAR and a pad part PAD on the first connection region CNR1. The pad part PAD may be thicker than the electrode part. The electrodes GE may be stacked on the source structure CST to have a stepwise structure on the first connection region CNR1. The pad parts PAD of the electrodes GE may be located at positions that are horizontally and vertically different from each other in the cross-sectional view of the semiconductor package or device. The cell contact plugs CPLG may be correspondingly coupled to the pad parts PAD of the electrodes GE.

A plurality of vertical structures VS may penetrate the electrode structure ST on the cell array region CAR. As discussed above, each of the vertical structures VS may include a vertical semiconductor pattern VP and a data storage pattern DSP that at least partially surrounds a sidewall of the vertical semiconductor pattern VP.

As discussed above, dummy vertical structures (not shown) may penetrate the pad parts PAD of the electrodes GE on the first connection region CNR1. A planarized dielectric layer 120 may at least partially cover a stepwise structure of the electrode structure ST. The planarized dielectric layer 120 may have a substantially flat top surface.

The cell contact plugs CPLG may penetrate first and second interlayer dielectric layers 130 and 140 and the planarized dielectric layer 120 to be coupled to the pad parts PAD of the electrodes GE. The cell contact plugs CPLG may have vertical lengths that decrease with decreasing distance from the cell array region CAR. The cell contact plugs CPLG may have top surfaces that are substantially coplanar with each other in the cross-sectional view of the semiconductor package or device.

The input/output contact plug IOPLG may penetrate the first and second interlayer dielectric layers 130 and 140 and the planarized dielectric layer 120 to be coupled to the second landing conductive pattern LP2. The input/output contact plug IOPLG may be electrically connected through the second landing conductive pattern LP2 to the input/output pad IOPAD.

A fourth interlayer dielectric layer 160 may be provided thereon with the bit lines BL that run across the electrode structure ST and extend in the second direction D2. The bit lines BL may be electrically connected to the vertical structures VS through lower and upper bit-line contact plugs BCTa and BCTb.

First lower conductive lines LCLa may be disposed on the fourth interlayer dielectric layer 160 of the first connection region CNR1 and may be coupled through lower and upper contact plugs LCT and UCT to the cell contact plugs CPLG.

Second lower conductive lines LCLb may be disposed on the fourth interlayer dielectric layer 160 of the second connection region CNR2 and may be coupled through lower and upper contact plugs LCT and UCT to the input/output contact plugs IOPLG.

First and second upper conductive lines UCLa and UCLb may be disposed in a sixth interlayer dielectric layer 180. On the cell array region CAR and the first connection region CNR1, the first upper conductive lines UCLa may be electrically connected to first lower conductive lines LCLa. On the second connection region CNR2, the second upper conductive lines UCLb may be electrically connected to second lower conductive lines LCLb.

The first and second lower conductive lines LCLa and LCLb and the first and second upper conductive lines UCLa and UCLb may include one or more materials including, but not limited to, metals (e.g., tungsten, copper, and aluminum), conductive metal nitrides (e.g., titanium nitride and tantalum nitride), and/or transition metals (e.g., titanium and tantalum). For example, the first and second lower conductive lines LCLa and LCLb may be formed of tungsten whose electrical resistivity is relatively high, and the first and second upper conductive lines UCLa and UCLb may be formed of copper whose electrical resistivity is relatively low.

First bonding pads BP1 may be provided in an uppermost interlayer dielectric layer 170. The first bonding pads BP1 may be electrically connected to the first and second upper conductive lines UCLa and UCLb. The first bonding pads BP1 may be formed of aluminum, copper, and/or tungsten.

A peripheral circuit structure PS may be formed on a semiconductor substrate 20, and may include peripheral circuits PTR that control the memory cell array and may also include peripheral interlayer dielectric layers 210 and 220 that at least partially cover the peripheral circuits PTR. The peripheral circuits PTR may be integrated on a top surface of the semiconductor substrate 20. A surface dielectric layer 201 may be provided on a bottom surface of the semiconductor substrate 20.

The peripheral circuits PTR may be row and column decoders, a page buffer, and a control circuit. For example, the peripheral circuits PTR may include NMOS and PMOS transistors. Peripheral circuit lines PLP may be electrically connected through peripheral contact plugs PCP to the peripheral circuits PTR.

The peripheral interlayer dielectric layers 210 and 220 may be provided on the top surface of the semiconductor substrate 20. On the semiconductor substrate 20, the peripheral interlayer dielectric layers 210 and 220 may at least partially cover the peripheral circuits PTR, the peripheral contact plugs PCP, and the peripheral circuit lines PLP. The peripheral contact plugs PCP and the peripheral circuit lines PLP may be electrically connected to the peripheral circuits PTR. The peripheral interlayer dielectric layers 210 and 220 may include one or more materials including, but not limited to, a silicon oxide layer, a silicon nitride layer, a silicon oxynitride layer, and/or a low-k dielectric layer.

An uppermost peripheral interlayer dielectric layer 220 may be provided therein with second bonding pads BP2 that correspond to the first bonding pads BP1. The second bonding pads BP2 may be electrically connected to the peripheral circuits PTR through the peripheral circuit lines PLP and the peripheral contact plugs PCP.

A bonding method may be used to electrically and physically connect the second bonding pads BP2 to the first bonding pads BP1. For example, the second bonding pads BP2 may be in direct contact with the first bonding pads BP1.

The second bonding pads BP2 may include a metallic material the same as that of the first bonding pads BP1. The first and second bonding pads BP1 and BP2 may be substantially the same in terms of shape, width, and/or area.

The input/output pads IOPAD may be disposed on the bottom surface of the lower dielectric layer 50 of the cell array structure CS. A capping dielectric layer 310 may be disposed on the bottom surface of the lower dielectric layer 50, at least partially covering the input/output pads IOPAD.

A protection layer 320 and a passivation layer 330 may be sequentially formed on up to an entire surface of the capping dielectric layer 310. The protection layer 320 may include, for example, a silicon nitride layer and/or a silicon oxynitride layer. The passivation layer 330 may include, for example, a polyimide-based material, such as photosensitive polyimide (PSPI).

The protection layer 320 and the passivation layer 330 may have a pad opening OP that exposes a portion of the input/output pad IOPAD.

FIGS. 12A to 22A illustrate cross-sectional views taken along line A-A' of FIG. 5A, showing a method of fabricating a semiconductor device according to some embodiments of the present inventive concepts. FIGS. 12B to 22B illustrate cross-sectional views taken along lines B-B' and C-C' of FIG. 5A, showing a method of fabricating a semiconductor device according to some embodiments of the present inventive concepts.

Figure 12A:
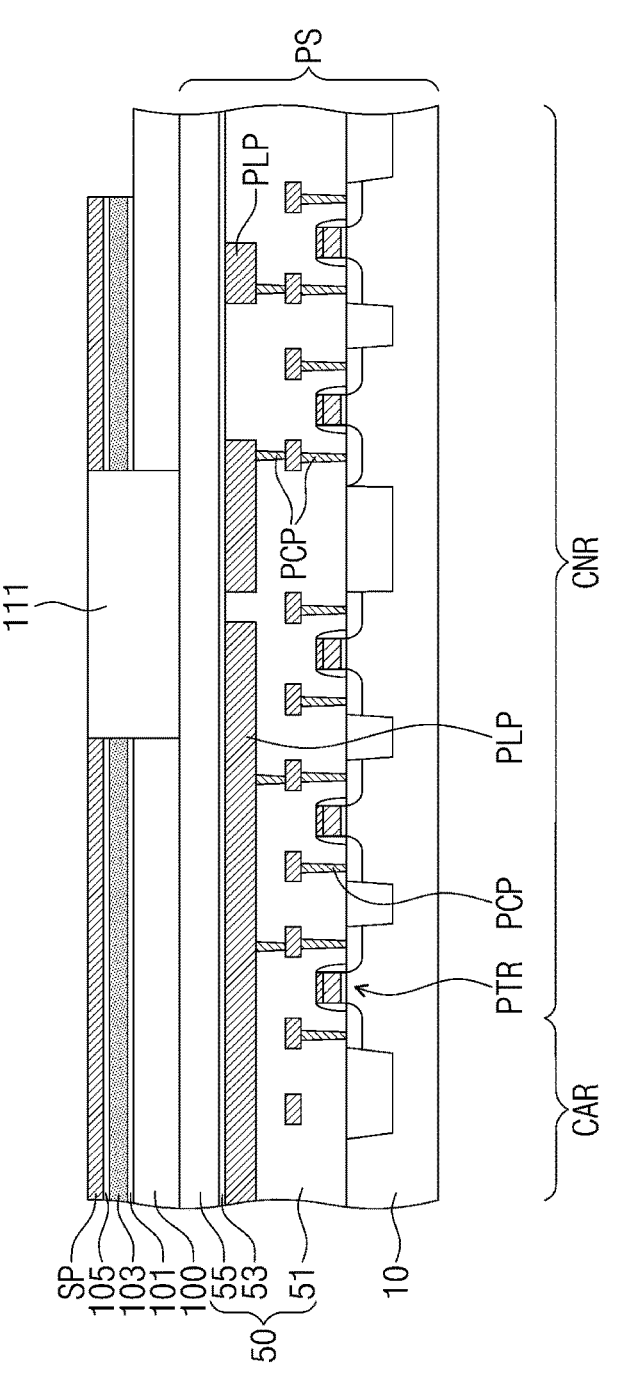
Figure 12B:
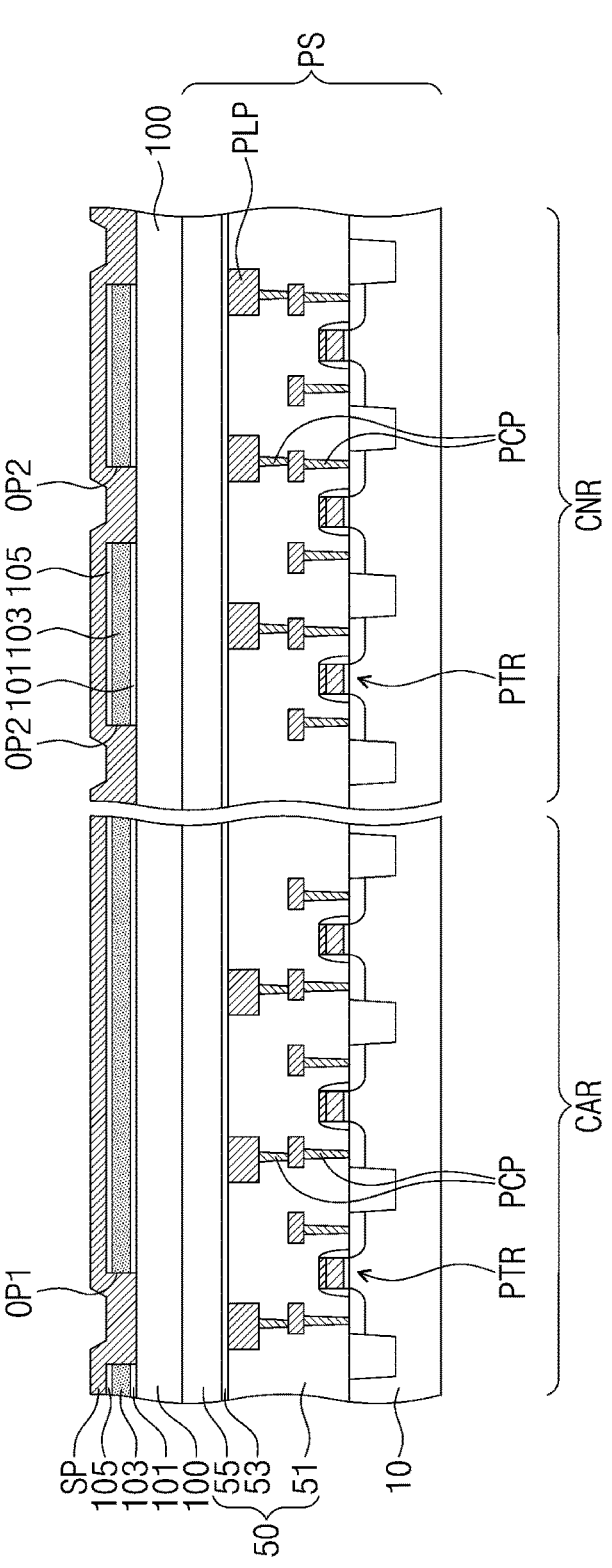

Referring to FIGS. 12A and 12B, a peripheral circuit structure PS may be formed on a semiconductor substrate 10 having a cell array region CAR and a connection region CNR.

The formation of the peripheral circuit structure PS may include forming peripheral circuits PTR on the semiconductor substrate 10, forming peripheral wiring structures PCP and PLP connected to the peripheral circuits PTR, and forming a lower dielectric layer 50.

Row and column decoders, page buffers, and control circuits may be formed on the semiconductor substrate 10, constituting the peripheral circuits PTR. The peripheral circuits PTR may include metal oxide semiconductor (MOS) transistors each of which uses the semiconductor substrate 10 as a channel.

The lower dielectric layer 50 may include a single dielectric layer or a plurality of stacked dielectric layers that at least partially cover the peripheral circuits PTR. The lower dielectric layer 50 may include a first lower dielectric layer 51, a second lower dielectric layer 55, and an etch stop layer 53 between the first and second lower dielectric layers 51 and 55. The lower dielectric layer 50 may include, for example, one or more materials including, but not limited to, a silicon oxide layer, a silicon nitride layer, a silicon oxynitride layer, and/or a low-k dielectric layer.

The formation of the peripheral wiring structures PCP and PLP may include forming peripheral contact plugs PCP each of which penetrates a portion of the lower dielectric layer 50, and forming peripheral circuit lines PLP connected to the peripheral contact plugs PCP.

A semiconductor layer 100 may be formed on the lower dielectric layer 50. The semiconductor layer 100 may be formed by depositing a semiconductor material. The semiconductor layer 100 may include, for example, one or more materials including, but not limited to, silicon (Si), germanium (Ge), silicon germanium (SiGe), gallium arsenic (GaAs), indium gallium arsenic (InGaAs), aluminum gallium arsenic (AlGaAs), and mixtures thereof. The semiconductor layer 100 may include an impurity-doped semiconductor and/or an impurity-undoped intrinsic semiconductor. The semiconductor layer 100 may have one or more structures including, but not limited to, a single-crystalline structure, an amorphous structure, and/or a polycrystalline structure.

A first dielectric layer 101, a second dielectric layer 103, and a third dielectric layer 105 may be sequentially stacked on the semiconductor layer 100. The first dielectric layer 101 may be formed by thermally oxidizing a surface of the semiconductor layer 100 or by depositing a silicon oxide layer. The second dielectric layer 103 may be formed of a material having an etch selectivity with respect to the first dielectric layer 101 and the third dielectric layer 105. For example, the second dielectric layer 103 may be one or more materials including, but not limited to, a silicon nitride layer, a silicon oxynitride layer, and a silicon carbide layer, and/or a silicon-germanium layer. The third dielectric layer 105 may be formed by depositing a silicon oxide layer.

The first, second, and third dielectric layers 101, 103, and 105 may have first and second openings OP1 and OP2 that expose portions of the semiconductor layer 100 on the cell array region CAR and the connection region CNR.

The formation of the first and second openings OP1 and OP2 may include forming a mask pattern (not shown) that partially exposes the connection region CNR and the cell array region CAR, and then using the mask pattern as an etching mask to etch the first, second, and third dielectric layers 101, 103, and 105 to expose the first dielectric layer 101 or the semiconductor layer 100. After the first and second openings OP1 and OP2 are formed, the mask pattern may be removed.

After the formation of the first and second openings OP1 and OP2, a support conductive layer SP may be deposited to have a substantially uniform thickness on the third dielectric layer 105. On the cell array region CAR, the support conductive layer SP may at least partially fill the first and second openings OP1 and OP2 of the first, second, and third dielectric layers 101, 103, and 105. The support conductive layer SP may be in direct contact with the semiconductor layer 100 in the first and second openings OP1 and OP2. The support conductive layer SP may be a polysilicon layer doped with n-type impurities and/or carbon (C).

The support conductive layer SP, the third dielectric layer 105, the second dielectric layer 103, the first dielectric layer 101, and the semiconductor layer 100 may be patterned to form through holes (not shown) in portions of the lower dielectric layer 50 on the connection region CNR. Afterwards, through dielectric patterns 111 may be formed to at least partially fill the through holes. In an embodiment, on a second connection region CNR2 as shown in FIG. 11, a buried dielectric layer 110 may be formed to at least partially cover the semiconductor layer 100, the first dielectric layer 101, the second dielectric layer 103, the third dielectric layer 105, and a sidewall of the support conductive layer SP. The through dielectric pattern 111 and the buried dielectric layer 110 may be formed by at least partially filling the through holes with a dielectric material, and then performing a planarization process until a top surface of the support conductive layer SP is exposed.

Figure 13A:
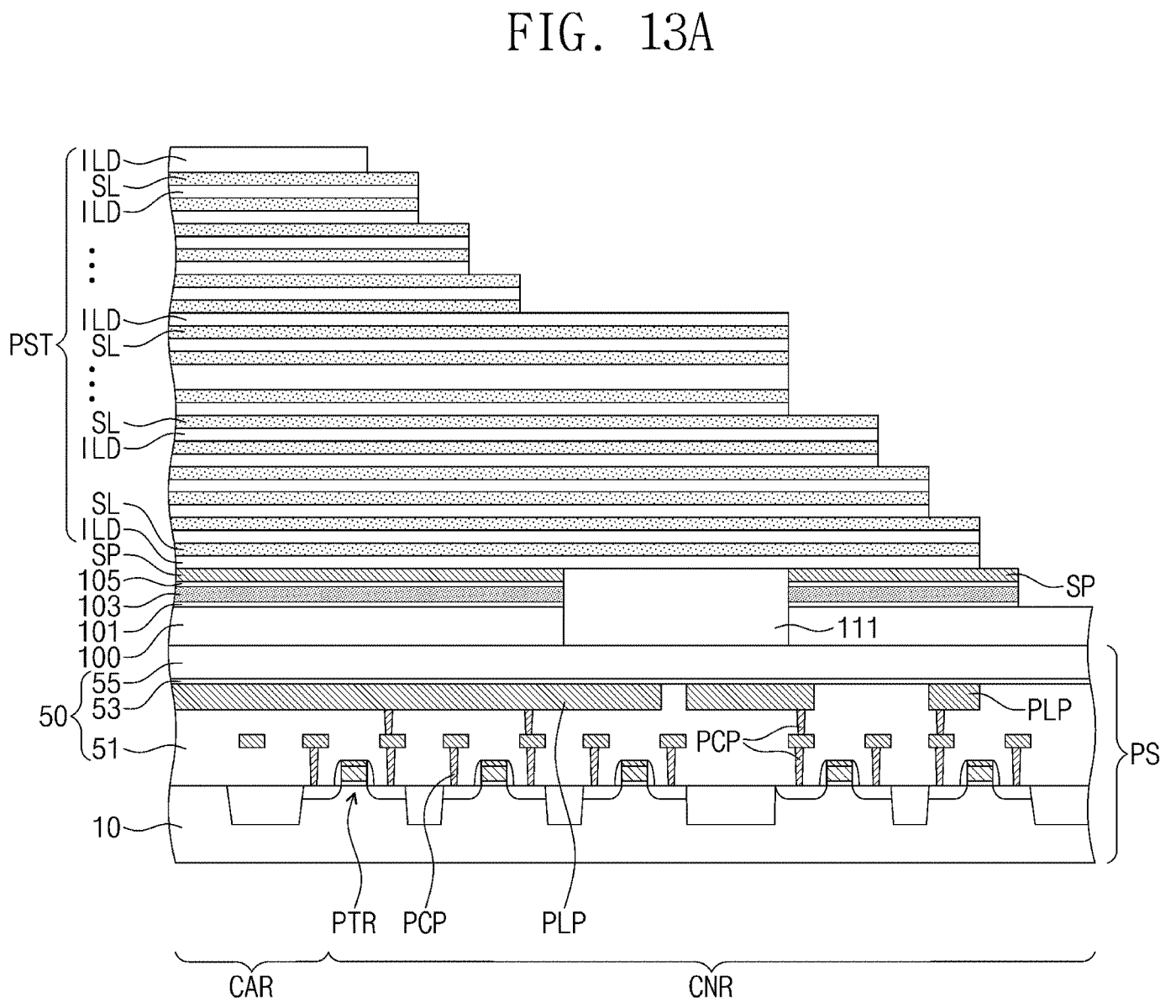
Figure 13B:
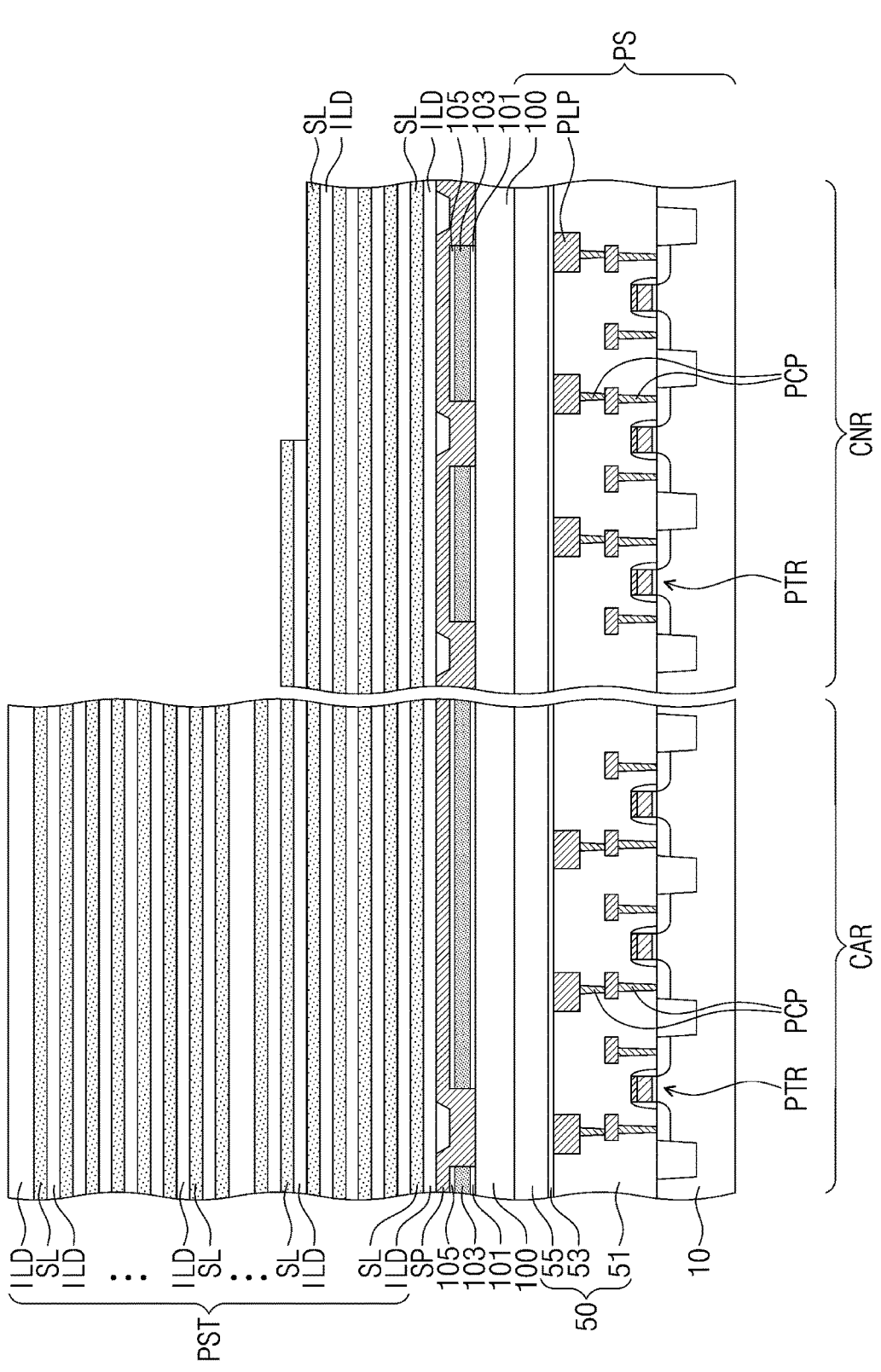

Referring to FIGS. 13A and 13B, a mold structure PST may be formed on the support conductive layer SP.

The formation of the mold structure PST may include forming a thin-layered structure (not shown) in which dielectric layers ILD and sacrificial layers SL are vertically stacked in alternating fashion, and patterning the thin-layered structure, which forming and patterning the thin-layered structure are repeatedly performed. Therefore, the mold structure PST may have a stepwise structure on the connection region CNR.

When the mold structure PST is formed, the sacrificial layers SL may be formed of a material having an etch selectivity with respect to the dielectric layers ILD. For example, the sacrificial layers SL may include a dielectric material different from that of the dielectric layers ILD. The sacrificial layers SL may be formed of the same material as that of the second dielectric layer 103. For example, the sacrificial layers SL may be formed of a silicon nitride layer, and the dielectric layers ILD may be formed of a silicon oxide layer.

Figure 14A:
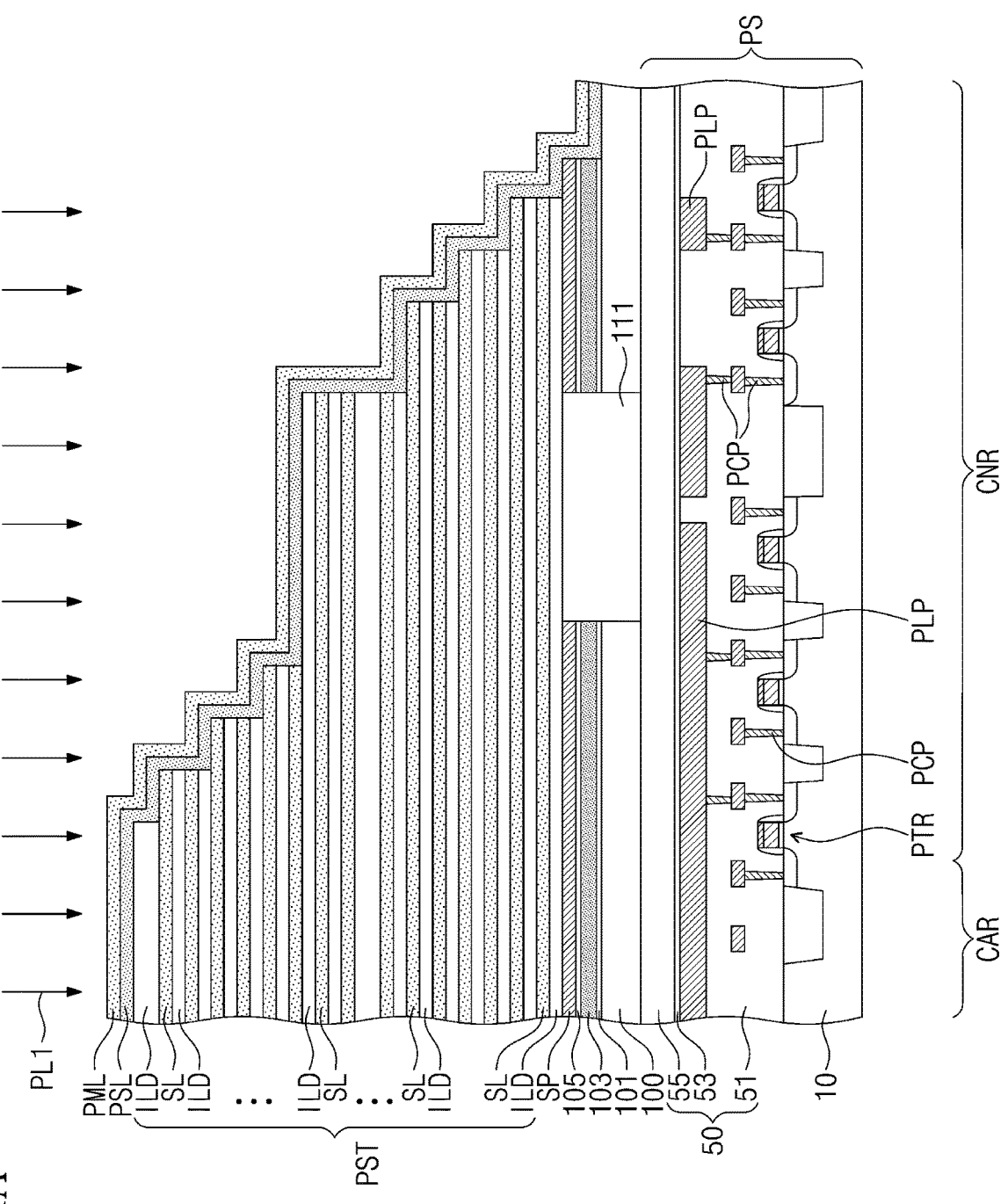
Figure 14B:
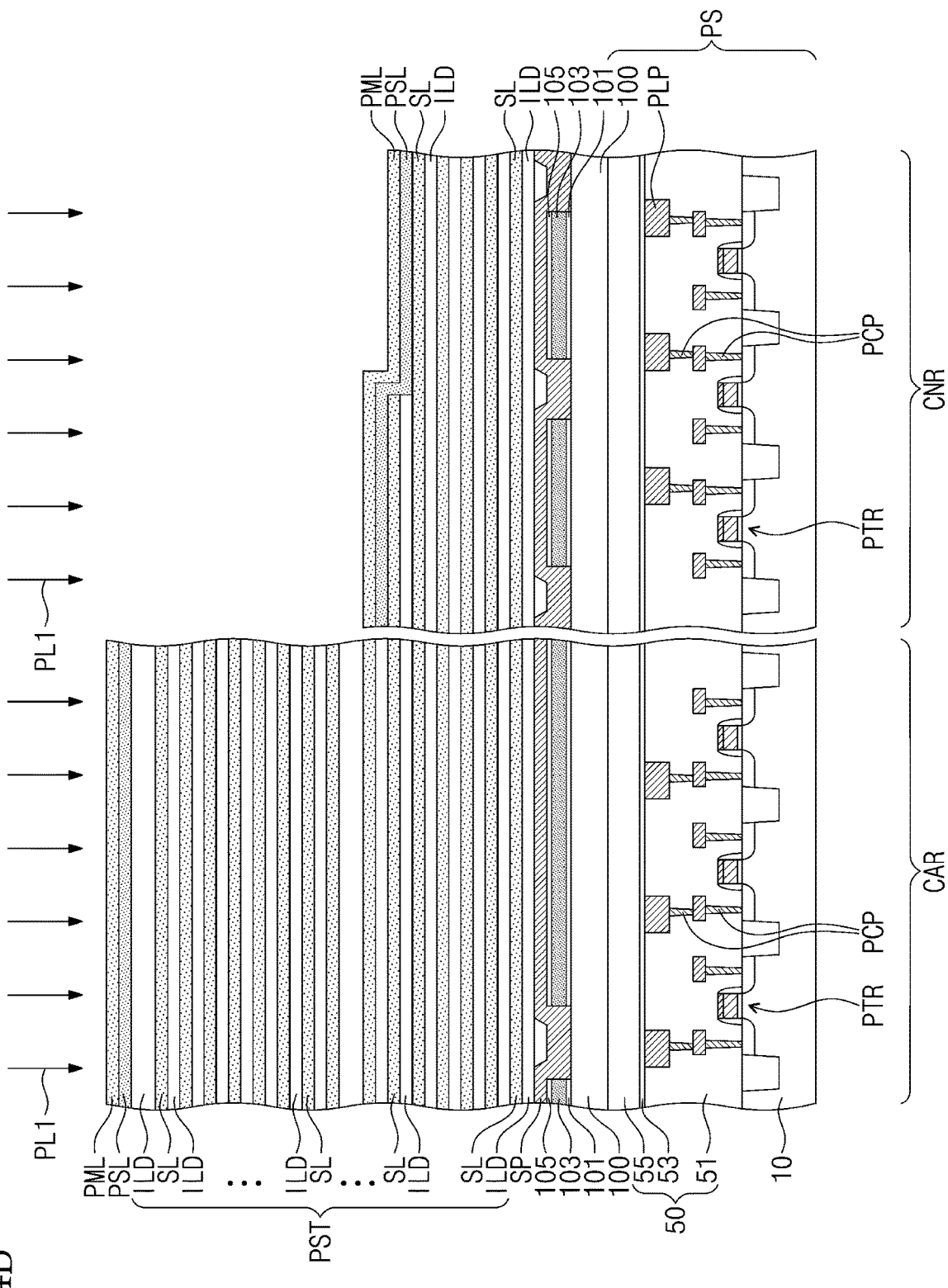

Referring to FIGS. 14A and 14B, there may be sequentially formed a pad sacrificial layer PSL and a pad mask layer PML that at least partially cover the mold structure PST.

The pad sacrificial layer PSL and the pad mask layer PML may be conformally deposited on the mold structure PST.

The pad sacrificial layer PSL and the pad mask layer PML may include a material having an etch selectivity with respect to the sacrificial layers SL. The pad sacrificial layer PSL and the pad mask layer PML may include the same material as that of the sacrificial layers SL and may have an etch rate different from that of the sacrificial layers SL. The pad sacrificial layer PSL and the pad mask layer PML may include, for example, a silicon nitride layer or a silicon oxynitride layer.

The pad sacrificial layer PSL may include a material the same as that of the sacrificial layers SL and may have an etch rate higher than that of the sacrificial layers SL. The pad mask layer PML may include a material the same as that of the sacrificial layers SL and may have an etch rate lower than that of the sacrificial layers SL.

The etch rate of the pad mask layer PML may be changed by performing a first plasma treatment process PL1 after in-situ depositing a layer whose material is the same as that of the pad sacrificial layer PSL. Nitrogen ($N_2$) may be used in the first plasma treatment process PL1.

The pad mask layer PML may receive plasma having directionality in the first plasma treatment process PL1, and thus flat portions of the pad mask layer PML may be relatively more exposed to the plasma than vertical portions of the pad mask layer PML. Therefore, the pad mask layer PML may have different etch rates at the flat and vertical portions thereof. For example, the etch rate of the pad mask layer PML may be less at the flat portions than at the vertical portions.

Figure 15A:
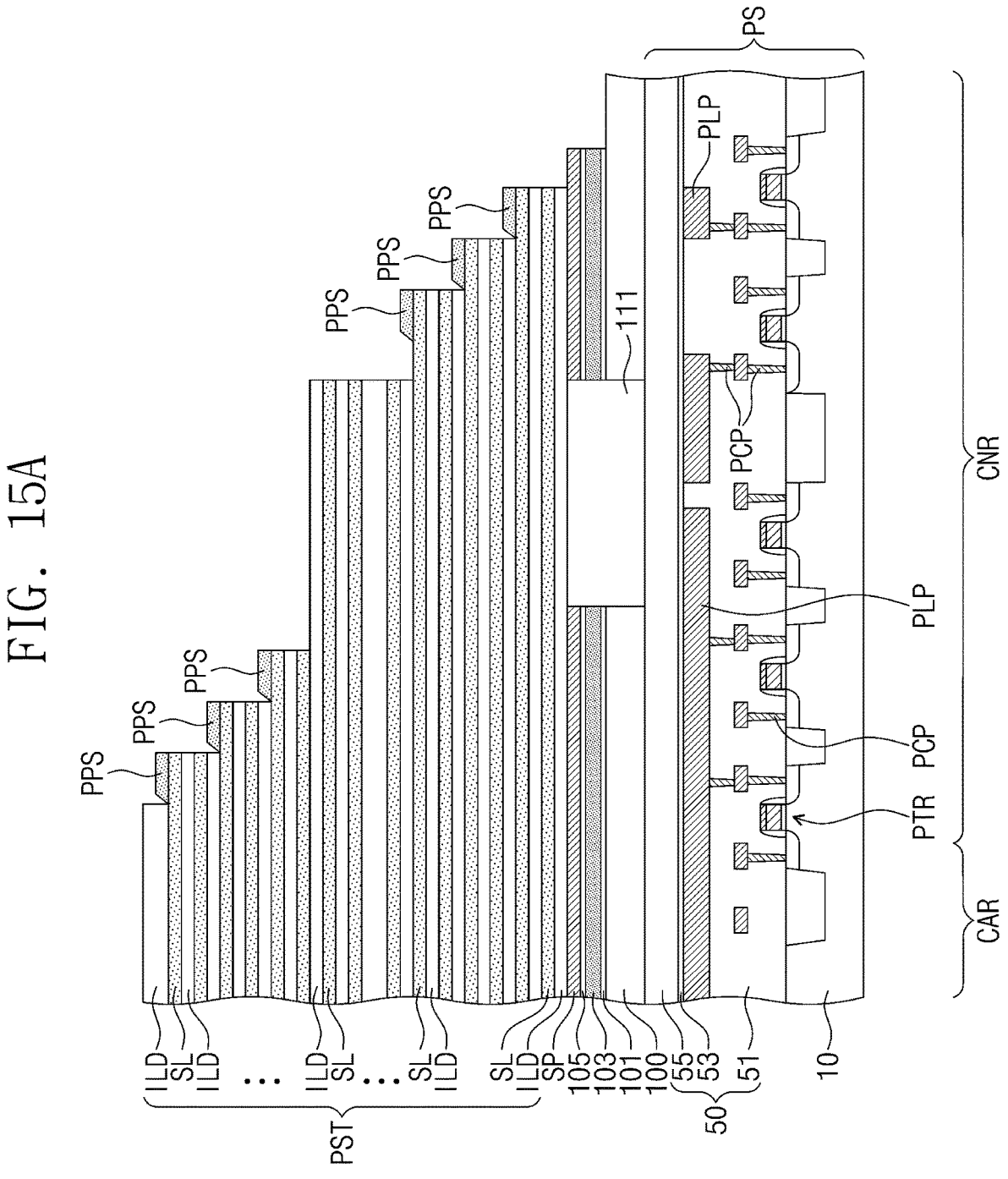
Figure 15B:
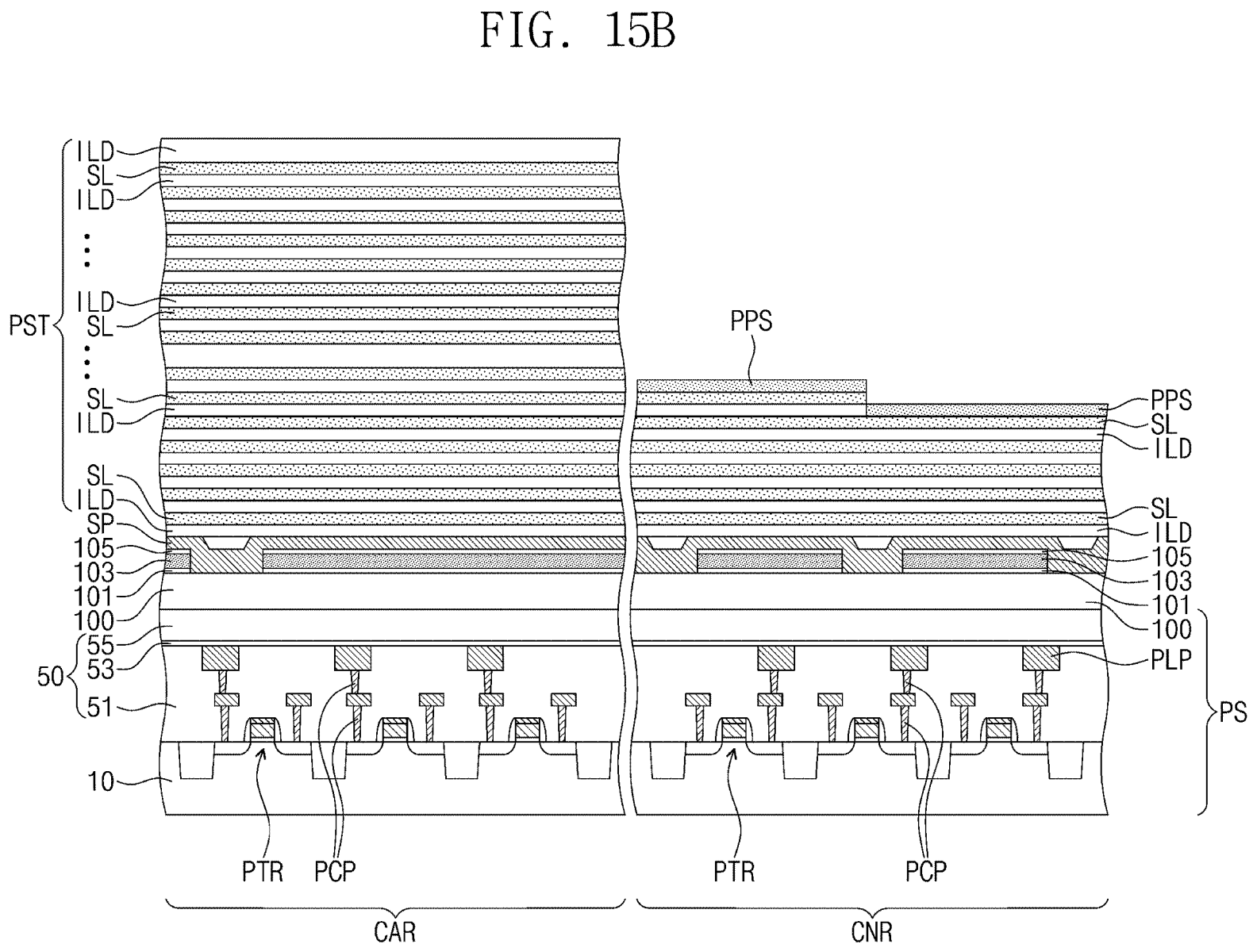

Referring to FIGS. 15A and 15B, after the first plasma treatment process PL1, a wet etching process may be performed on the pad mask layer PML and the pad sacrificial layer PSL. The difference in etch rate between the flat and vertical portions of the pad mask layer PML may cause the pad sacrificial layer PSL to have portions, or preliminary sacrificial patterns PPS, which remain on top surfaces of stairs formed on the mold structure PST. For example, the preliminary sacrificial patterns PPS may be correspondingly formed on end portions of the sacrificial layers SL on the connection region CNR. The preliminary sacrificial patterns PPS may have an etch rate higher than that of the sacrificial layers SL.

Figure 16A:
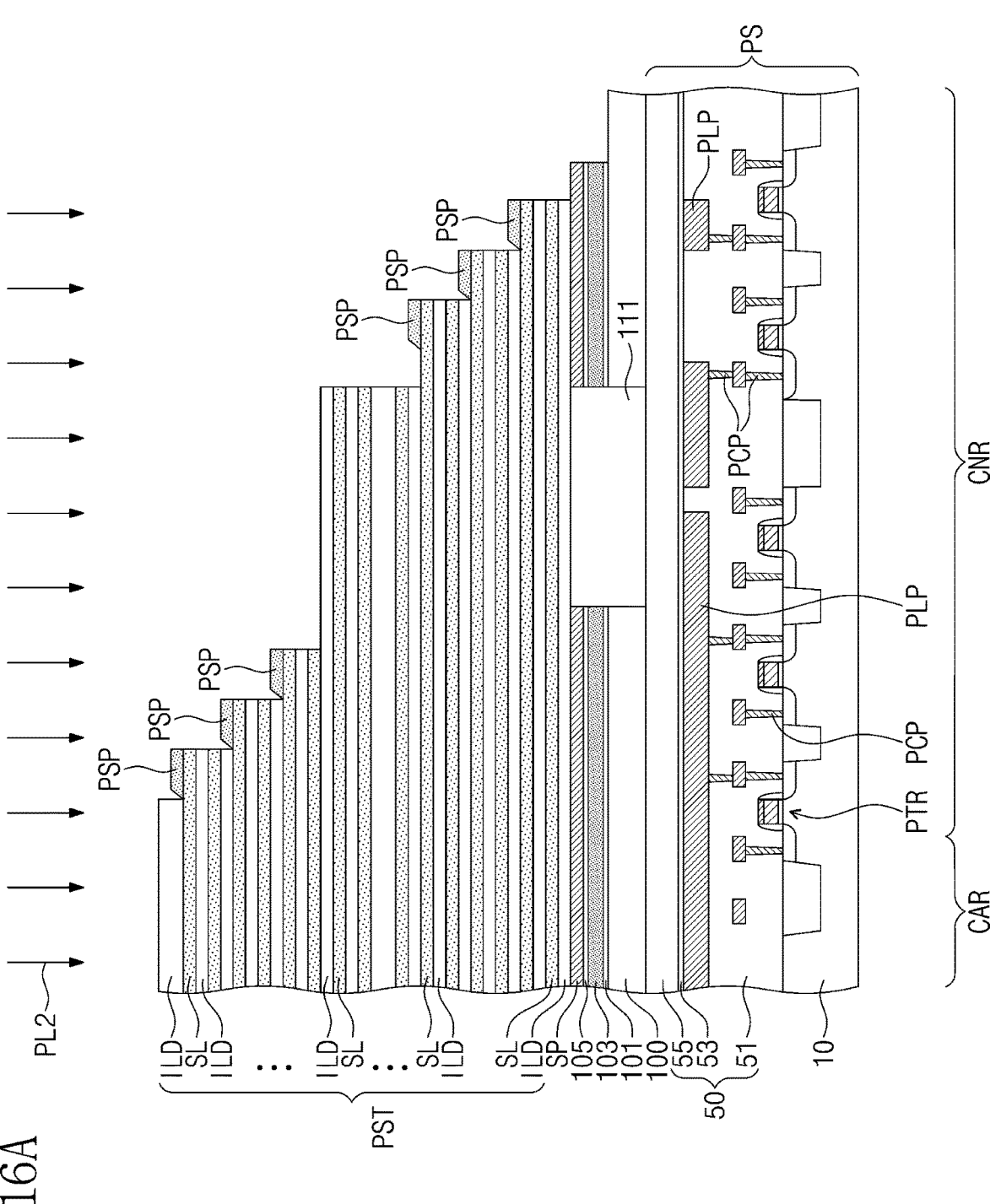
Figure 16B:
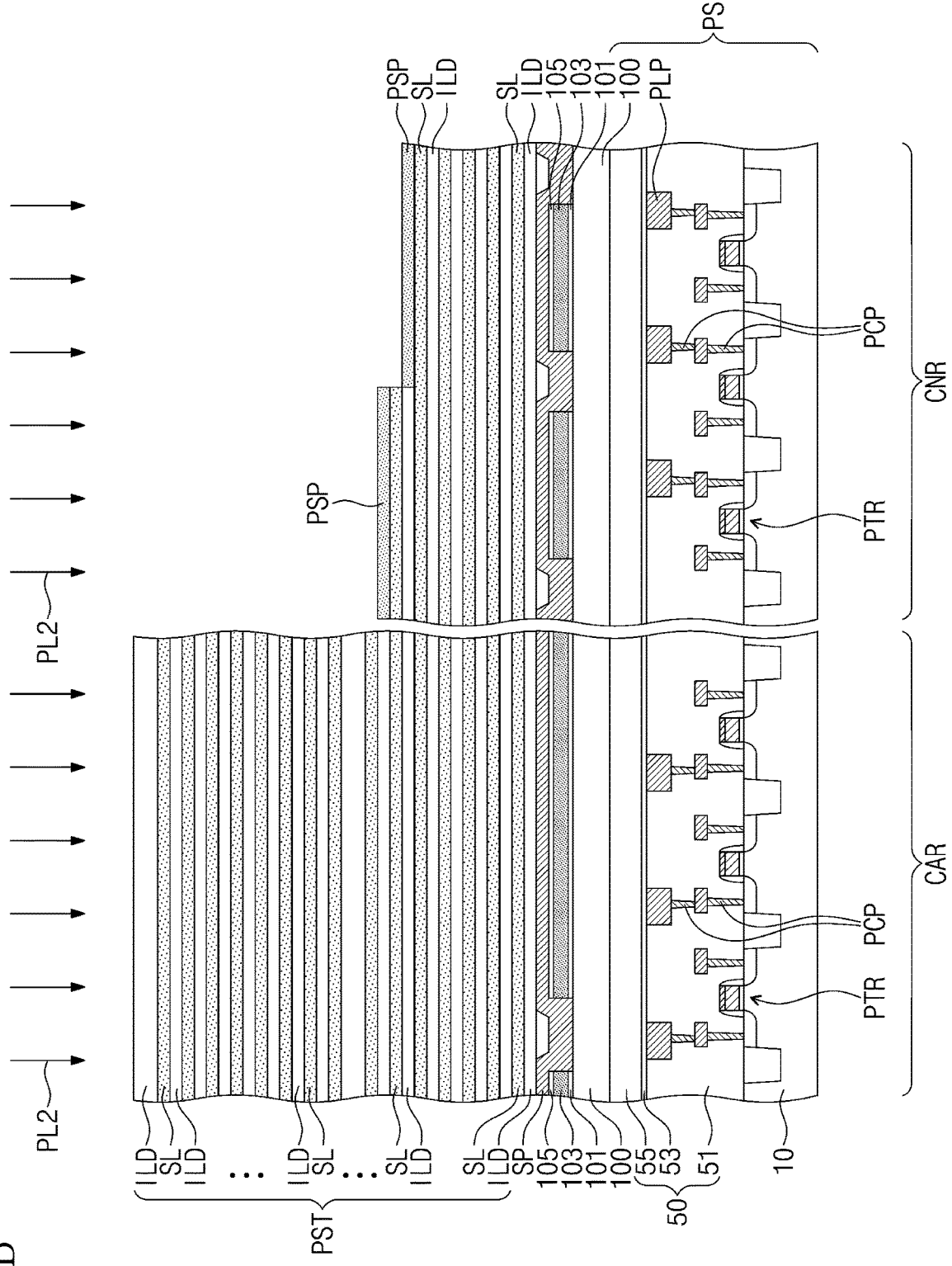

Referring to FIGS. 16A and 16B, after the formation of the preliminary sacrificial patterns PPS, a second plasma treatment process PL2 may be performed on the preliminary sacrificial patterns PPS. Therefore, an etch rate of the preliminary sacrificial patterns PPS may be changed to form pad sacrificial patterns PSP.

The second plasma treatment process PL2 may be substantially the same as the first plasma treatment process PL1. As the second plasma treatment process PL2 using nitrogen ($N_2$) is performed, an etch rate of the preliminary sacrificial patterns PPS exposed to plasma may be less than that of the sacrificial layers SL included in the mold structure PST.

Figure 17A:
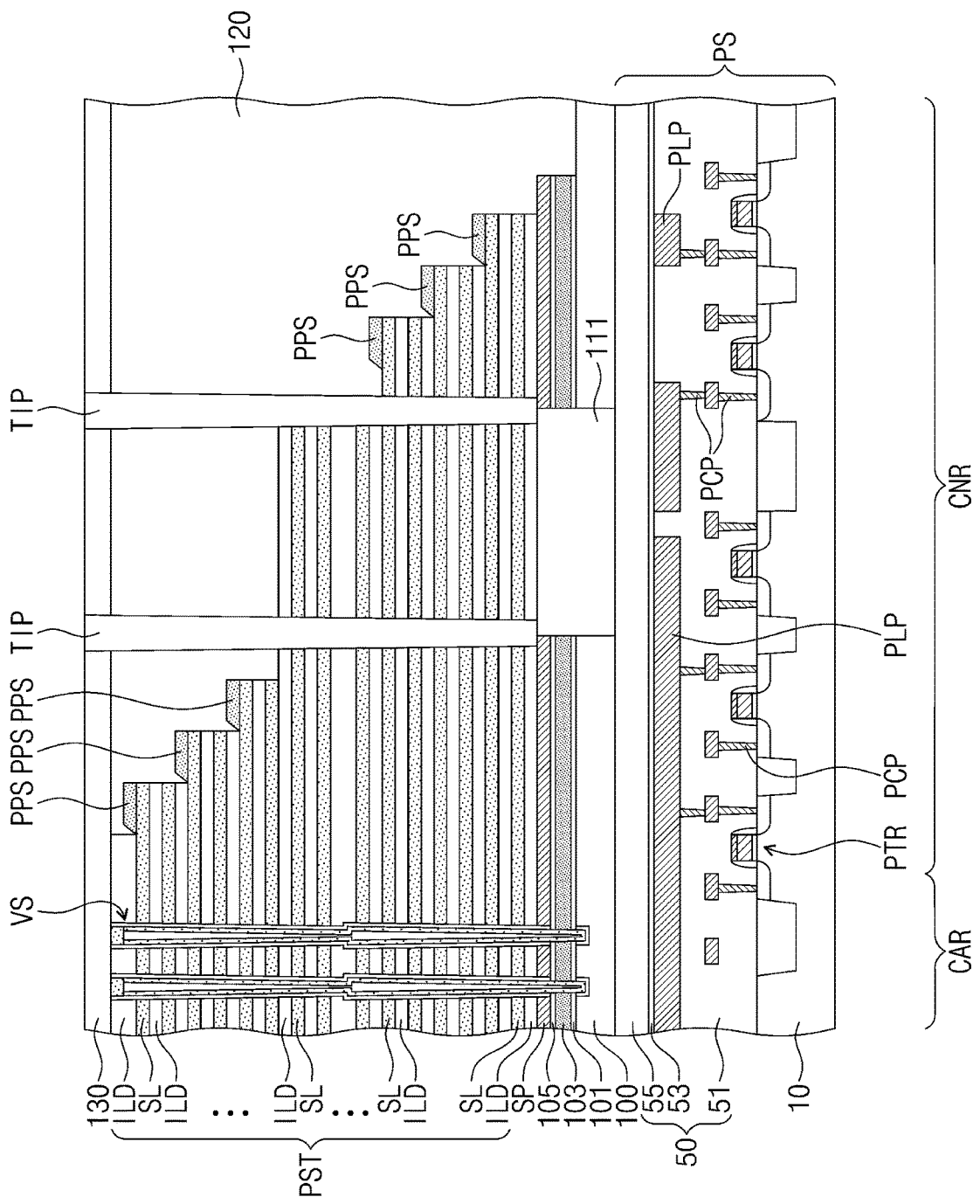
Figure 17B:
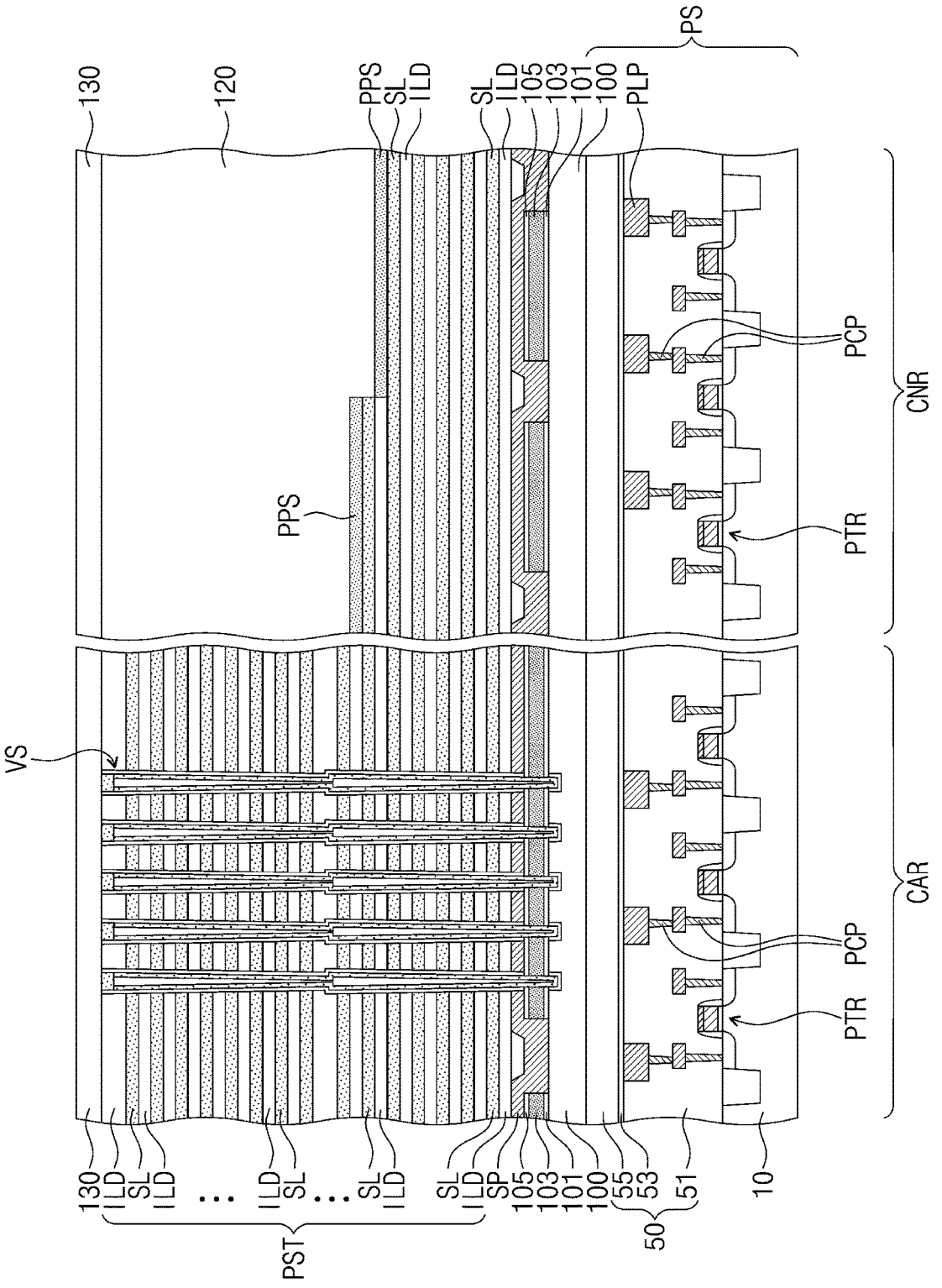

Referring to FIGS. 17A and 17B, after the formation of the pad sacrificial patterns PSP, a planarized dielectric layer 120 may be formed to at least partially cover the stepwise structure of the mold structure PST.

Afterwards, on the cell array region CAR, vertical structures VS may be formed to penetrate the mold structure PST. The formation of the vertical structures VS may include forming vertical holes that penetrate the mold structure PST, the support conductive layer SP, and the first, second, and third dielectric layers 101, 103, and 105, and sequentially depositing a data storage layer and a vertical semiconductor layer in each of the vertical holes.

When the vertical structures VS are formed, the vertical holes may have their bottom surfaces located a lower level than that of a top surface of the semiconductor layer 100 in the cross-sectional view of the semiconductor package or device. When the vertical structures VS are formed, the vertical holes may be formed to have lower and upper vertical holes that are divided from each other.

A chemical vapor deposition (CVD) method or an atomic layer deposition (ALD) method may be used to deposit the data storage layer that has a substantially uniform thickness on bottom surfaces and inner sidewalls of the vertical holes. The data storage layer may include a tunnel dielectric layer, a charge storage layer, and a blocking dielectric layer that are sequentially stacked. A chemical vapor deposition (CVD) method or an atomic layer deposition (ALD) method may be used to deposit the vertical semiconductor layer that has a uniform thickness on the data storage layer. After the formation of the data storage layer and the vertical semiconductor layer, the vertical holes may be at least partially filled with a gap-fill dielectric layer. Thereafter, the gap-fill dielectric layer, the vertical semiconductor layer, and the data storage layer may undergo a planarization process to expose a top surface of an uppermost dielectric layer ILD of the mold structure PST. Therefore, data storage patterns DSP, vertical semiconductor patterns VP, and gap-fill dielectric patterns VI may be formed as discussed above with reference to FIG. 7B.

Thereafter, bit-line conductive pads may be formed on top ends of the vertical semiconductor patterns VP. The bit-line conductive pads may be impurity-doped regions or may be formed of a conductive material.

A first interlayer dielectric layer 130 may be formed on the planarized dielectric layer 120 to at least partially cover top surfaces of the vertical structures VS.

After the formation of the first interlayer dielectric layer 130, on the connection region CNR, a vertical dielectric pattern TIP may be formed to penetrate the mold structure PST. When viewed in plan, the vertical dielectric pattern TIP may have a ring shape that at least partially surrounds the through dielectric pattern 111. The vertical dielectric pattern TIP may be formed by forming a through trench that penetrates the mold structure PST, and then at least partially filling the through trench with a dielectric material. A second interlayer dielectric layer 140 may be formed on the first interlayer dielectric layer 130 to at least partially cover the vertical dielectric pattern TIP.

Figure 18A:
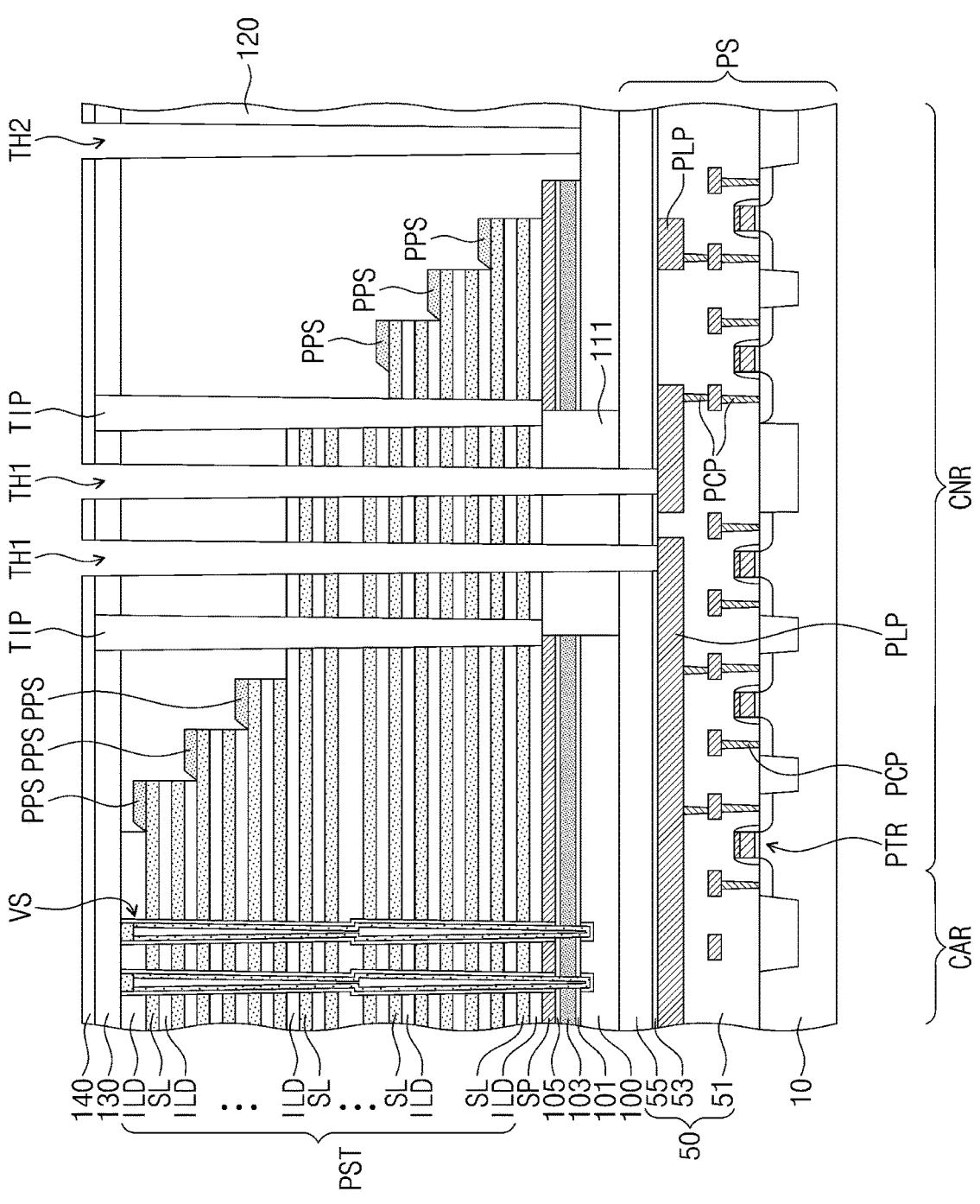
Figure 18B:
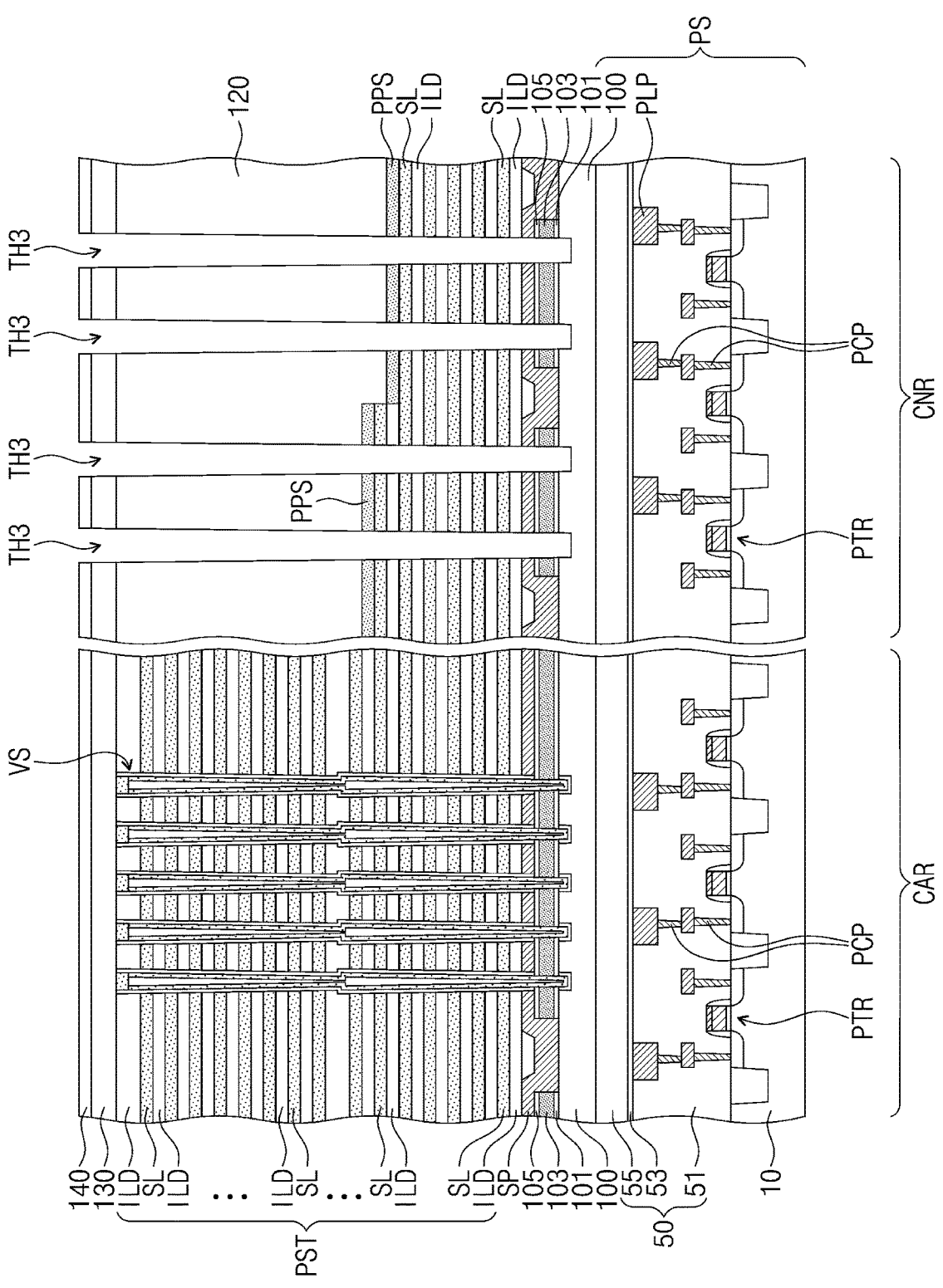

Referring to FIGS. 18A and 18B, first, second, and third through holes TH1, TH2, and TH3 may be formed at the same time on the connection region CNR.

The first through holes TH1 may penetrate the mold structure PST, the vertical dielectric pattern TIP, and the semiconductor layer 100, thereby exposing the peripheral circuit lines PLP of the peripheral circuit structure PS.

On the connection region CNR, the second through holes TH2 may penetrate the first and second interlayer dielectric layers 130 and 140 and the planarized dielectric layer 120, thereby exposing the semiconductor layer 100.

The third through holes TH3 may penetrate the first and second interlayer dielectric layers 130 and 140, the planarized dielectric layer 120, the mold structure PST, the support conductive layer SP, and the first, second, and third dielectric layers 101, 103, and 105, thereby exposing the semiconductor layer 100.

In some embodiments, the first, second, and third through holes TH1, TH2, and TH3 are formed at the same time, but embodiments of the present inventive concepts are not limited thereto and the third through holes TH3 may be formed in a separate operation from that of forming the first and second through holes TH1 and TH2.

Figure 19A:
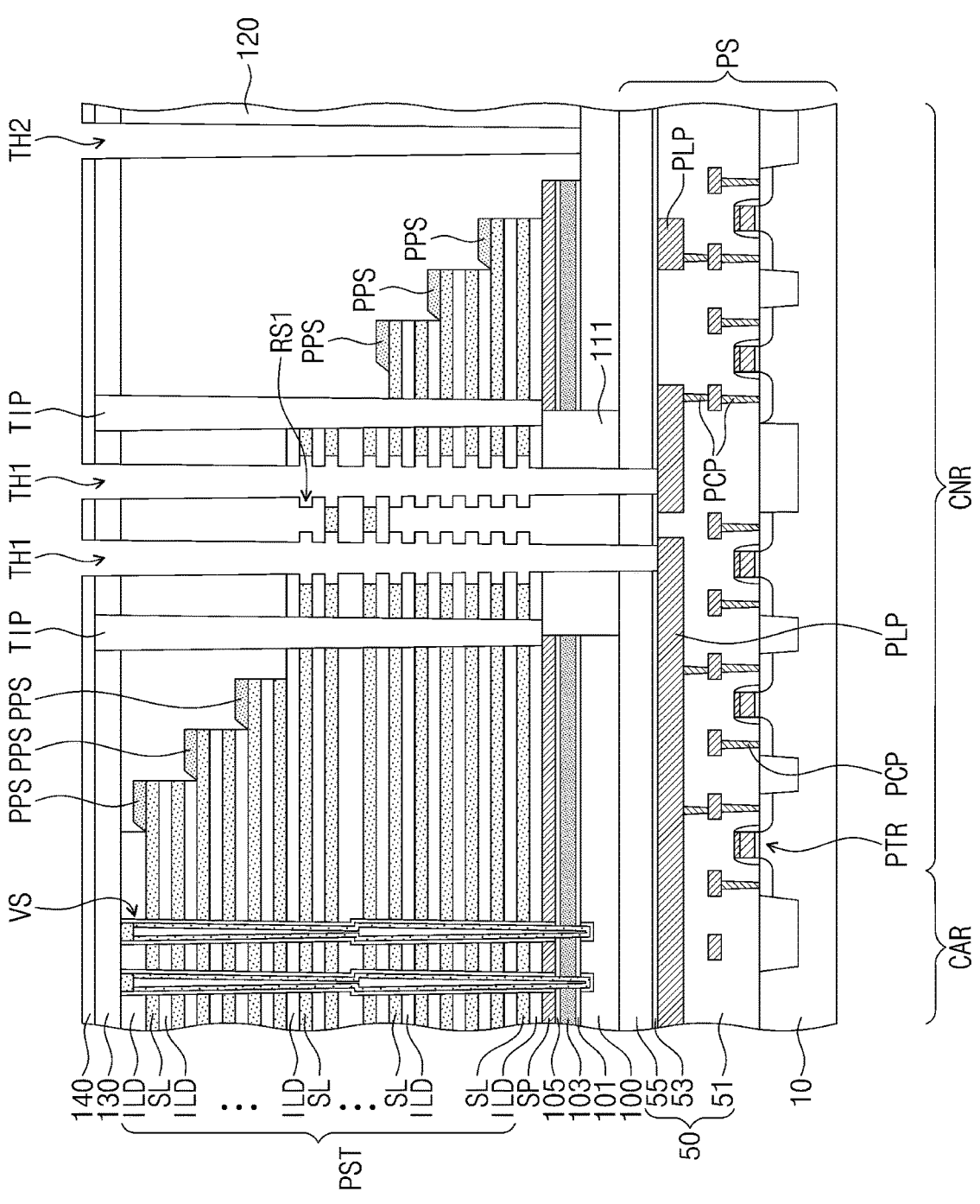
Figure 19B:
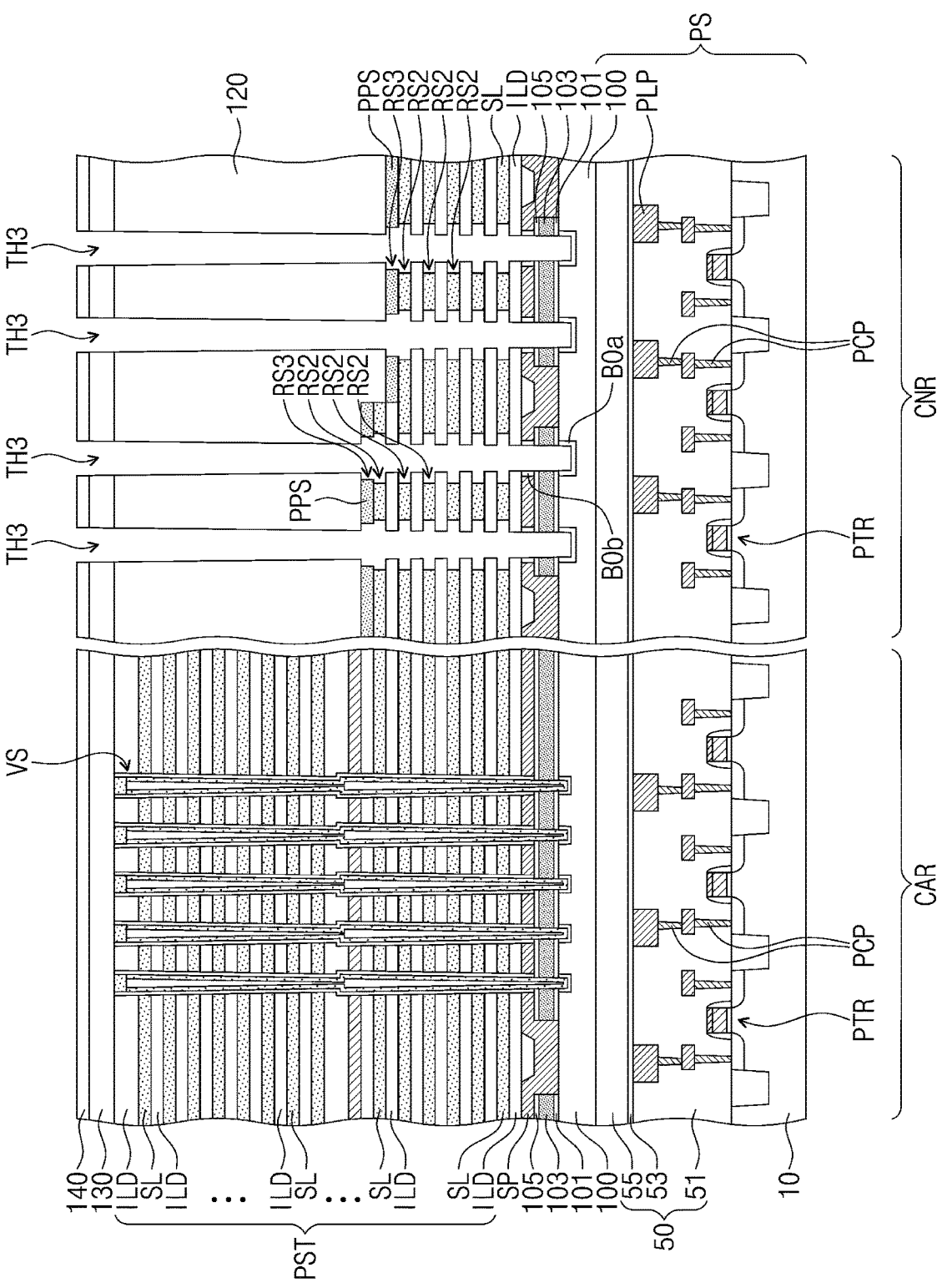

Referring to FIGS. 19A and 19B, after the formation of the first, second, and third through holes TH1, TH2, and TH3, an oxidation process may be performed to form blocking oxide layers BOa and BOb on a sidewall of the support conductive layer SP and a surface of the semiconductor layer 100. An oxidation process may be performed, such that oxygen is supplied through the third through holes TH3 to react with silicon of the support conductive layer SP and the semiconductor layer 100, and accordingly the blocking oxide layers BOa and BOb may be selectively formed.

After the formation of the blocking oxide layers BOa and BOb, an isotropic etching process may be performed on portions of the sacrificial layers SL exposed to the first and third through holes TH1 and TH3. The isotropic etching process may use an etch recipe that has an etch selectivity with respect to the dielectric layers ILD. Therefore, portions of the sacrificial layers SL exposed to the first through holes TH1 may be etched to form first recess regions RS1, and portions of the sacrificial layers SL exposed to the third through holes TH3 and portions of the pad sacrificial patterns PSP exposed to the third through holes TH3 may be etched to form second recess regions RS2 and third recess regions RS3.

The sacrificial layers SL and the pad sacrificial patterns PSP may be isotropically etched by using an etch recipe that has an etch selectivity with respect to the dielectric layers ILD, and accordingly the first, second, and third recess regions RS1, RS2, and RS3 may be formed.

The second recess regions RS2 may be defined by sidewalls of the sacrificial layers SL, and the third recess regions RS3 may be defined by sidewalls of the pad sacrificial patterns PSP. As an etch rate of the pad sacrificial patterns PSP is less than that of the sacrificial layers SL in the isotropic etching process or the wet etching process, a recess depth from the third through hole TH3 may be less on the third recess region RS3 than on the second recess region RS2.

Figure 20A:
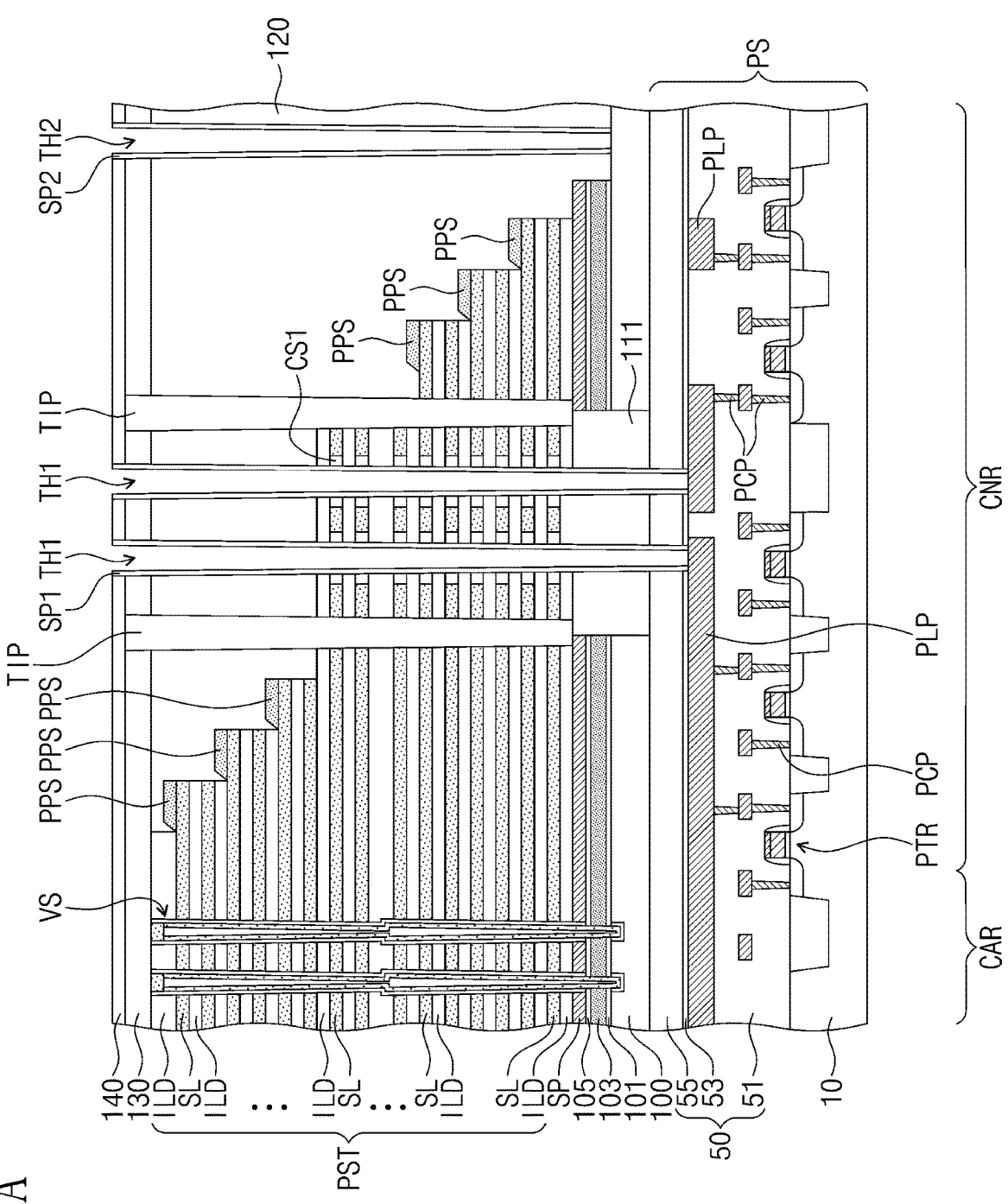
Figure 20B:
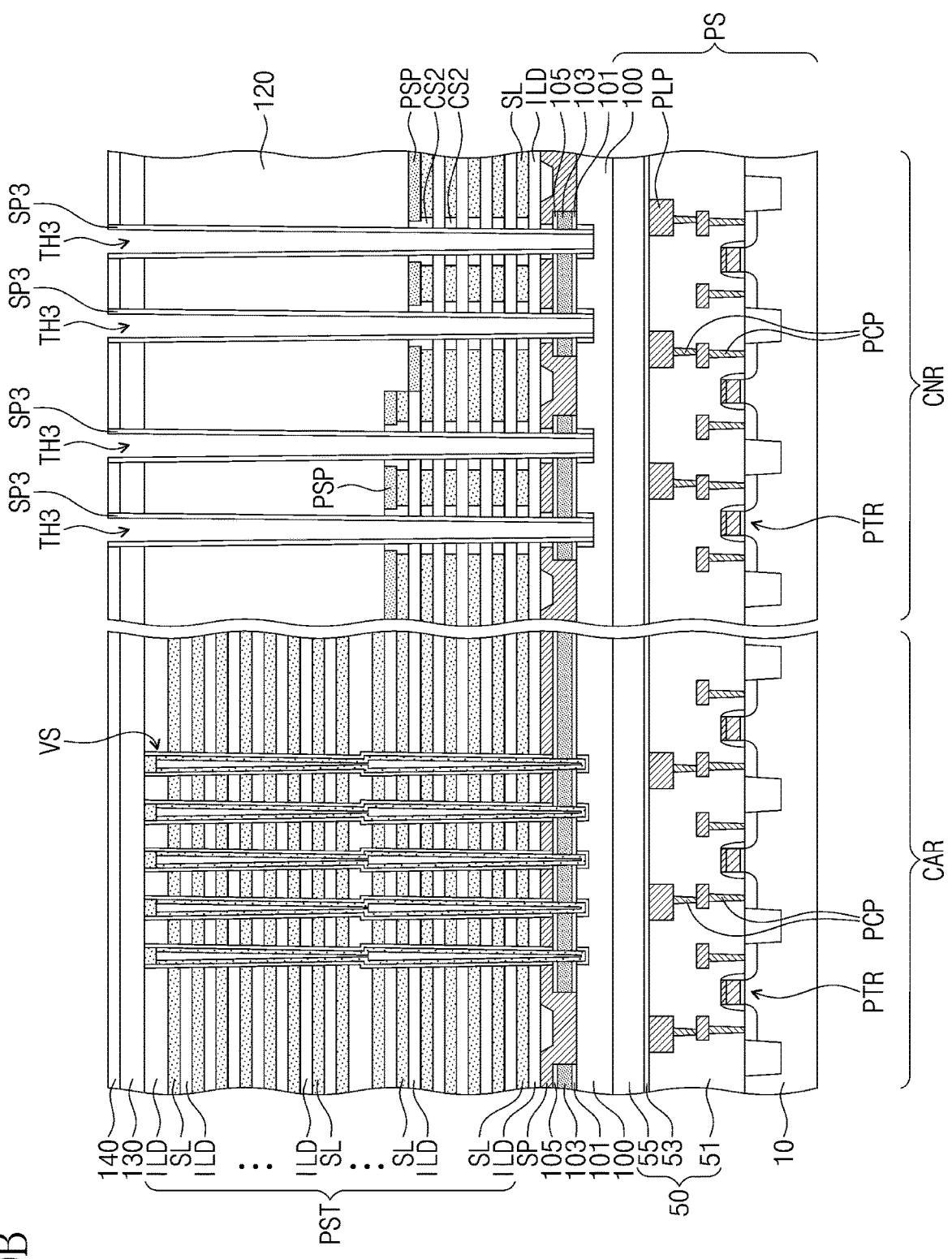

Referring to FIGS. 20A and 20B, first sidewall dielectric patterns CS1 may be formed to at least partially fill the first recess regions RS1, and second sidewall dielectric patterns CS2 may be formed to at least partially fill the second and third recess regions RS2 and RS3. The dielectric layers ILD may vertically separate the first and second sidewall dielectric patterns CS1 and CS2 from each other.

After the formation of the first and second sidewall dielectric patterns CS1 and CS2, a first spacer SP1 may be formed to at least partially cover an inner wall of the first through hole TH1, and a second spacer SP2 may be formed to at least partially cover an inner wall of the second through hole TH2. In addition, a third spacer SP3 may be formed to at least partially cover an inner wall of the third through hole TH3. The first, second, and third spacers SP1, SP2, and SP3 may each have a pipe whose top and bottom ends are opened. The first, second, and third spacers SP1, SP2, and SP3 may be formed by conformally depositing a dielectric layer and then performing an etch-back process.

Figure 21A:
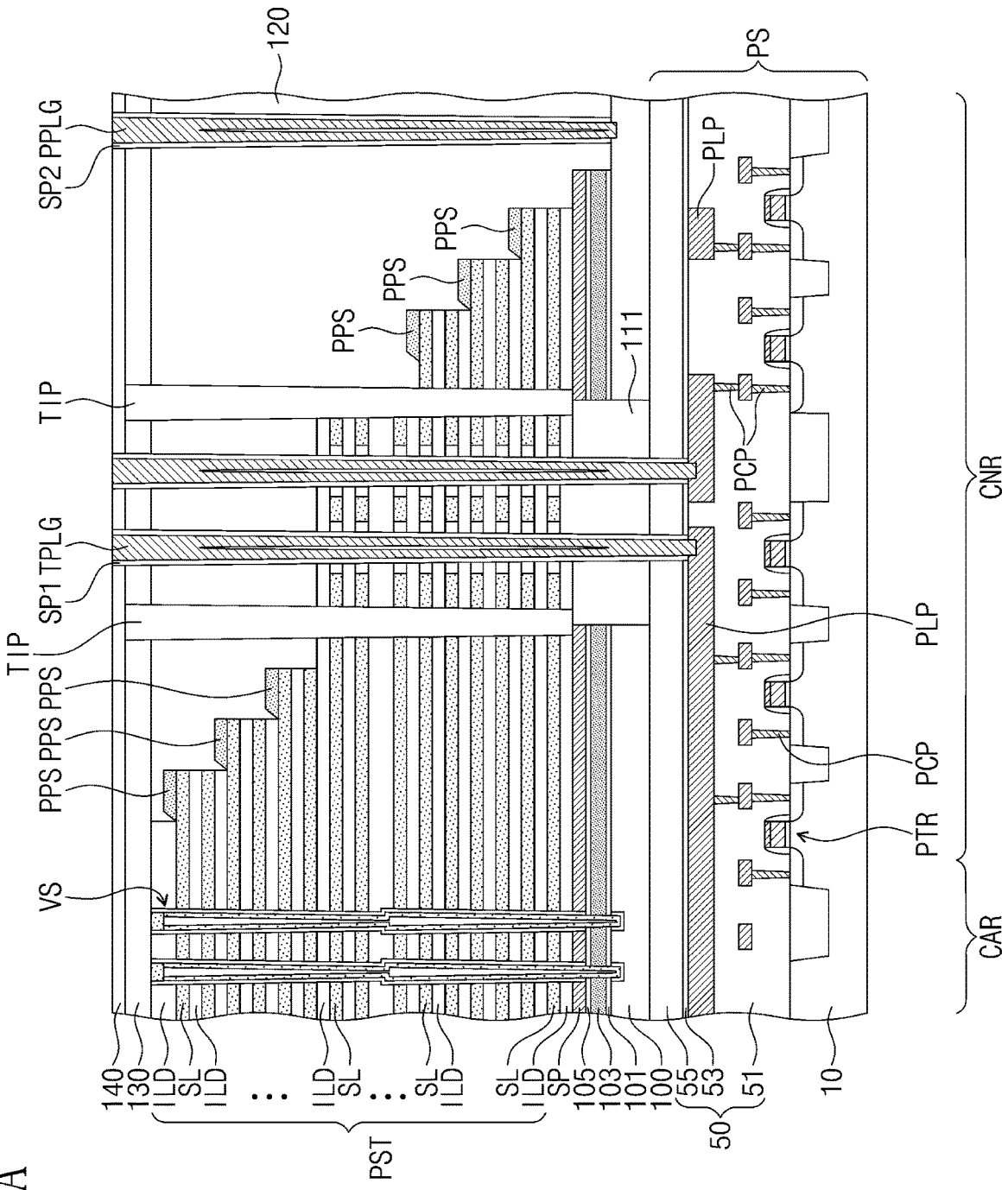
Figure 21B:
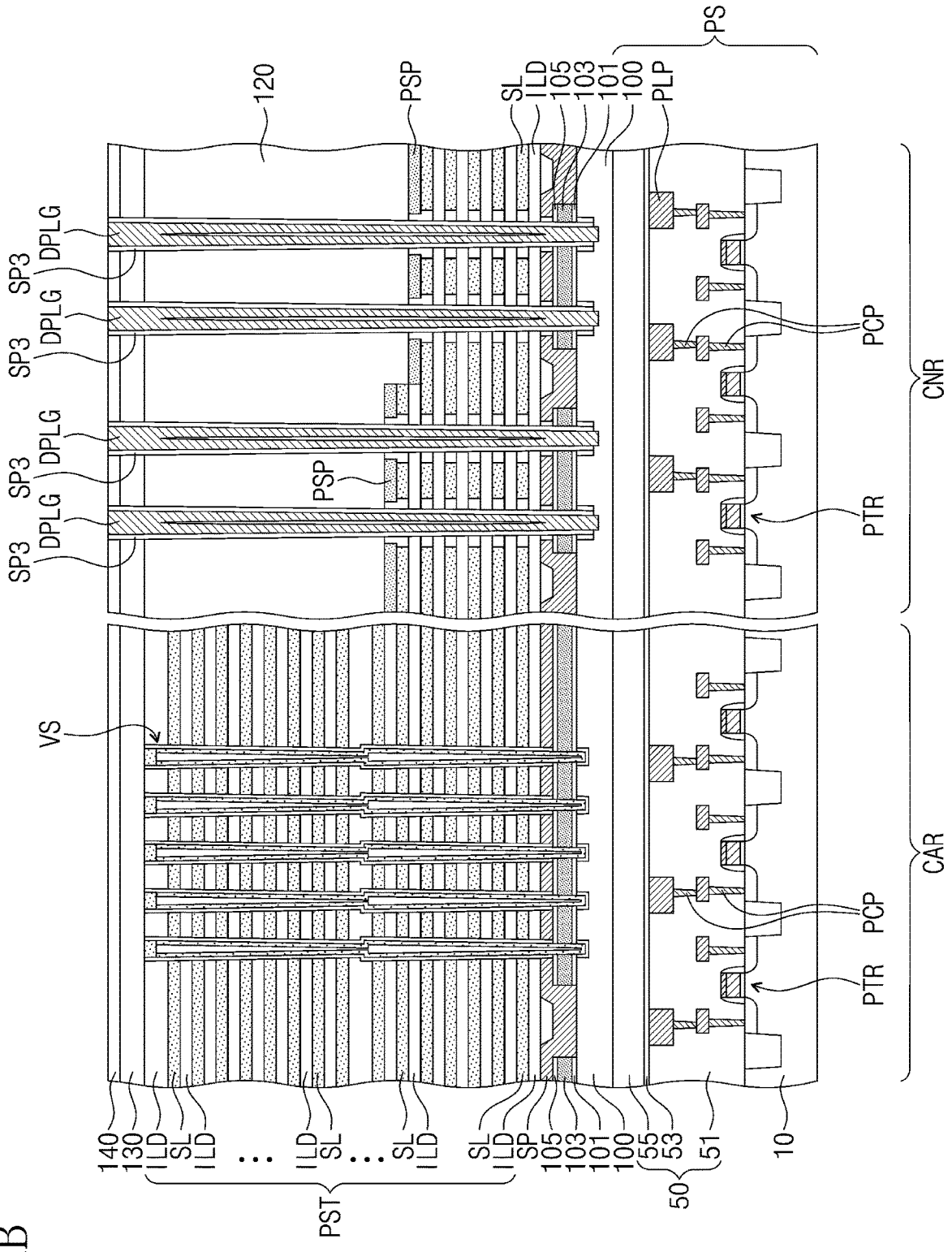

Referring to FIGS. 21A and 21B, a conductive material may at least partially fill the first, second, and third through holes TH1, TH2, and TH3 in which first, second, and third spacers SP1, SP2, and SP3 are formed. For example, through contact plugs TPLG may be formed in the first through holes TH1, peripheral connection plugs PPLG may be formed in the second through holes TH2, and dummy contact plugs DPLG may be formed in the third through holes TH3. The through contact plugs TPLG, the peripheral connection plugs PPLG, and dummy contact plugs DPLG may be formed at the same time. The through contact plugs TPLG, the peripheral connection plugs PPLG, and dummy contact plugs DPLG may be formed by sequentially depositing a barrier metal layer and a metal layer, and then performing a planarization process until a top surface of the second interlayer dielectric layer 140 is exposed.

Figure 22A:
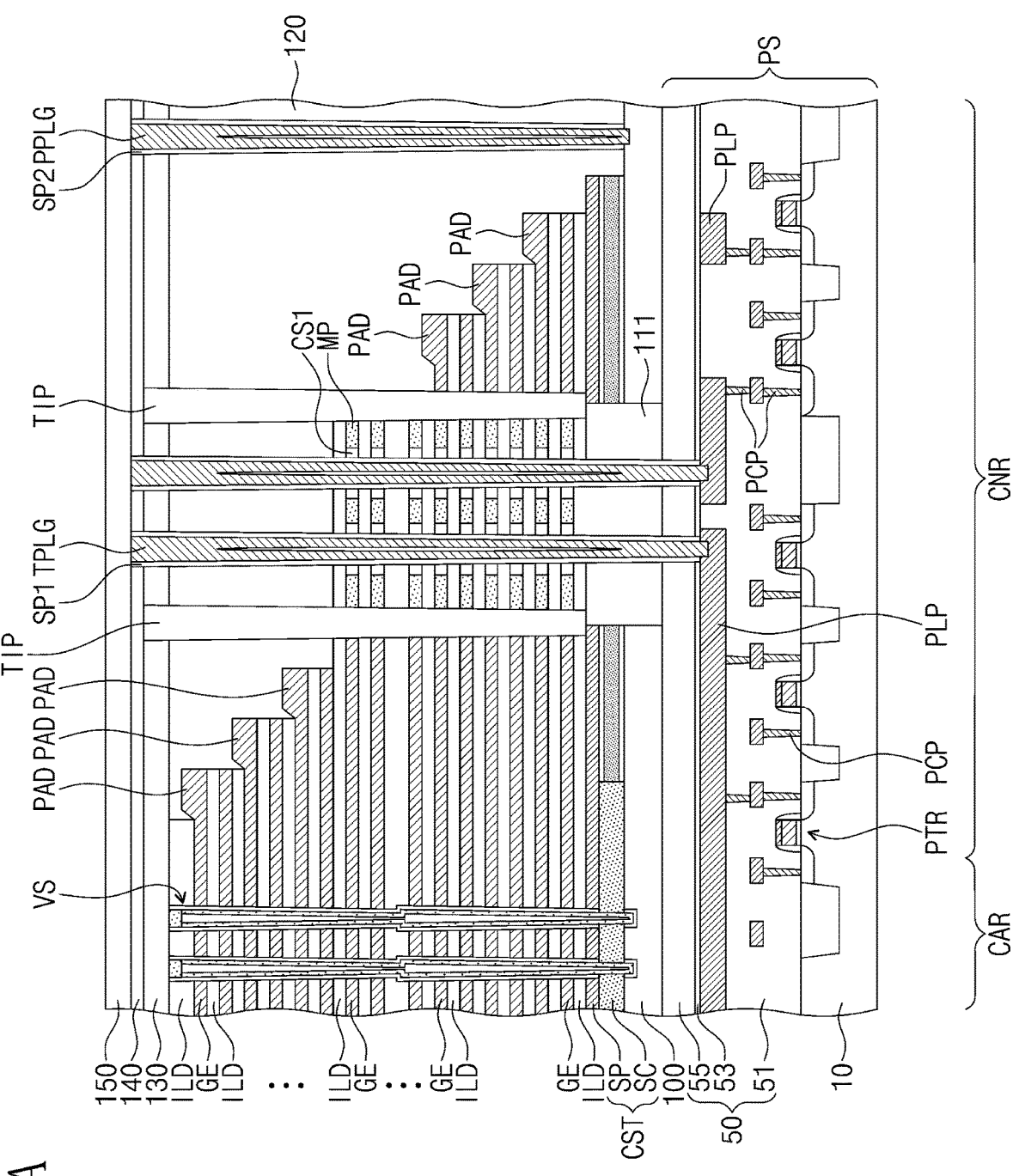
Figure 22B:
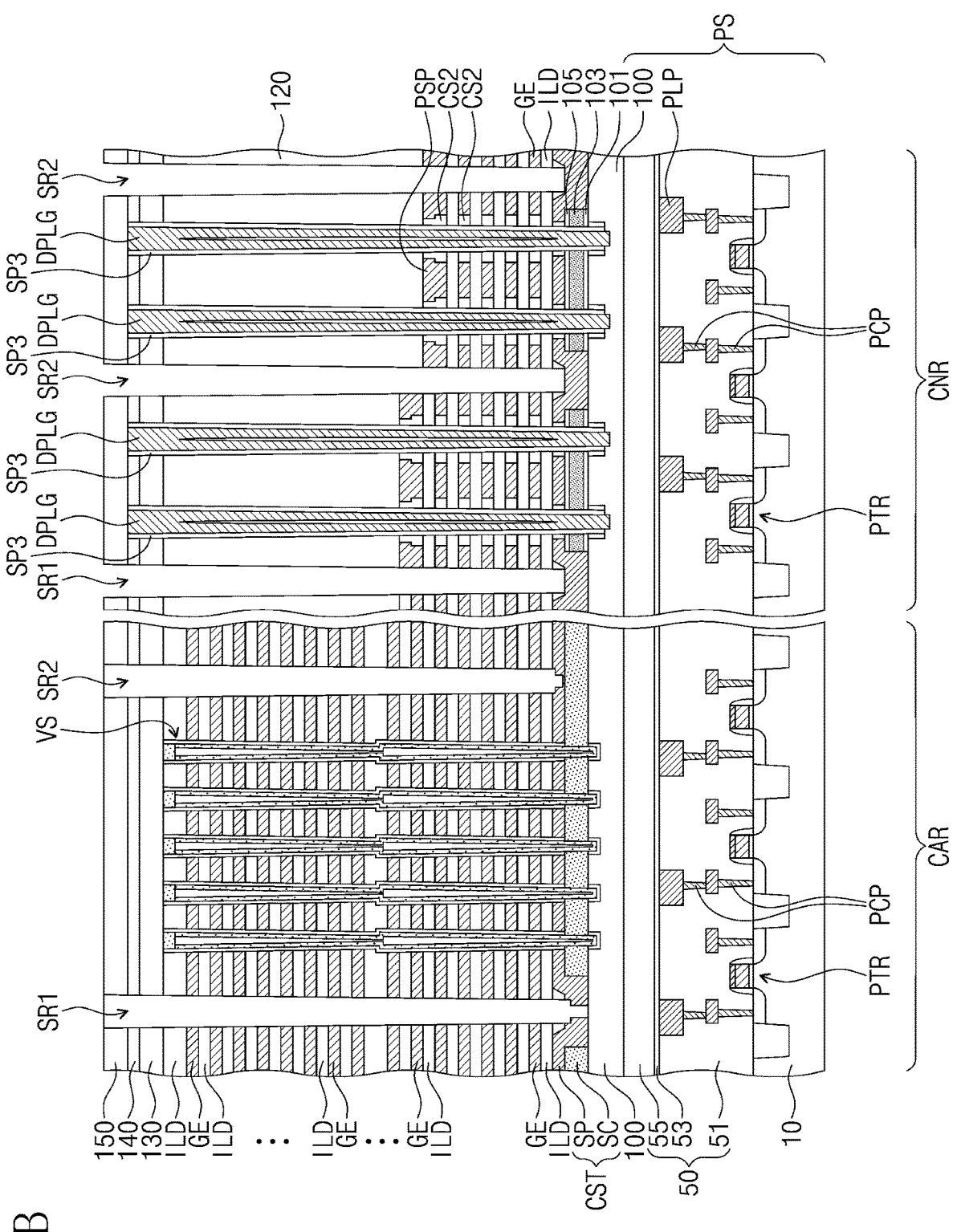

Referring to FIGS. 22A and 22B, on the second interlayer dielectric layer 140, a third interlayer dielectric layer 150 may be formed to at least partially cover the through contact plugs TPLG, the peripheral connection plugs PPLG, and the dummy contact plugs DPLG.

After the formation of the third interlayer dielectric layer 150, first, second, and third separation trenches SR1, SR2, and SR3 may be formed to penetrate the mold structure PST and to expose the support conductive layer SP. The first, second, and third separation trenches SR1, SR2, and SR3 may be formed by an anisotropic etching process performed on the first, second, and third interlayer dielectric layers 130, 140, and 150, the planarized dielectric layer 120, and the mold structure PST, and the support conductive layer SP may be used as an etch stop layer in the anisotropic etching process.

The first, second, and third separation trenches SR1, SR2, and SR3 may extend in a first direction D1. The first separation trenches SR1 may extend along the first direction D1 from the cell array region CAR toward the connection region CNR. The second separation trenches SR2 may extend along the first direction D1 from the cell array region CAR toward the connection region CNR, and may be shorter than the first separation trenches SR1. On the connection region CNR, the third separation trenches SR3 may be disposed spaced apart in the first direction D1 from the second separation trenches SR2 and may extend along the first direction D1.

After the formation of the first, second, and third separation trenches SR1, SR2, and SR3, on the cell array region CAR, a process may be performed to form a source conductive pattern SC that substitutes for the first dielectric layer 101, the second dielectric layer 103, and the third dielectric layer 105.

The formation of the source conductive pattern SC may include performing an isotropic etching process on the first, second, and third dielectric layers 101, 103, and 105 that are exposed to the first and second separation trenches SR1 and SR2. In the isotropic etching process, portions of the data storage patterns (see DSP of FIG. 7B) may also be isotropically etched to expose portions of the vertical semiconductor patterns (see VP of FIG. 7B). After the partial exposure of the vertical semiconductor patterns VP, an impurity-doped polycrystalline silicon layer may be deposited to form a source conductive pattern SC. Therefore, a source structure CST may be formed between the semiconductor layer 100 and the mold structure PST.

After the formation of the source structure CST, the sacrificial layers SL and the pad sacrificial patterns PSP may be replaced with electrodes GE, with the result that an electrode structure ST may be formed as described above. The electrode structure ST may be formed when the sacrificial layers SL are isotropically etched using an etch recipe that has an etch selectivity with respect to the dielectric layers ILD, the vertical structures VS, and the source structure CST. When the isotropic etching process is performed on the sacrificial layers SL, on the connection region CNR, portions of the sacrificial layers SL may remain to form mold patterns MP. When viewed in plan, the mold patterns MP may be at least partially surrounded by the vertical dielectric pattern TIP.

After the formation of the electrodes GE, the first, second, and third separation trenches SR1, SR2, and SR3 may be at least partially filled with a dielectric material to form first, second, and third separation structures SS1, SS2, and SS3.

Referring to FIGS. 5A and 5B, cell contact plugs CPLG may be formed to connect to corresponding pad parts PAD of the electrodes GE. In addition, bit-line contact plugs BCTa and BCTb may be formed to connect with the vertical structures VS.

The cell contact plugs CPLG and the bit-line contact plugs BCTa and BCTb may include a metal and/or metal nitride.

When the cell contact plugs CPLG are formed, contact holes may be formed to penetrate the interlayer dielectric layers 130, 140, 150, and 160 and the planarized dielectric layer 120 to expose the pad part PAD of each electrode GE. The contact hole may have a bottom surface located at a lower level than that of a top surface of the pad part PAD that corresponds to the contact hole in the cross-sectional view of the semiconductor package or device. The pad part PAD of each electrode GE may have an upper portion with a width greater than that of its lower portion, and thus it may be possible to obtain a landing margin for the cell contact plugs CPLG.

According to some embodiments of the present inventive concepts, each electrode may have a pad part whose upper portion has an increased area, and thus there may be an increase in contact margin of cell contact plugs. The cell contact plug and the pad part may have increased reliability of electrical connection therebetween.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
a substrate including a cell array region and a connection region;
an electrode structure including a plurality of electrodes and a plurality of dielectric layers that are vertically stacked on the substrate in alternating fashion, each of the plurality of electrodes including an electrode part on the cell array region and a pad part on the connection region;
a plurality of dummy vertical structures on the connection region, the plurality of dummy vertical structures penetrating the pad parts of the plurality of electrodes, respectively; and
a cell contact plug between the plurality of dummy vertical structures in a plan view of the semiconductor device on the connection region and coupled to the pad part of each of the plurality of electrodes,
wherein a thickness of the pad part is greater than a thickness of the electrode part,
wherein the pad part has a lower portion connected to the electrode part and an upper portion on the lower portion, and
wherein, between adjacent ones of the plurality of dummy vertical structures, a width of the upper portion is not less than a width of the lower portion.

2. The semiconductor device of claim 1, further comprising a plurality of sidewall dielectric patterns between the plurality of dummy vertical structures and the plurality of electrodes, the sidewall dielectric patterns at least partially surrounding the plurality of dummy vertical structures.

3. The semiconductor device of claim 2, wherein the pad part has a stepwise sidewall adjacent to a corresponding one of the plurality of sidewall dielectric patterns.

4. The semiconductor device of claim 2, wherein the pad part has an inclined sidewall adjacent to a corresponding one of the plurality of sidewall dielectric patterns.

5. The semiconductor device of claim 2, wherein the pad part has a width that progressively decreases in a direction from the upper portion toward the lower portion.

6. The semiconductor device of claim 1, wherein each of the plurality of dummy vertical structures includes:
a dummy contact plug in contact with the substrate; and
a dummy spacer that at least partially surrounds a sidewall of the dummy contact plug.

7. The semiconductor device of claim 1, wherein the plurality of dummy vertical structures are arranged around each cell contact plug.

8. The semiconductor device of claim 1, further comprising a plurality of vertical structures on the cell array region, the plurality of vertical structures penetrating the electrode parts of the electrode structure,
wherein top surfaces of the plurality of dummy vertical structures are at a level different from a level of top surfaces of the plurality of vertical structures in a cross-sectional view of the semiconductor device.

9. The semiconductor device of claim 1, further comprising a dummy dielectric pattern on the connection region between the substrate and the pad parts of the electrode structure,
wherein the plurality of dummy vertical structures penetrate the dummy dielectric pattern.

10. The semiconductor device of claim 1, wherein the substrate is a first substrate, the semiconductor device further comprising:

a peripheral circuit structure below the substrate, such that the substrate is between the peripheral circuit structure and the electrode structure, the peripheral circuit structure including a plurality of peripheral circuits integrated on a second substrate;

a plurality of mold patterns on the connection region, the plurality of mold patterns and the electrode parts of the plurality of electrodes being at a same level in a cross-sectional view of the semiconductor device; and a plurality of through contact plugs that penetrate the plurality of mold patterns and are connected to the plurality of peripheral circuits, respectively, wherein top surfaces of the plurality of through contact plugs are coplanar with top surfaces of the plurality of dummy vertical structures.

11. The semiconductor device of claim 1, further comprising:

a plurality of mold patterns on the connection region, the plurality of mold patterns and the electrode parts of the plurality of electrodes being at a same level in a cross-sectional view of the semiconductor device; and a plurality of through contact plugs that penetrate the plurality of mold patterns, respectively.

12. The semiconductor device of claim 1, further comprising:

a semiconductor layer between the substrate and the electrode structure;

a planarized dielectric layer on the semiconductor layer that at least partially covers the pad parts of the electrode structure; and a peripheral connection plug on the connection region, the peripheral connection plug penetrating the planarized dielectric layer and being connected to the semiconductor layer, wherein a top surface of the peripheral connection plug is coplanar with top surfaces of the plurality of dummy vertical structures.

13. The semiconductor device of claim 1, further comprising:

a source conductive pattern on the cell array region and between the substrate and the electrode structure; and a plurality of vertical structures on the cell array region, the plurality of vertical structures penetrating the electrode parts of the electrode structure and the source conductive pattern, wherein each of the plurality of vertical structures includes:

a vertical semiconductor pattern whose sidewall is in partial contact with the source conductive pattern; and a data storage pattern that at least partially surrounds the sidewall of the vertical semiconductor pattern.

14. A semiconductor device, comprising:

a peripheral circuit structure that includes a plurality of peripheral circuits integrated on a semiconductor substrate;

a semiconductor layer on the peripheral circuit structure, the semiconductor layer including a cell array region and a connection region;

an electrode structure including a plurality of electrodes that are vertically stacked on the semiconductor layer and a plurality of mold patterns on the connection region, each of the plurality of electrodes including an electrode part on the cell array region and a pad part on the connection region, the plurality of mold patterns and the electrode parts of the plurality of electrodes being at a same level in a cross-sectional view of the semiconductor device;

a source structure on the cell array region and between the semiconductor layer and the electrode structure;

a plurality of vertical structures on the cell array region, the plurality of vertical structures penetrating the electrode structure and the source structure;

a plurality of dummy vertical structures on the connection region, the plurality of dummy vertical structures penetrating the pad parts of the plurality of electrodes, respectively, each of the plurality of dummy vertical structures including a dummy contact plug and a dummy spacer that at least partially surrounds the dummy contact plug;

a cell contact plug on the connection region and coupled to the pad part of each of the plurality of electrodes;

a plurality of through contact plugs that penetrate the plurality of mold patterns of the electrode structure and are connected to the plurality of peripheral circuits, respectively;

a plurality of first sidewall dielectric patterns between the plurality of dummy vertical structures and the plurality of electrodes, the first sidewall dielectric patterns at least partially surrounding the plurality of dummy vertical structures; and a plurality of second sidewall dielectric patterns between the plurality of through contact plugs and the plurality of mold patterns, the plurality of second sidewall dielectric patterns at least partially surrounding the plurality of through contact plugs, wherein a thickness of the pad part is greater than a thickness of the electrode part, wherein the pad part has a lower portion connected to the electrode part and an upper portion on the lower portion, and wherein, between adjacent ones of the plurality of dummy vertical structures, a width of the upper portion is not less than a width of the lower portion.

15. The semiconductor device of claim 14, wherein top surfaces of the plurality of through contact plugs are coplanar with top surfaces of the plurality of dummy vertical structures.

16. The semiconductor device of claim 14, further comprising a dummy dielectric pattern on the connection region between the semiconductor layer and the pad parts of the electrode structure, wherein the plurality of dummy vertical structures penetrate the dummy dielectric pattern.

17. The semiconductor device of claim 14, wherein each of the plurality of vertical structures includes:

a vertical semiconductor pattern whose sidewall is in partial contact with the source structure; and a data storage pattern on the source structure, the data storage pattern at least partially surrounding a sidewall of the vertical semiconductor pattern.

18. The semiconductor device of claim 14, further comprising:

a first separation structure that extends in a first direction on the cell array region, the first separation structure penetrating the electrode structure and the source structure; and a second separation structure that extends in the first direction on the connection region, the second separation structure penetrating the electrode parts of the electrode structure.

19. The semiconductor device of claim 14, further comprising:

a planarized dielectric layer on the semiconductor layer, the planarized dielectric layer at least partially covering the pad parts of the electrode structure; and a peripheral connection plug on the connection region, the peripheral connection plug penetrating the planarized dielectric layer and being connected to the semiconductor layer, wherein a top surface of the peripheral connection plug is coplanar with top surfaces of the plurality of dummy vertical structures.

* * * * *